United States Patent
Shionoiri et al.

(10) Patent No.: US 8,207,756 B2
(45) Date of Patent: Jun. 26, 2012

(54) LOGIC CIRCUIT AND SEMICONDUCTOR DEVICE

(75) Inventors: Yutaka Shionoiri, Kanagawa (JP); Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/912,397

(22) Filed: Oct. 26, 2010

(65) Prior Publication Data

US 2011/0102018 A1 May 5, 2011

(30) Foreign Application Priority Data

Oct. 30, 2009 (JP) ................................. 2009-250415

(51) Int. Cl.
*H03K 19/096* (2006.01)

(52) U.S. Cl. .......... 326/98; 327/202; 327/211; 327/215; 326/104; 326/114; 326/120

(58) Field of Classification Search .................... 326/21, 326/93, 95, 98, 104, 114, 120
See application file for complete search history.

(56) References Cited

U.S. PATENT DOCUMENTS

| | | | |
|---|---|---|---|
| 3,775,693 A * | 11/1973 | Proebsting | 326/120 |
| 4,242,700 A | 12/1980 | Weimer | |
| 4,800,303 A * | 1/1989 | Graham et al. | 326/72 |
| 4,837,566 A | 6/1989 | Channing et al. | |
| 5,039,883 A * | 8/1991 | On | 326/50 |
| 5,366,922 A | 11/1994 | Aoki et al. | |
| 5,434,520 A | 7/1995 | Yetter et al. | |
| 5,661,751 A | 8/1997 | Johnson | |
| 5,731,856 A | 3/1998 | Kim et al. | |
| 5,744,864 A | 4/1998 | Cillessen et al. | |
| 5,796,650 A | 8/1998 | Wik et al. | |
| 5,851,866 A | 12/1998 | Son | |
| 5,936,881 A | 8/1999 | Kawashima et al. | |
| 5,980,092 A * | 11/1999 | Merryman et al. | 716/108 |
| 6,049,883 A * | 4/2000 | Tjandrasuwita | 713/322 |
| 6,078,194 A * | 6/2000 | Lee | 326/116 |
| 6,195,786 B1 | 2/2001 | Raghunathan et al. | |
| 6,204,695 B1 * | 3/2001 | Alfke et al. | 326/93 |
| 6,266,269 B1 | 7/2001 | Karp et al. | |

(Continued)

FOREIGN PATENT DOCUMENTS

EP 1 408 614 A2 4/2004

(Continued)

OTHER PUBLICATIONS

Rhyne: "Fundamentals of Digital Systems Design" N.J. 1973, pp. 70-71.*

(Continued)

*Primary Examiner* — Jason M Crawford
(74) *Attorney, Agent, or Firm* — Fish & Richardson P.C.

(57) ABSTRACT

In a logic circuit where clock gating is performed, the standby power is reduced or malfunction is suppressed. The logic circuit includes a transistor which is in an off state where a potential difference exists between a source terminal and a drain terminal over a period during which a clock signal is not supplied. A channel formation region of the transistor is formed using an oxide semiconductor in which the hydrogen concentration is reduced. Specifically, the hydrogen concentration of the oxide semiconductor is $5 \times 10^{19}$ (atoms/cm$^3$) or lower. Thus, leakage current of the transistor can be reduced. As a result, in the logic circuit, reduction in standby power and suppression of malfunction can be achieved.

26 Claims, 26 Drawing Sheets

U.S. PATENT DOCUMENTS

| | | | |
|---|---|---|---|
| 6,281,710 B1* | 8/2001 | Poirier et al. | 326/93 |
| 6,294,274 B1 | 9/2001 | Kawazoe et al. | |
| 6,304,122 B1 | 10/2001 | Gregor et al. | |
| 6,563,174 B2 | 5/2003 | Kawasaki et al. | |
| 6,573,754 B2* | 6/2003 | Menczigar et al. | 326/93 |
| 6,628,551 B2 | 9/2003 | Jain | |
| 6,727,522 B1 | 4/2004 | Kawasaki et al. | |
| 6,745,336 B1 | 6/2004 | Martonisi et al. | |
| 6,808,971 B2 | 10/2004 | Bhattacharyya | |
| 6,821,655 B1 | 11/2004 | Ohta et al. | |
| 6,822,478 B2* | 11/2004 | Elappuparackal | 326/46 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2* | 7/2006 | Kapoor et al. | 716/103 |
| 7,105,868 B2 | 9/2006 | Nause et al. | |
| 7,190,358 B2 | 3/2007 | Hiroki | |
| 7,211,825 B2 | 5/2007 | Shih et al | |
| 7,282,782 B2 | 10/2007 | Hoffman et al. | |
| 7,292,672 B2 | 11/2007 | Isono | |
| 7,297,977 B2 | 11/2007 | Hoffman et al. | |
| 7,323,356 B2 | 1/2008 | Hosono et al. | |
| 7,327,169 B2 | 2/2008 | Osame et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,535,259 B2 | 5/2009 | Osame et al. | |
| 7,576,582 B2* | 8/2009 | Lee et al. | 327/202 |
| 7,595,665 B2 | 9/2009 | Park et al. | |
| 7,601,984 B2 | 10/2009 | Sano et al. | |
| 7,674,650 B2 | 3/2010 | Akimoto et al. | |
| 7,687,331 B2 | 3/2010 | Kim et al. | |
| 7,732,819 B2 | 6/2010 | Akimoto et al. | |
| 7,741,644 B2 | 6/2010 | Lyu et al. | |
| 7,791,074 B2 | 9/2010 | Iwasaki | |
| 2001/0013796 A1* | 8/2001 | Li et al. | 326/93 |
| 2001/0046027 A1 | 11/2001 | Tai et al. | |
| 2002/0036529 A1* | 3/2002 | Furusawa et al. | 327/211 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, et al. | |
| 2004/0038446 A1 | 2/2004 | Takeda et al. | |
| 2004/0061542 A1 | 4/2004 | Osame et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1* | 2/2006 | Peeters | 326/16 |
| 2006/0043377 A1 | 3/2006 | Hoffman et al. | |
| 2006/0082400 A1 | 4/2006 | Isono | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1* | 6/2006 | Dronavalli | 326/121 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0024318 A1* | 2/2007 | Mamidipaka | 326/38 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0150587 A1 | 6/2008 | Osame et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1* | 2/2009 | Iwasaki | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0189153 A1 | 7/2009 | Iwasaki et al. | |
| 2009/0201077 A1 | 8/2009 | Osame et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276689 A1 | 11/2010 | Iwasaki | |
| 2010/0279462 A1 | 11/2010 | Iwasaki | |
| 2011/0062432 A1 | 3/2011 | Yamazaki et al. | |
| 2011/0062436 A1 | 3/2011 | Yamazaki et al. | |
| 2011/0068335 A1 | 3/2011 | Yamazaki et al. | |
| 2011/0068852 A1 | 3/2011 | Yamazaki et al. | |
| 2011/0084264 A1 | 4/2011 | Yamazaki et al. | |
| 2011/0084266 A1 | 4/2011 | Yamazaki et al. | |
| 2011/0084267 A1 | 4/2011 | Yamazaki et al. | |
| 2011/0084271 A1 | 4/2011 | Yamazaki et al. | |
| 2011/0089417 A1 | 4/2011 | Yamazaki et al. | |
| 2011/0108837 A1 | 5/2011 | Yamazaki et al. | |
| 2011/0109351 A1 | 5/2011 | Yamazaki et al. | |
| 2011/0114943 A1 | 5/2011 | Yamazaki et al. | |
| 2011/0121878 A1* | 5/2011 | Kato et al. | 327/215 |
| 2011/0127521 A1 | 6/2011 | Yamazaki | |
| 2011/0127522 A1 | 6/2011 | Yamazaki | |
| 2011/0127523 A1 | 6/2011 | Yamazaki | |
| 2011/0127579 A1 | 6/2011 | Yamazaki | |
| 2011/0133180 A1 | 6/2011 | Yamazaki | |
| 2011/0133191 A1 | 6/2011 | Yamazaki | |
| 2011/0136301 A1 | 6/2011 | Yamazaki et al. | |
| 2011/0147739 A1 | 6/2011 | Yamazaki et al. | |
| 2011/0151618 A1 | 6/2011 | Yamazaki et al. | |
| 2011/0156026 A1 | 6/2011 | Yamazaki et al. | |

FOREIGN PATENT DOCUMENTS

| | | |
|---|---|---|
| EP | 1 737 044 A1 | 12/2006 |
| EP | 2 226 847 A2 | 9/2010 |
| JP | 54-104272 A | 8/1979 |
| JP | 60-198861 A | 10/1985 |
| JP | 63-210022 A | 8/1988 |
| JP | 63-210023 A | 8/1988 |

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-197004 A | 7/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-173239 A | 6/2004 |
| JP | 2004-273614 A | 9/2004 |
| JP | 2004-273732 A | 9/2004 |
| JP | 2006-121197 A | 5/2006 |
| JP | 2007-103918 A | 4/2007 |
| JP | 2008-219882 A | 9/2008 |
| WO | 2004/114391 A1 | 12/2004 |
| WO | 2007/029844 A1 | 3/2007 |
| WO | 2007/108406 A1 | 9/2007 |

OTHER PUBLICATIONS

International Search Report, PCT Application No. PCT/JP2010/067996, dated Dec. 21, 2010, 3 pages.

Written Opinion, PCT Application No. PCT/JP2010/067996, dated Dec. 21, 2010, 4 pages.

Kimizuka. N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Masuda. S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Li. C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Nomura, K et al., "Carrier transport in transparent oxide semiconductor with intrinsic structural randomness probed using single-crystalline InGaO3(ZnO)5 films," APPL. PHYS. LETT. (Applied Physics Letters), Sep. 13, 2004, vol. 85, No. 11, pp. 1993-1995.

Asakuma, N. et al., "Crystallization and Reduction of SOL-GEL-Derived Zinc Oxide Films by Irradiation With Ultraviolet Lamp," Journal Of SOL-GEL Science and Technology, 2003, vol. 26, pp. 181-184.

Asaoka, Yet al., "29.1: Polarizer-Free Reflective LCD Combined With Ultra Low-Power Driving Technology," SID Digest '09 : SID International Symposium Digest Of Technical Papers, 2009, pp. 395-398.

Chern, H et al., "An Analytical Model For The Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors For AMOLED Back-Plane," SID Digest '09 : SID International Symposium Digest Of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies Of The Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of A Cholesteric Liquid Crystal and Its Blue Phase," Phys. Rev. A (Physical Review. A), May 1, 1984, vol. 29, No. 5, pp. 2957-2959.

Dembo, H et al., "RFCPUS On Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H. et al., "Temperature Dependence of Characteristics and Electronic Structure for Amorphous In-Ga-Zn- Oxide TFT,"AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest Of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest Of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest Of Technical Papers, 2008, vol. 39, pp. 1277-1280.

Ikeda., T et al., "Full-Functional System Liquid Crystal Display Using CG-Silicon Technology," SID Digest '04 : SID International Symposium Digest Of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing M003 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest Of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,or Zn] At Temperatures Over 1000°C,"Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

Kurokawa, Y et al., "UHF RFCPUS On Flexible and Glass Substrates for Secure RFID Systems," Journal Of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest Of Technical Papers, May 31, 2009, pp. 191-193.

Meiboom, S et al., "Theory of the Blue Phase of Cholesteric Liquid Crystals," Phys. Rev. Lett.(Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays, " IDW '08: Proceeding of the 6th Intenational Display Workshops, Dec. 3, 2008, pp. 581-584.

Nakamura, "Synthesis of Homologous Compound with New Long-Period Structure, " NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Amorphous Oxide Semiconductors for High-Performance Flexible Thin-Film.Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nowatari, H et al., "60.2: Intermediate Connector With Suppressed Voltage Loss for White Tandem Oleds," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, Vol. 77, pp. 245202-1-245202-6.

Oh, M et al., "Improving the Gate Stability of ZNO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS with a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest Of Technical Papers, July 1, 2009, pp. 227-230. The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZn4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings Of The 9th International Display Workshops, Dec. 4, 2002, pp. 295-298.

Ueno, K et al., "Field-Effect Transistor on SrTiO3 With Sputtered A12O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

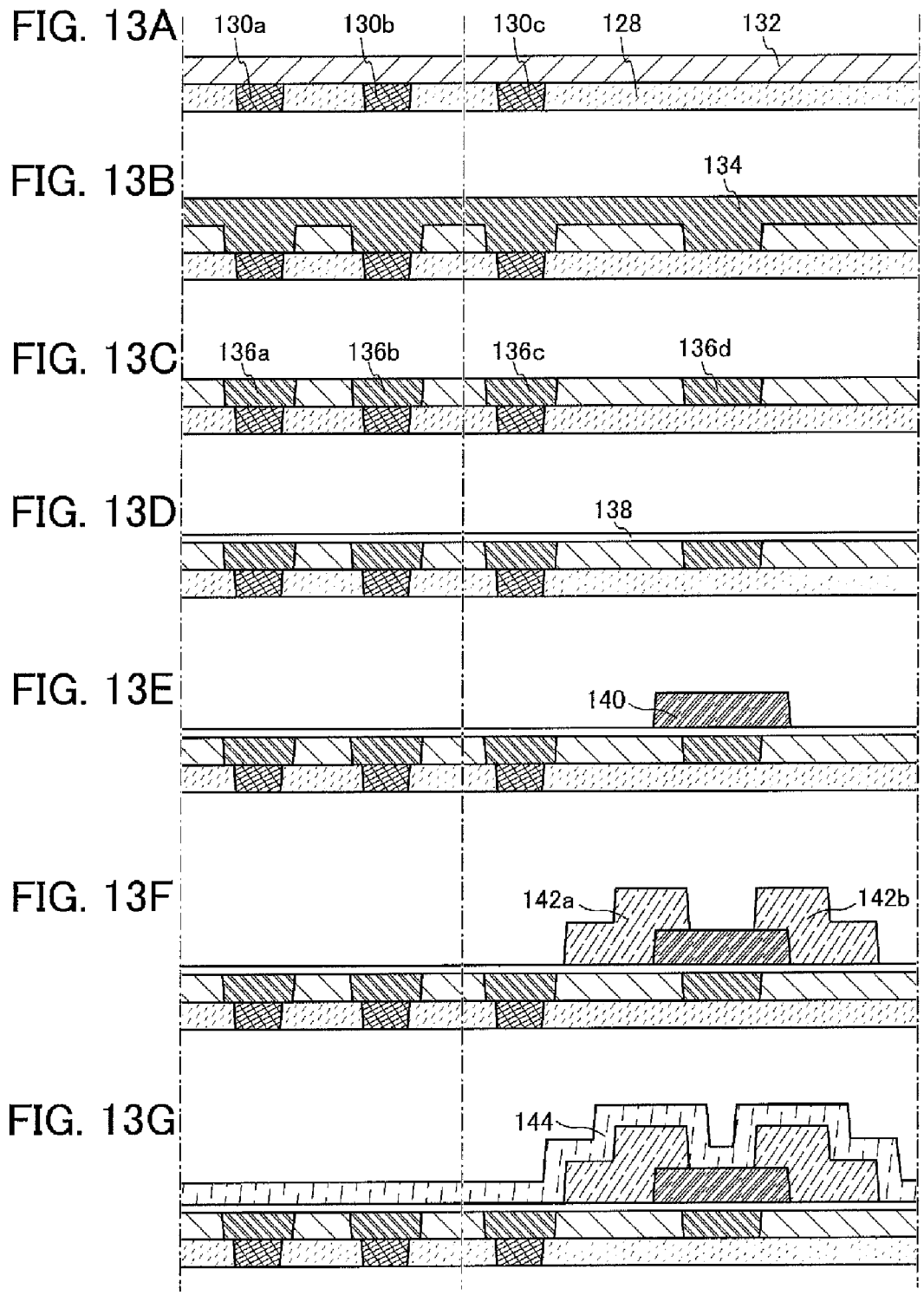

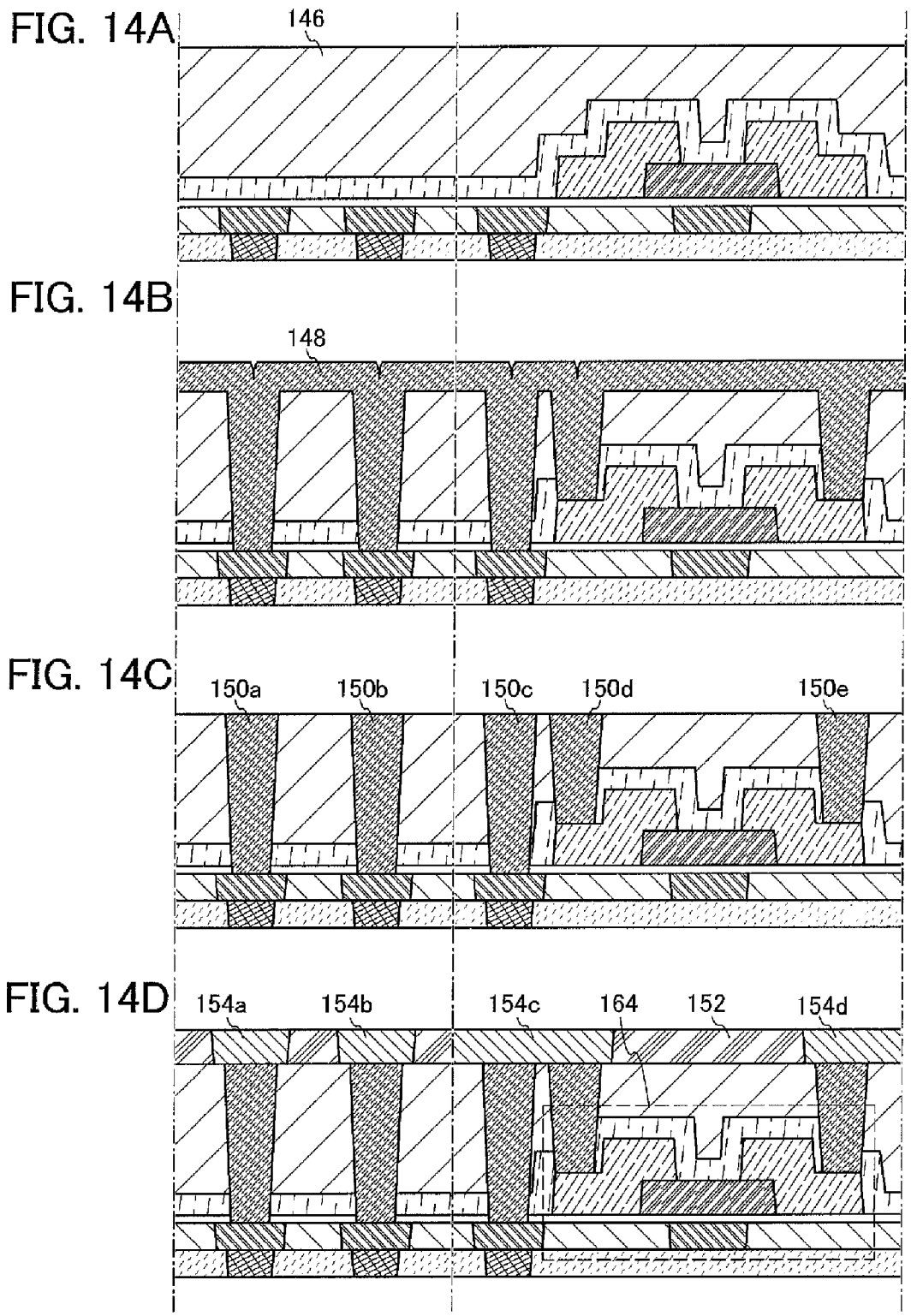

LOGIC CIRCUIT AND SEMICONDUCTOR DEVICE

TECHNICAL FIELD

The present invention relates to a logic circuit, particularly, a logic circuit including a transistor in which a channel formation region is formed using an oxide semiconductor. The present invention also relates to a semiconductor device including the logic circuit.

Note that a semiconductor device in this specification refers to all devices which can function by utilizing semiconductor characteristics, and electro-optical devices, semiconductor circuits, and electronic appliances are all semiconductor devices.

BACKGROUND ART

In a general circuit including transistors manufactured by using a Si wafer or SOI (silicon on insulator), as the operation voltage is reduced by progress of microfabrication, consumed power is reduced.

Consumed power is a sum of dynamic power and static power (hereinafter, also referred to as standby power): the dynamic power is power consumed mainly by charge and discharge of the gate capacitor of transistors and the parasitic capacitor formed with wirings connecting transistors and circuit blocks, and the like; the static power is power consumed when circuits do not operate.

As one of methods for reducing the consumed power, there is a technique called clock gating (for example, see Patent Document 1). Clock gating is a technique by which supply of a clock signal to a circuit is stopped in a period during which the circuit does not operate. By the method, the power consumed in parasitic capacitor of wirings supplied with a clock signal or the like can be reduced.

REFERENCE

[Patent Document 1] Japanese Published Patent Application No. 2008-219882

DISCLOSURE OF INVENTION

Standby power is generally classified into power consumed by a circuit which does not operate (hereinafter, referred to as a non-operating circuit) and power consumed by leakage current (which is in general, a current flowing between source and drain when the voltage flowing between gate and source is 0 V) of a transistor.

By the above-described clock gating, dynamic power consumed can be reduced, but the static power consumed due to leakage current cannot be reduced. Note that the dynamic power consumed in the non-operating circuit includes power consumed due to charge and discharge of parasitic capacitor formed by wirings to which a clock signal is supplied. Further, in the circuit where clock gating is performed, the state of an element included in the non-operating circuit is held. Thus, power consumed due to the leakage current of the transistor accounts for a large percent of the standby power. In addition, the probability of malfunction of the logic circuit, caused by leakage current of the transistor, becomes high.

In view of the above problem, one of objects of one embodiment of the present invention is to reduce standby power due to leakage current or suppress malfunction in a logic circuit performing clock gating.

In one embodiment of the present invention, a transistor in which a channel formation region is formed using an oxide semiconductor is applied to an n-channel transistor included in a logic circuit. The oxide semiconductor in the above transistor becomes an intrinsic or a substantially intrinsic semiconductor by removing an impurity such as hydrogen or water capable of being an electron donor (donor) therein, and has an energy gap larger than a silicon semiconductor.

Specifically, the logic circuit includes a transistor in which a channel formation region is formed using the following oxide semiconductor. In the oxide semiconductor, hydrogen or a OH group included is removed so that the concentration of hydrogen in the oxide semiconductor can be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower; and the carrier density is $5 \times 10^{14}$/cm$^3$ or lower, preferably $5 \times 10^{12}$/cm$^3$ or lower.

In the oxide semiconductor, the energy gap is 2 eV or higher, preferably 2.5 eV or higher, further preferably 3 eV or higher; and an impurity such as hydrogen which forms a donor is reduced as much as possible, so that the carrier density is $5 \times 10^{14}$/cm$^3$ or lower, preferably, $5 \times 10^{12}$/cm$^3$ or lower.

By using a highly-purified oxide semiconductor as described for a channel formation region, a transistor whose channel width is even 10 mm has a drain current of $1 \times 10^{-13}$ [A] or lower in the case where the drain voltage is 1 V and 10 V and the gate voltage is in the range of $-5$ V to $-20$ V. In other words, a highly-purified oxide semiconductor is used for a channel formation region of a transistor, whereby leakage current can be drastically reduced.

One embodiment of the present invention is a logic circuit having a first period during which a clock signal is input and a second period during which a clock signal is not input, which includes a transistor which is in an off state where a potential difference exists between a source terminal and a drain terminal over the second period. In the transistor, a channel formation region is formed using an oxide semiconductor in which the hydrogen concentration is $5 \times 10^{19}$ (atoms/cm$^3$) or lower.

The logic circuit of one embodiment of the present invention includes a transistor which is in an off state where a potential difference exists between a source terminal and a drain terminal over a period during which a clock signal is not supplied. A channel formation region of the transistor is formed using an oxide semiconductor in which the hydrogen concentration is reduced. Specifically, the hydrogen concentration of the oxide semiconductor is $5 \times 10^{19}$ (atoms/cm$^3$) or lower. Therefore, leakage current of the transistor can be reduced. As a result, the standby power of the logic circuit can be reduced and malfunction of the logic circuit can be suppressed.

In particular, in the logic circuit where clock gating is performed, a state in the logic circuit is held for a long time. That is, a specific transistor keeps an off state for a long time, where a potential difference exists between a source terminal and a drain terminal. Applying such a transistor to the above transistor brings great effect.

Further, reduction in power consumed in the whole circuit allows reduction in loads of an external circuit which makes a logic circuit of one embodiment of the present invention operate. Thus, the functionality of a semiconductor device including the logic circuit and the external circuit can be expanded.

BRIEF DESCRIPTION OF DRAWINGS

FIGS. 13A to 13G are cross-sectional views illustrating an example of a manufacturing process of an n-channel transistor described in Embodiment 7.

FIGS. 14A to 14D are cross-sectional views illustrating an example of a manufacturing process of an n-channel transistor described in Embodiment 7.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Note that since a source terminal and a drain terminal of a transistor change depending on the structure, the operating condition, and the like of the transistor, it is difficult to define which is a source terminal or a drain terminal. Therefore, in this document (specification, claims, drawings, and the like), one of a source terminal and a drain terminal is referred to as a first terminal and the other thereof is referred to as a second terminal for distinction.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

In this embodiment, an example of a logic circuit where clock gating is performed will be described. Specifically, an example of a logic circuit having a period during which a clock signal is input and a period during which a clock signal is not input and performing arithmetic processing with use of the clock signal will be described with reference to FIG. 1.

Figure 1:
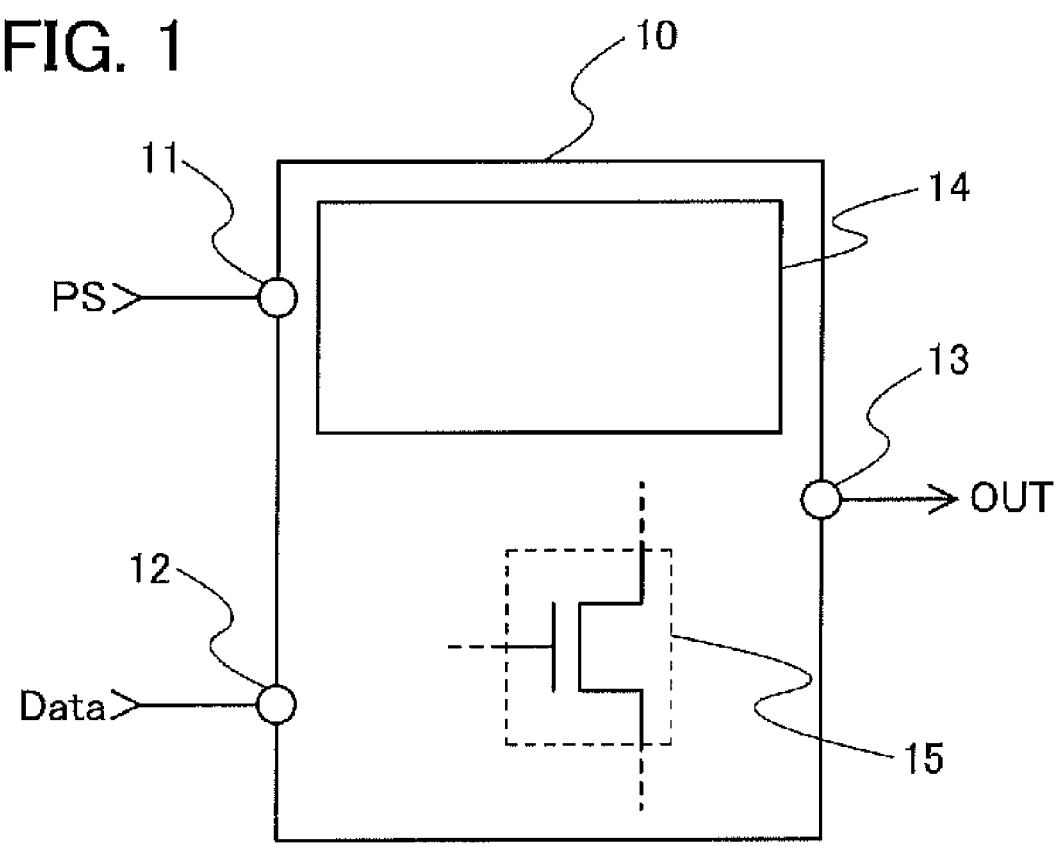
FIG. 1 shows a configuration example of a logic circuit described in Embodiment 1.

A logic circuit 10 shown in FIG. 1 includes a first input terminal 11 electrically connected to a wiring through which a pulse signal (PS) is supplied (hereinafter, also referred to as a pulse signal line), a second input terminal 12 electrically connected to a wiring through which a data signal (Data) is supplied (hereinafter, also referred to as a data signal line), and an output terminal 13. The logic circuit 10 has a period during which a clock signal (CK) is supplied through the pulse signal line and a period during which a clock signal is not supplied. That is, the logic circuit shown in FIG. 1 is a logic circuit in which clock gating is performed. Note that the sentence "a clock gate is not supplied" means that a clock signal is fixed to a potential at a high level or a potential at a low level; i.e., a signal whose potential level varies from a high level to a low level or from a low level to a high level is not supplied.

In addition, the logic circuit 10 of this embodiment shown in FIG. 1 includes a main logic circuit portion 14 and a transistor 15 which is in an off state where a potential difference exists between a source terminal and a drain terminal over a period during which a clock signal is not supplied. Note that the main logic circuit portion 14 includes a plurality of elements of transistors, capacitors, resistors, or the like.

A channel formation region of the transistor 15 is formed using an oxide semiconductor in which the hydrogen concentration is $5\times10^{19}$ (atoms/cm$^3$) or lower, preferably $5\times10^{18}$ (atoms/cm$^3$) or lower, further preferably $5\times10^{17}$ (atoms/cm$^3$)

or lower. In other words, the transistor 15 is a transistor in which a channel formation region is formed using an oxide semiconductor which is highly purified by reducing the concentration of hydrogen serving as a donor of a carrier to an extremely low level. The hydrogen concentration in the oxide semiconductor is measured by secondary ion mass spectrometry (SIMS).

The logic circuit of this embodiment is a logic circuit in which clock gating is performed, and includes the transistor which is in an off state where a potential difference exists between a source terminal and a drain terminal over a period during which clock gating is performed (i.e., a clock signal is not input). In the transistor, the channel formation region is formed using an oxide semiconductor. The hydrogen concentration of the oxide semiconductor is controlled to be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower. Therefore, the off current of the transistor can be reduced to $1 \times 10^{-13}$ [A] or lower. That is, leakage of electric charges through the transistor can be suppressed. As a result, standby power during this period can be reduced and malfunction of the logic circuit during this period can be suppressed.

In the logic circuit in which clock gating is performed, particularly, a state in the logic circuit is held for a long time. That is, a specific transistor keeps an off state for a long time, where a potential difference exists between a source terminal and a drain terminal. Applying such a transistor to the above transistor brings great effect.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that the contents of this embodiment or part thereof can be combined freely with the contents of other embodiments or part thereof or the content of Example or part thereof.

Embodiment 2

In this embodiment, an example of the logic circuit described in Embodiment 1 will be described. Specifically, a logic circuit including an AND gate and a flip-flop will be described with reference to FIGS. 2A and 2B, FIGS. 3A and 3B, and FIGS. 4A to 4C.

<Configuration Example of Logic Circuit>

Figure 2A:
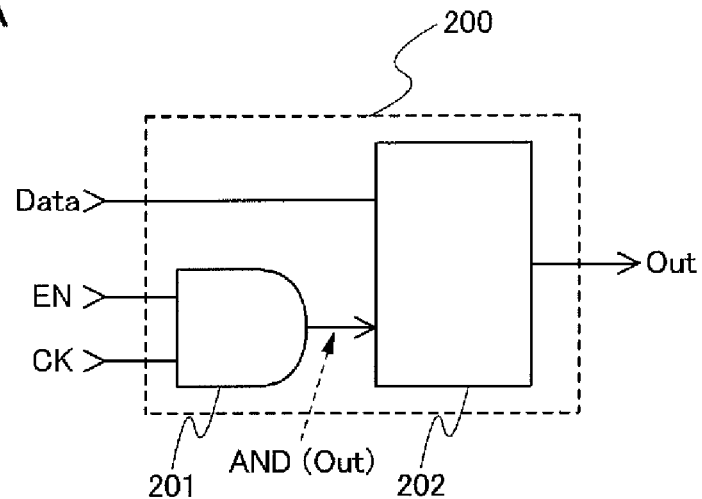
FIGS. 2A and 2B show a configuration example and an example of a timing chart, respectively, of a logic circuit described in Embodiment 2.

A logic circuit 200 of this embodiment shown in FIG. 2A includes an AND gate 201 and a flip-flop 202. The AND gate 201 has a first input terminal which is electrically connected to a wiring through which an enable signal (EN) is supplied (hereinafter, also referred to as an enable signal line) and a second input terminal which is electrically connected to a wiring through which a clock signal (CK) is supplied (hereinafter, also referred to as a clock signal line). The flip-flop 202 has a first input terminal which is electrically connected to a data signal line and a second input terminal which is electrically connected to an output terminal of the AND gate 201.

Note that the flip-flop 202 included in the logic circuit of this embodiment is a circuit which can retain data for one bit utilizing feedback operation. An output signal of the flip-flop 202 serves as an output signal of the logic circuit 200.

<Operation Example of Logic Circuit>

Figure 2B:
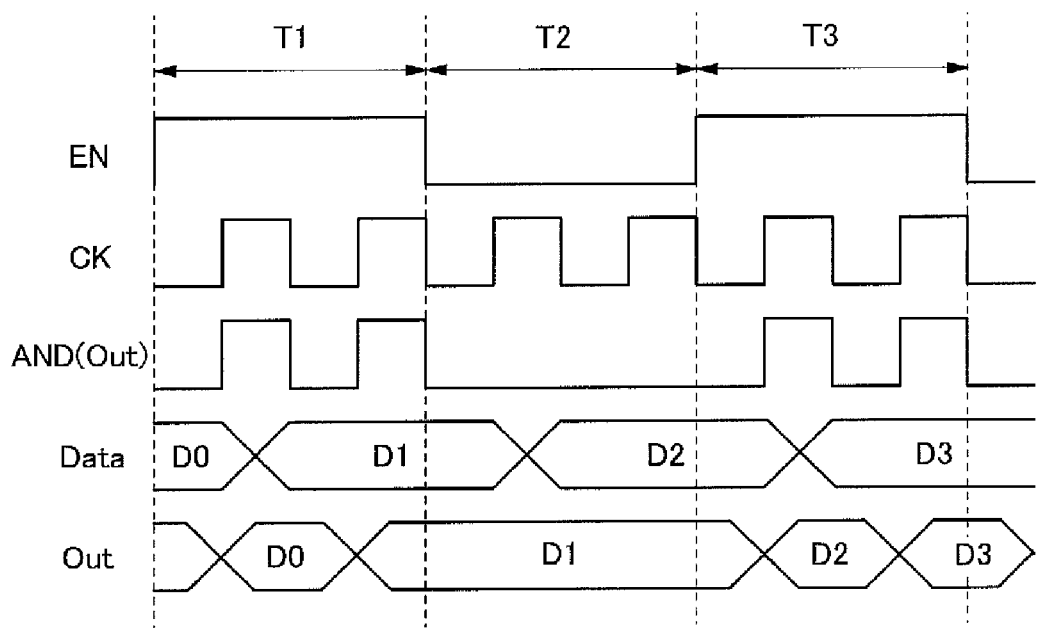

Operation of the logic circuit shown in FIG. 2A is described with reference to a timing chart shown in FIG. 2B.

During a period T1, the enable signal line serves as a wiring through which a signal at a high level is supplied. Thus, an output signal (AND(Out)) of the AND gate 201 is a clock signal (CK). That is, the clock signal (CK) is input to the second input terminal of the flip-flop 202. The flip-flop 202 operates with the input clock signal (CK). Specifically, the flip-flop 202 receives a data signal (D0 or D1) when the clock signal (CK) level is changed from the low level to the high level, and outputs the data signal when the clock signal (CK) level is changed from the high level to the low level.

During a period T2, the enable signal line serves as a wiring through which a signal at a low level is supplied. Thus, the output signal (AND(Out)) of the AND gate 201 is a low-level signal. That is, the low-level signal is input to the second input terminal of the flip-flop 202. At this time, the output signal (Out) of the logic circuit is retained as the data signal (D1).

During a period T3, the enable signal line serves as a wiring through which a high-level signal is supplied again. That is, like the period T1, the flip-flop 202 receives a data signal (D2 or D3) when the clock signal (CK) level is changed from the low level to the high level, and outputs the data signal when the clock signal (CK) level is changed from the high level to the low level.

In the logic circuit of this embodiment, the clock signal input to the flip-clop 202 is controlled by the enable signal (EN). That is, in the logic circuit, clock gating is performed with respect to the flip-flop 202.

Note that the logic circuit of this embodiment reads data when the clock signal input to the flip-flop 202 goes into a high level, and retains the read data for one clock cycle. Thus, the output signal (Out) of the logic circuit is temporally retained even after passing through the period T1 or the period T3 during which the flip-flop 202 operates.

<Example of Circuit Configuration of AND Gate and Flip-Flop>

Figure 3A:
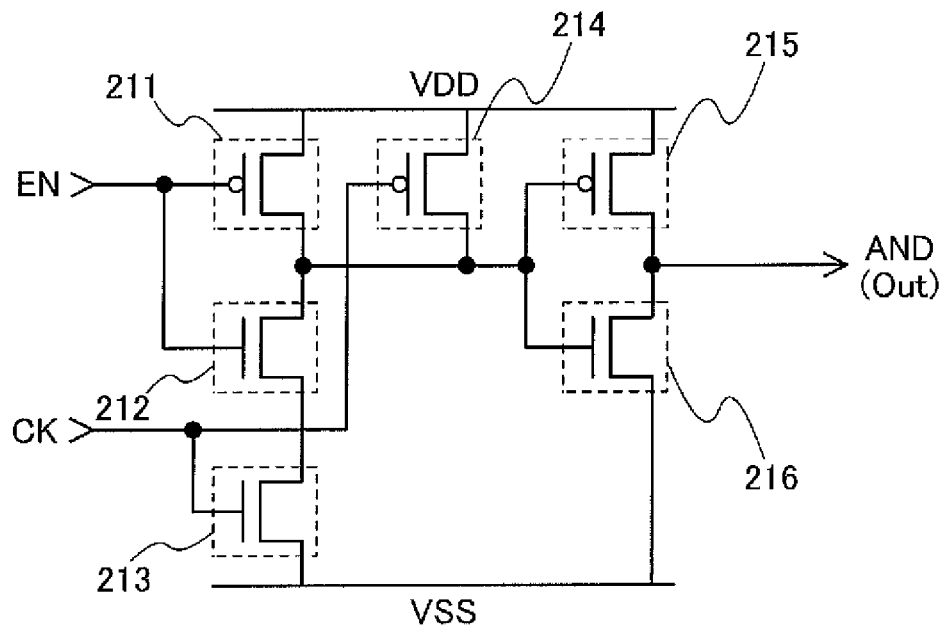
FIGS. 3A and 3B each show an example of a circuit configuration of an AND gate described in Embodiment 2.
Figure 3B:
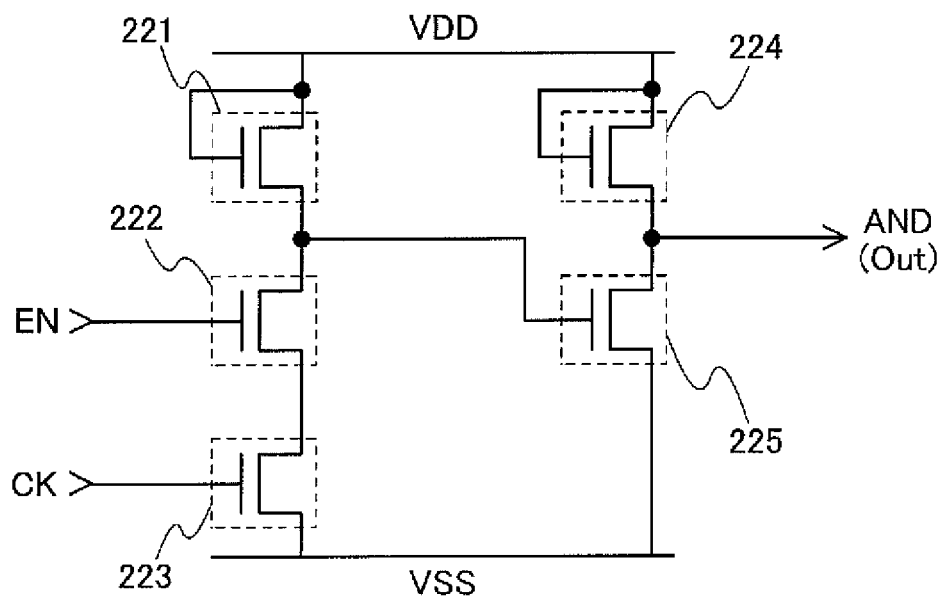
Figure 4A:
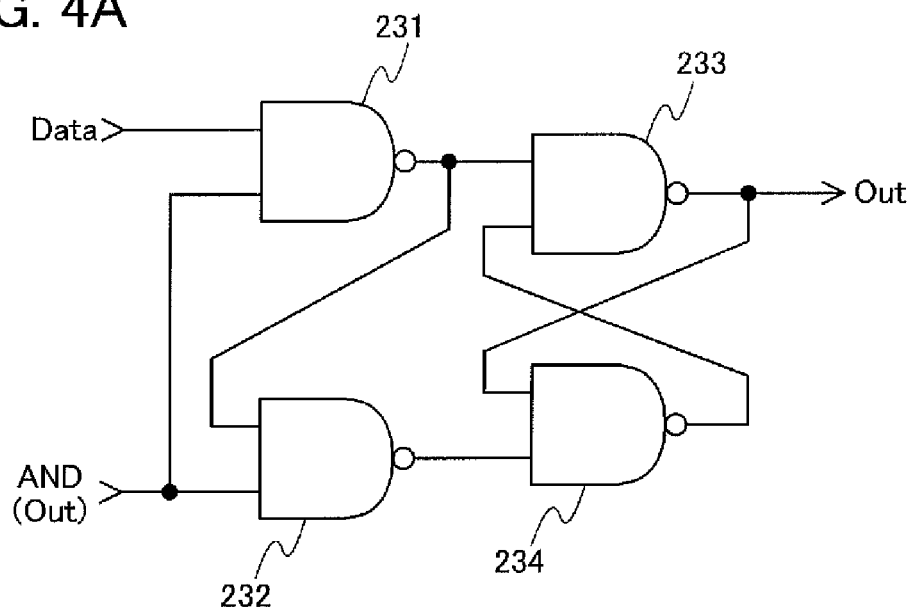
FIG. 4A shows a configuration example of a flip-flop circuit and FIGS. 4B and 4C each show an example of a circuit configuration of a NAND gate, described in Embodiment 2.
Figure 4B:
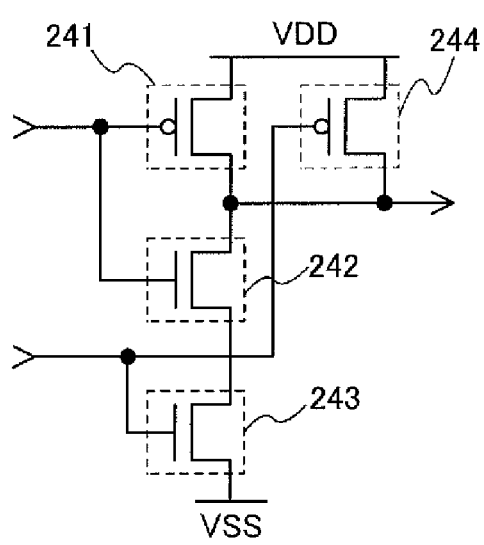
Figure 4C:
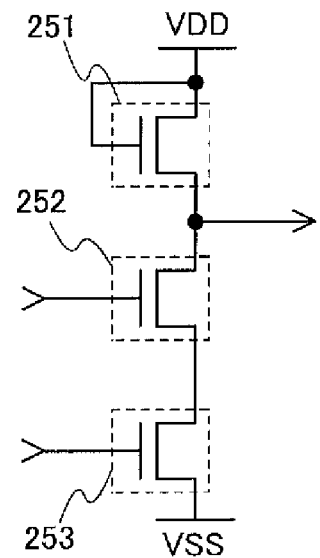

Specific examples of a circuit configuration of the AND gate 201 included in the logic circuit shown in FIG. 2A are shown in FIGS. 3A and 3B, and specific examples of a circuit configuration of the flip-flop 202 are shown in FIGS. 4A to 4C.

An AND gate shown in FIG. 3A includes transistors 211 to 216. The transistors 211, 214 and 215 are p-channel transistors, and the transistors 212, 213, and 216 are n-channel transistors.

Of the transistor 211, a gate terminal is electrically connected to an enable signal line, and a first terminal is electrically connected to a wiring through which high power supply potential (VDD) is supplied (hereinafter, also referred to as a high power supply potential line).

Of the transistor 212, a gate terminal is electrically connected to the enable signal line and the gate terminal of the transistor 211, and a first terminal is electrically connected to a second terminal of the transistor 211.

Of the transistor 213, a gate terminal is electrically connected to a clock signal line, a first terminal is electrically connected to a second terminal of the transistor 212, and a second terminal is electrically connected to a wiring through which low power supply potential (VSS) is supplied (hereinafter, referred to as a low power supply potential line).

Of the transistor 214, a gate terminal is electrically connected to the clock signal line and the gate terminal of the transistor 213, a first terminal is electrically connected to the high power supply potential line, and a second terminal is electrically connected to the second terminal of the transistor 211 and the first terminal of the transistor 212.

Of the transistor 215, a gate terminal is electrically connected to the second terminal of the transistor 211, the first terminal of the transistor 212, and the second terminal of the transistor 214; and a first terminal is electrically connected to the high power supply potential line.

Of the transistor 216, a gate terminal is electrically connected to the second terminal of the transistor 211, the first terminal of the transistor 212, the second terminal of the transistor 214, and the gate terminal of the transistor 215; a first terminal is electrically connected to a second terminal of the transistor 215; and a second terminal is electrically connected to the low power supply potential line.

Note that in the AND gate, potential of a node to which the second terminal of the transistor 215 and the first terminal of the transistor 216 are electrically connected is output as an output signal (AND(Out)) of the AND gate.

In this specification, each of the high power supply potential (VDD) and the low power supply potential (VSS) may be any potential as long as the high power supply potential (VDD) is higher than the low power supply potential (VSS). For example, ground potential, 0 V, or the like can be applied to the low power supply potential (VSS), and a given positive potential can be applied to the high power supply potential (VDD).

An AND gate shown in FIG. 3B includes transistors 221 to 225. The transistors 221 to 225 are n-channel transistors. In addition, the transistors 221 to 225 are enhancement-type transistors whose threshold voltages are positive.

Of the transistor 221, a gate terminal and a first terminal are electrically connected to a high power supply potential line.

Of the transistor 222, a gate terminal is electrically connected to an enable signal line, and a first terminal is electrically connected to a second terminal of the transistor 221.

Of the transistor 223, a gate terminal is electrically connected to a clock signal line; a first terminal is electrically connected to a second terminal of the transistor 222, and a second terminal is electrically connected to a low power supply potential line.

Of the transistor 224, a gate terminal and a first terminal are electrically connected to the high power supply potential line.

Of the transistor 225, a gate terminal is electrically connected to the second terminal of the transistor 221 and the first terminal of the transistor 222, a first terminal is electrically connected to a second terminal of the transistor 224, and a second terminal is electrically connected to the low power supply potential line.

Note that in the AND gate, potential of a node to which the second terminal of the transistor 224 and the first terminal of the transistor 225 are electrically connected is output as an output signal (AND(Out)) of the AND gate.

Each of the transistor 221 and the transistor 224 is an enhancement-type transistor in which the gate terminal and the first terminal are electrically connected to the high power supply potential line. Thus, the transistor 221 and the transistor 224 each retain an on state regardless of periods. In other words, the transistor 221 and the transistor 224 are utilized as resistors.

Further, the first input terminal and the second input terminal of the AND gate can be interchanged with each other. A terminal which is specified to be electrically connected to the enable signal line in the above description can be electrically connected to the clock signal line, and a terminal which is specified to be electrically connected to the clock signal line in the above description can be electrically connected to the enable signal line.

A flip-flop shown in FIG. 4A includes NAND gates 231 to 234,

Of the NAND gate 231, a first input terminal is electrically connected to a data signal line, and a second input terminal is electrically connected to an output terminal of an AND gate.

Of the NAND gate 232, a first input terminal is electrically connected to an output terminal of the NAND gate 231, and a second input terminal is electrically connected to the output terminal of the AND gate and the second input terminal of the NAND gate 231.

Of the NAND gate 233, a first input terminal is electrically connected to the output terminal of the NAND gate 231 and the first input terminal of the NAND gate 232.

Of the NAND gate 234, a first input terminal is electrically connected to an output terminal of the NAND gate 233, a second input terminal is electrically connected to an output terminal of the NAND gate 232, and an output terminal is electrically connected to a second input terminal of the NAND gate 233.

The flip-flop shown in FIG. 4A is a delay-type flip-flop. Although the flip-flop of this embodiment is a delay-type flip-flop in which only a Q terminal is used as an output terminal, the flip-flop may have a structure in which two output terminals of a Q terminal and a QB terminal (output terminal of the NAND gate 234) are provided.

The flip-flop shown in FIG. 4A is just an example, and a structure of the flip-flop of this embodiment is not limited to that of FIG. 4A. In other words, the flip-flop of this embodiment may have any structure as long as data for one bit can be retained utilizing the feedback operation.

FIGS. 4B and 4C each show a specific example of a circuit applicable to the NAND gates 231 to 234.

A NAND gate shown in FIG. 4B includes transistors 241 to 244. Note that the transistor 241 and the transistor 244 are p-channel transistors, and the transistor 242 and the transistor 243 are n-channel transistors.

Of the transistor 241, a gate terminal is electrically connected to a first input terminal of the NAND gate, and a first terminal is electrically connected to a high power supply potential line.

Of the transistor 242, a gate terminal is electrically connected to the first input terminal of the NAND gate and the gate terminal of the transistor 241, and a first terminal is electrically connected to a second terminal of the transistor 241.

Of the transistor 243, a gate terminal is electrically connected to a second input terminal of the NAND gate, a first terminal is electrically connected to a second terminal of the transistor 242, and a second terminal is electrically connected to a low power supply potential line.

Of the transistor 244, a gate terminal is electrically connected to the second input terminal of the NAND gate and the gate terminal of the transistor 243, a first terminal is electrically connected to the high power supply potential line, and a second terminal is electrically connected to the second terminal of the transistor 241 and the first terminal of the transistor 242.

Note that in the NAND gate, potential of a node to which the second terminal of the transistor 241, the first terminal of the transistor 242, and the second terminal of the transistor 244 are electrically connected is output as an output signal of the NAND gate.

A NAND gate shown in FIG. 4C includes transistors 251 to 253. Note that the transistors 251 to 253 are n-channel transistors. In addition, the transistors 251 to 253 are enhancement-type transistors whose threshold voltages are positive.

Of the transistor 251, a gate terminal and a first terminal are electrically connected to a high power supply potential line.

Of the transistor 252, a gate terminal is electrically connected to a first input terminal of the NAND gate, and a first terminal is electrically connected to a second terminal of the transistor 251.

Of the transistor 253, a gate terminal is electrically connected to a second input terminal of the NAND gate, a first terminal is electrically connected to a second terminal of the transistor 252, and a second terminal is electrically connected to a low power supply potential line.

Note that in the NAND gate, potential of a node to which the second terminal of the transistor 251 and the first terminal of the transistor 252 are electrically connected is output as an output signal of the NAND gate.

Further, the first input terminal and the second input terminal of the NAND gate can be interchanged with each other. A terminal which is specified to be electrically connected to the first input terminal of the NAND gate in the above description can be electrically connected to the second input terminal of the NAND gate, and a terminal which is specified to be electrically connected to the second input terminal of the NAND gate in the above description can be electrically connected to the first input terminal of the NAND gate.

In the logic circuit of this embodiment, at least one of the transistors 242, 243, 252, and 253 included in the NAND gates 231 to 234 has a channel formation region which is formed using an oxide semiconductor. The hydrogen concentration of the oxide semiconductor is controlled to be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower. Therefore, the off current of the transistor can be reduced to $1 \times 10^{-13}$ [A] or lower. That is, leakage of electric charges through the transistor over the period where clock gating is performed can be suppressed. As a result, standby power during this period can be reduced and malfunction of the logic circuit during this period can be suppressed.

Further, when the AND gate shown in FIG. 3B is applied to the AND gate 201 included in the logic circuit of this embodiment and the delay-type flip-flop including the NAND gate shown in FIG. 4C is applied to the flip-flop 202, all transistors included in the logic circuit can be n-channel transistors. By applying n-channel transistors to the above transistors (in which a channel formation region is formed using an oxide semiconductor whose hydrogen concentration is $5 \times 10^{19}$ (atoms/cm$^3$) or lower), consumed power can be reduced in the logic circuit in which all of the included transistors are n-channel transistors. In addition, by formation of the logic circuit including not p-channel transistors but n-channel transistors, reduction in the manufacturing process, improvement of yield of the logic circuit, and reduction in the manufacturing cost can be achieved.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that the contents of this embodiment or part thereof can be combined freely with the contents of other embodiments or part thereof or the content of Example or part thereof.

Embodiment 3

In this embodiment, an example of the logic circuit described in Embodiment I will be described. Specifically, a logic circuit including a NOR gate and a flip-flop will be described with reference to FIGS. 5A and 5B and FIGS. 6A and 6B.

<Configuration Example of Logic Circuit>

Figure 5A:
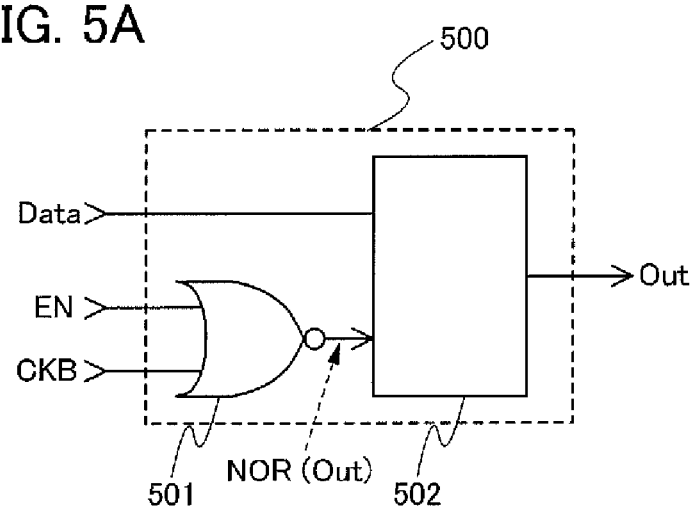
FIGS. 5A and 5B show a configuration example and an example of a timing chart, respectively, of a logic circuit described in Embodiment 3.

A logic circuit 500 of this embodiment shown in FIG. 5A includes a NOR gate 501 and a flip-flop 502. In the NOR gate 501, a first input terminal is electrically connected to an enable signal line and a second input terminal is electrically connected to a wiring through which an inverted circuit signal (CKB) is supplied (hereinafter, also referred to as an inverted clock signal line). In the flip-flop 502, a first input terminal is electrically connected to a data signal line and a second input terminal is electrically connected to an output terminal of the NOR gate 501.

Note that the flip-flop 502 included in the logic circuit of this embodiment is a circuit which can retain data for one bit utilizing feedback operation. An output signal of the flip-flop 502 serves as an output signal of the logic circuit 500.

<Operation Example of Logic Circuit>

Figure 5B:
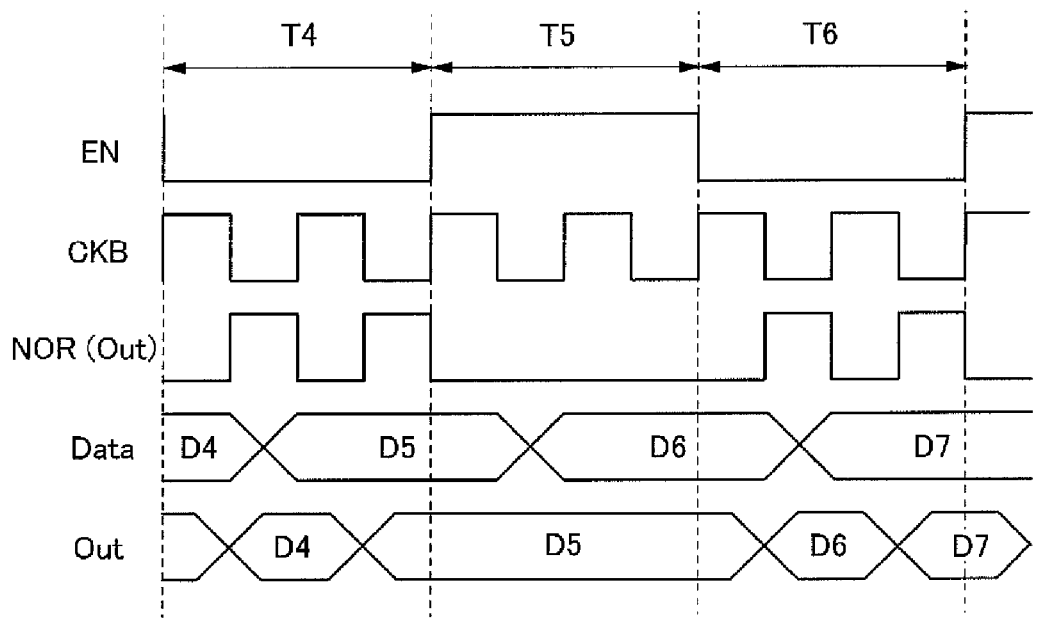

Operation of the logic circuit shown in FIG. 5A is described with reference to a timing chart shown in FIG. 5B.

During a period T4, the enable signal line serves as a wiring through which a signal at a low level is supplied. Thus, an output signal (NOR(Out)) of the NOR gate 501 is a clock signal (CK). That is, the clock signal (CK) is input to the second input terminal of the flip-flop 502. The flip-flop 502 operates with the input clock signal (CK). Specifically, the flip-flop 502 receives a data signal (D4 or D5) when the level of the clock signal (CK) is changed from the low level to the high level, and outputs the data signal when the level of the clock signal (CK) is changed from the high level to the low level.

During a period T5, the enable signal line serves as a wiring through which a signal at a high level is supplied. Thus, the output signal (NOR(Out)) of the NOR gate 501 is a low-level signal. That is, the low-level signal is input to the second input terminal of the flip-flop 502. At this time, the output signal (Out) of the logic circuit is retrained as the data signal D5.

During a period T6, the enable signal line again serves as a wiring through which a signal at a low level is supplied. That is, like the period T4, the flip-flop 502 receives a data signal (D6 or D7) when the level of the clock signal (CK) is changed from the low level to the high level, and outputs the data signal when the level of the clock signal (CK) is changed from the high level to the low level.

In the logic circuit of this embodiment, the clock signal input to the flip-flop 502 is controlled by the enable signal (EN). That is, in the logic circuit, clock gating is performed with respect to the flip-flop 502.

Note that the logic circuit of this embodiment reads data when the clock signal input to the flip-flop 502 goes into a high level, and retains the read data for one clock cycle. Thus, the output signal (Out) of the logic circuit is temporally retained even after passing through the period T4 or the period T6 during which the flip-flop 502 operates.

<Example of Circuit Configuration of Nor Gate and Flip-Flop>

Figure 6A:
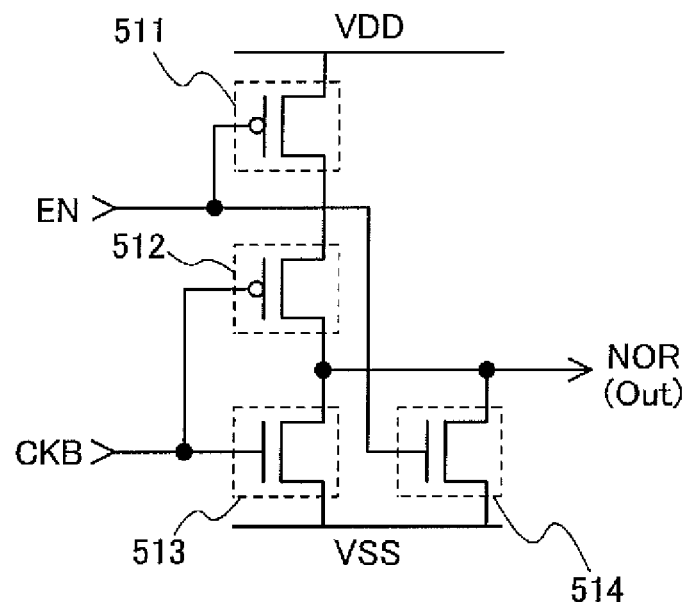
FIGS. 6A and 6B each show an example of a circuit configuration of a NOR gate described in Embodiment 3.
Figure 6B:
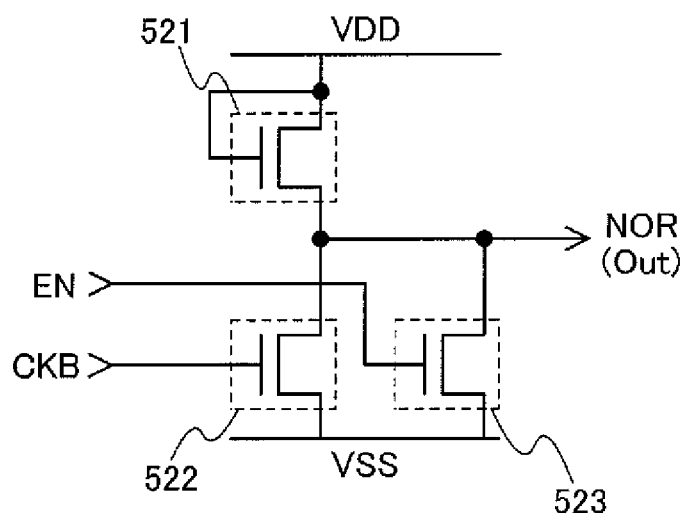

Specific examples of a circuit configuration of the NOR gate 501 included in the logic circuit shown in FIG. 5A are shown in FIGS. 6A and 6B. Note that the flip-flop 502 included in the logic circuit shown in FIG. 5A can be the delay-type flip-flop shown in FIG. 4A. Therefore, the above description of the delay-type flip-flop is to be referred to as a specific example of a circuit configuration of the flip-flop 502. Specific examples of a circuit configuration of the NOR gate 501 are described below, with reference to FIGS. 6A and 6B.

A NOR gate shown in FIG. 6A includes transistors 511 to 514. Note that the transistors 511 and 512 are p-channel transistors and the transistors 513 and 514 are n-channel transistors.

Of the transistor 511, a gate terminal is electrically connected to the enable signal line, and a first terminal is electrically connected to a wiring through which high power supply potential (VDD) is supplied (hereinafter, referred to as a high power supply line).

Of the transistor 512, a gate terminal is electrically connected to the inverted clock signal line, and a first terminal is electrically connected to a second terminal of the transistor 511.

Of the transistor 513, a gate terminal is electrically connected to the inverted clock signal line and the gate terminal of the transistor 512, a first terminal is electrically connected to a second terminal of the transistor 512, and a second terminal is electrically connected to a low power supply potential line.

Of the transistor 514, a gate terminal is electrically connected to the enable signal line and the gate terminal of the transistor 511, a first terminal is electrically connected to the second terminal of the transistor 512 and the first terminal of the transistor 513, and a second terminal is electrically connected to the low power supply potential line.

Note that in the NOR gate, potential of a node to which the second terminal of the transistor 512, the first terminal of the transistor 513, and the first terminal of the transistor 514 are electrically connected is output as an output signal (NOR (Out)) of the NOR gate.

A NOR gate shown in FIG. 6B includes transistors 521 to 523. Note that the transistors 521 to 523 are n-channel transistors. In addition, the transistors 521 to 523 are enhancement-type transistors whose threshold voltages are positive.

Of the transistor 521, a gate terminal and a first terminal are electrically connected to a high power supply potential line.

Of the transistor 522, a gate terminal is electrically connected to the inverted clock signal line, a first terminal is electrically connected to a second terminal of the transistor 521, and a second terminal is electrically connected to a low power supply potential line.

Of the transistor 523, a gate terminal is electrically connected to the enable signal line, a first terminal is electrically connected to the second terminal of the transistor 521 and the first terminal of the transistor 522, and a second terminal is electrically connected to the low power supply potential line.

Note that in the NOR gate, potential of a node to which the second terminal of the transistor 521, the first terminal of the transistor 522, and the first terminal of the transistor 523 are electrically connected is output as an output signal (NOR (Out)) of the NOR gate.

The transistor 521 is an enhancement-type transistor in which the gate terminal and the first terminal are electrically connected to the high power supply potential line. Thus, the transistor 521 retains an on state regardless of periods. In other words, the transistor 521 is utilized as a resistor.

Further, the first input terminal and the second input terminal of the NOR gate can be interchanged with each other. A terminal which is specified to be electrically connected to the enable signal line in the above description can be electrically connected to the inverted clock signal line, and a terminal which is specified to be electrically connected to the inverted clock signal line in the above description can be electrically connected to the enable signal line.

The logic circuit of this embodiment includes a transistor in which a channel formation region is formed using an oxide semiconductor. The hydrogen concentration of the oxide semiconductor is controlled to be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower. Therefore, the off current of the transistor can be reduced to $1 \times 10^{-13}$ [A] or lower. That is, leakage of electric charges through the transistor over the period where clock gating is performed can be sup-pressed. As a result, standby power during this period can be reduced and malfunction of the logic circuit during this period can be suppressed.

Further, when the NOR gate shown in FIG. 6B is applied to the NOR gate 501 included in the logic circuit of this embodiment and the delay-type flip-flop including the NAND gate shown in FIG. 4C is applied to the flip-flop 502, all transistors included in the logic circuit can be n-channel transistors. By applying n-channel transistors to the above transistors (in which a channel formation region is formed using an oxide semiconductor whose hydrogen concentration is $5 \times 10^{19}$ (atoms/cm$^3$) or lower), consumed power can be reduced in the logic circuit in which all of the included transistors are n-channel transistors. In addition, by formation of the logic circuit including not p-channel transistors but n-channel transistors, reduction in the manufacturing process, improvement of yield of the logic circuit, and reduction in the manufacturing cost can be achieved.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that the contents of this embodiment or part thereof can be combined freely with the contents of other embodiments or part thereof or the content of Example or part thereof.

Embodiment 4

In this embodiment, an example of the logic circuit described in Embodiment 1 will be described. Specifically, a logic circuit including a latch and a flip-flop will be described with reference to FIGS. 7A and 7B and FIGS. 8A to 8C.

<Configuration Example of Logic Circuit>

Figure 7A:
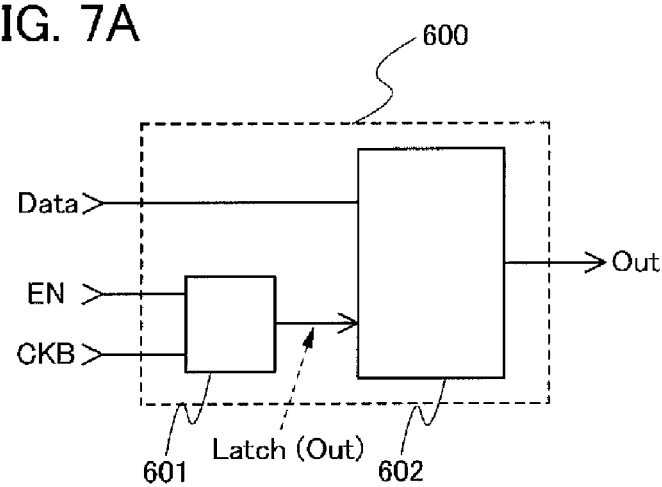
FIGS. 7A and 7B show a configuration example and an example of a timing chart, respectively, of a logic circuit described in Embodiment 4.

A logic circuit 600 of this embodiment shown in FIG. 7A includes a latch 601 and a flip-flop 602. In the latch 601, a first input terminal is electrically connected to an enable signal line and a second input terminal is electrically connected to an inverted clock signal line. In the flip-flop 602, a first input terminal is electrically connected to a data signal line and a second input terminal is electrically connected to an output terminal of the latch 601.

Note that the flip-flop 602 included in the logic circuit of this embodiment is a circuit which can retain data for one bit utilizing feedback operation. An output signal of the flip-flop 602 serves as an output signal of the logic circuit 600.

The latch 601 of this embodiment may have any structure as long as data can be latched. Here, as the latch 601, a circuit which latches an inverted signal of a signal input to the second input terminal when a signal at a high level is supplied to the first input terminal is used.

<Operation Example of Logic Circuit>

Figure 7B:
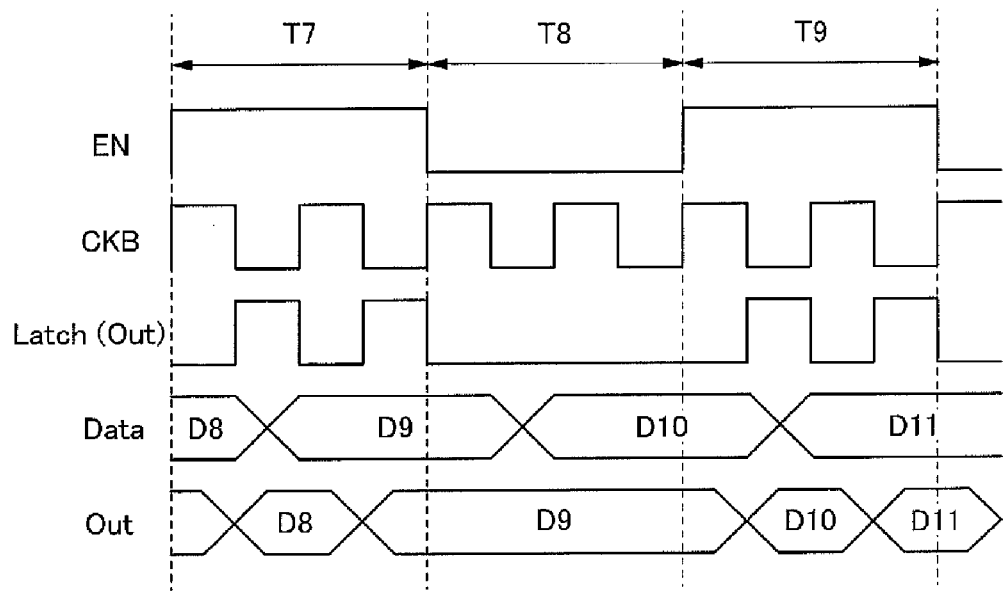

Operation of the logic circuit shown in FIG. 7A is described with reference to a timing chart shown in FIG. 7B.

During a period T7, the enable signal line serves as a wiring though which a signal at a high level is supplied. At this time, an output signal (Latch(Out)) of the latch 601 is a clock signal (CK). In other words, the clock signal (CK) is input to the second input terminal of the flip-flop 602. The flip-flop 602 operates with the input clock signal (CK). Specifically, the flip-flop 602 receives a data signal (D8 or D9) when the level of the clock signal (CK) is changed from the low level to the high level, and outputs the data signal when the level of the clock signal (CK) is changed from the high level to the low level.

During a period T8, the enable signal line serves as a wiring through which a signal at a low level is supplied. At this time, the output signal (Latch(Out)) of the latch 601 retains a low level. In other words, a low-level signal is input to the second input terminal of the flip-flop 602. At this time, the output signal (Out) of the logic circuit is retained as the data signal (D9).

During a period T9, the enable signal line again serves as a wiring through which a signal at a high level is supplied. That is, like the period T7, the flip-flop 602 receives a data signal (D10 or D11) when the level of the clock signal (CK) is changed from the low level to the high level, and outputs the data signal when the level of the clock signal (CK) is changed from the high level to the low level.

In the logic circuit of this embodiment, the clock signal (CK) input to the flip-flop 602 is controlled by the enable signal (EN). That is, in the logic circuit, clock gating is performed with respect to the flip-flop 602.

Note that the logic circuit of this embodiment reads data when the clock signal input to the flip-flop 602 goes into a high level, and retains the read data for one clock cycle. Thus, the output signal (Out) of the logic circuit is temporally retained even after passing through the period T7 or the period T9 during which the flip-flop 602 operates.

<Example of Circuit Configuration of Latch and Flip-Flop>

Figure 8A:
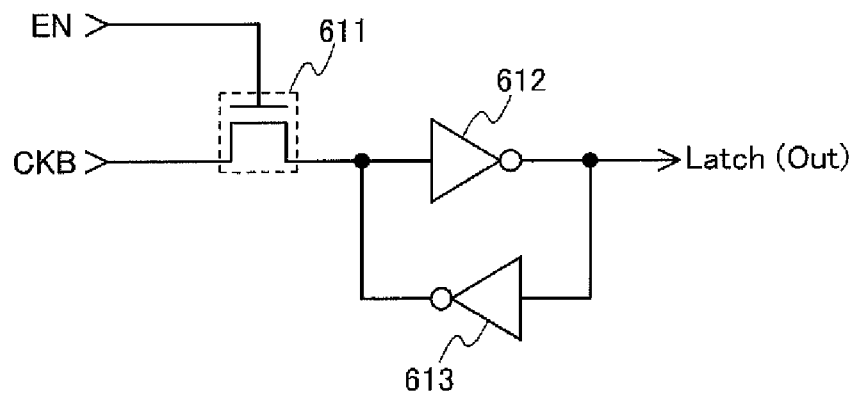
FIG. 8A shows a configuration example of a latch and FIGS. 8B and 8C each show a configuration example of an inverter, in a logic circuit described in Embodiment 4.
Figure 8B:
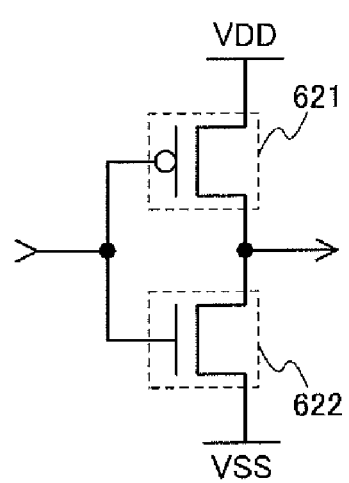
Figure 8C:
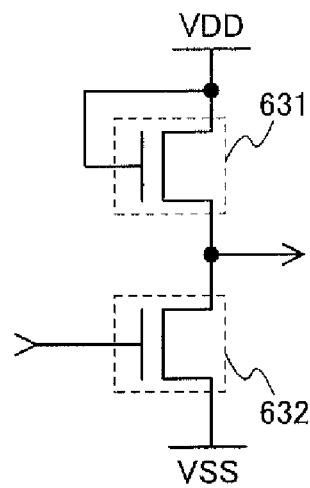

Specific examples of a circuit configuration of the latch 601 included in the logic circuit shown in FIG. 7A are shown in FIGS. 8A to 8C. Note that the flip-flop 602 included in the logic circuit shown in FIG. 7A can be the delay-type flip-flop shown in FIG. 4A. Therefore, the above description of the delay-type flip-flop is to be referred to as a specific example of a circuit configuration of the flip-flop 602. Specific examples of a circuit configuration of the latch 601 are described below, with reference to FIGS. 8A to 8C.

A latch shown in FIG. 8A includes a transistor 611, an inverter 612, and an inverter 613. Note that the transistor 611 is an n-channel transistor.

Of the transistor 611, a gate terminal is electrically connected to the enable signal line, and a first terminal is electrically connected to the inverted clock signal line.

An input terminal of the inverter 612 is electrically connected to a second terminal of the transistor 611.

An input terminal of the inverter 613 is electrically connected to an output terminal of the inverter 612, and an output terminal thereof is electrically connected to a second terminal of the transistor 611 and the input terminal of the inverter 612.

Note that in the latch, an output signal of the inverter 612 is output as an output signal (Latch(Out)) of the latch.

FIGS. 8B and 8C show specific examples of a circuit applicable to the inverter 612 and the inverter 613.

An inverter shown in FIG. 8B includes a transistor 621 and a transistor 622. Note that the transistor 621 is a p-channel transistor and the transistor 622 is an n-channel transistor.

Of the transistor 621, a gate terminal is electrically connected to the input terminal of the inverter, and a first terminal is electrically connected to a high power supply potential line.

Of the transistor 622, a gate terminal is electrically connected to the input terminal of the inverter and the gate terminal of the transistor 621, a first terminal is electrically connected to a second terminal of the transistor 621, and a second terminal is electrically connected to a low power supply potential line.

Note that in the inverter, potential of a node to which the second terminal of the transistor 621 and the first terminal of the transistor 622 are electrically connected is output as an output signal.

An inverter shown in FIG. 8C includes a transistor 631 and a transistor 632. Note that the transistor 631 and the transistor 632 are n-channel transistors. In addition, the transistor 631 and the transistor 632 are enhancement-type transistors whose threshold voltages are positive.

Of the transistor 631, a gate terminal and a first terminal are electrically connected to a high power supply potential line.

Of the transistor 632, a gate terminal is electrically connected to the input terminal of the inverter, a first terminal is electrically connected to a second terminal of the transistor 631, and a second terminal is electrically connected to a low power supply potential line.

Note that in the inverter, potential of a node to which the second terminal of the transistor 631 and the first terminal of the transistor 632 are electrically connected is output as an output signal.

Although the above description is the case where the transistor 611 is an n-channel transistor, the transistor 611 can be a p-channel transistor. In this case, by inverting the enable signal, the operation similar to the above can be performed.

The logic circuit of this embodiment includes a transistor in which a channel formation region is formed using an oxide semiconductor. The hydrogen concentration of the oxide semiconductor is controlled to be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower. Therefore, the off current of the transistor can be reduced to $1 \times 10^{-13}$ [A] or lower. That is, leakage of electric charges through the transistor during the period where clock gating is performed can be suppressed. As a result, standby power during this period can be reduced and malfunction of the logic circuit during this period can be suppressed.

Further, when a latch including the inverter shown in FIG. 8C is applied to the latch 601 included in the logic circuit of this embodiment and the delay-type flip-flop including the NAND gate shown in FIG. 4C is applied to the flip-flop 602, all transistors included in the logic circuit can be n-channel transistors. By applying n-channel transistors to the above transistors (in which a channel formation region is formed using an oxide semiconductor whose hydrogen concentration is $5 \times 10^{19}$ (atoms/cm$^3$) or lower), consumed power can be reduced in the logic circuit in which all of included transistors are n-channel transistors. In addition, by formation of the logic circuit including not p-channel transistors but n-channel transistors, reduction in the manufacturing process, improvement of yield of the logic circuit, and reduction in the manufacturing cost can be achieved.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that the contents of this embodiment or part thereof can be combined freely with the contents of other embodiments or part thereof or the content of Example or part thereof.

Embodiment 5

In this embodiment, an example of the logic circuit described in Embodiment 1 will be described. Specifically, a logic circuit including an AND gate and a plurality of flip-flops will be described with reference to FIG. 9.

Figure 9:
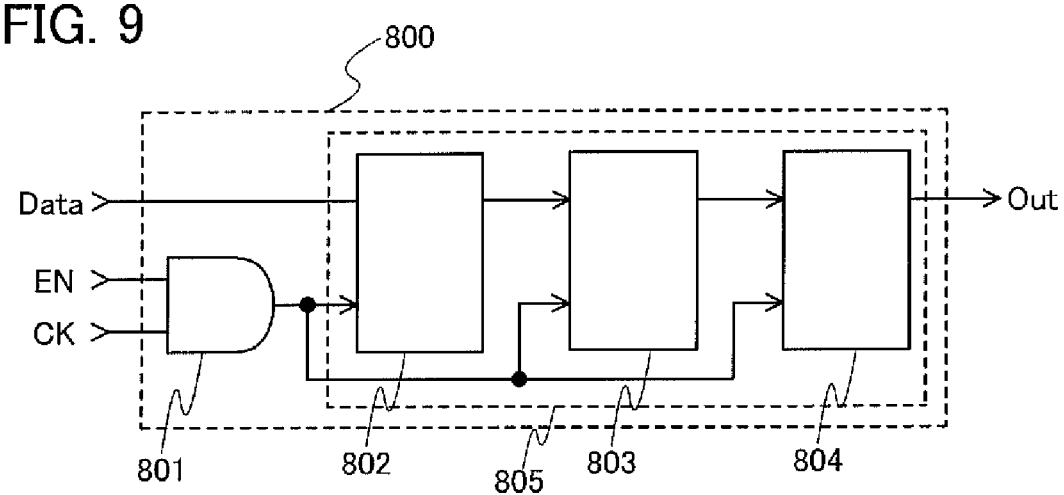
FIG. 9 shows a configuration example of a logic circuit described in Embodiment 5.

A logic circuit 800 of this embodiment shown in FIG. 9 includes an AND gate 801 and a flip-flop group 805 including flip-flops 802 to 804.

Of the AND gate 801, a first input terminal is electrically connected to an enable signal line, and a second input terminal is electrically connected to a clock signal line.

Of the flip-flop 802, a first input terminal is electrically connected to a data signal line, and a second input terminal is electrically connected to an output terminal of the AND gate 801.

Of the flip-flop 803, a first input terminal is electrically connected to an output terminal of the flip-flop 802, and a second input terminal is electrically connected to the output terminal of the AND gate 801.

In the flip-flop 804, a first input terminal is electrically connected to an output terminal of the flip-flop 803, and a second input terminal is electrically connected to the output terminal of the AND gate 801.

Note that an output signal of the flip-flop 804 is an output signal (Out) of the logic circuit 800.

Note that the flip-flops 802 to 804 included in the logic circuit of this embodiment are circuits which can retain data for one bit utilizing feedback operation. For example, a delay-type flip-flop shown in FIG. 4A can be applied.

In the logic circuit of this embodiment, the clock signal (CK) input to the flip-flop group 805 is controlled by the enable signal (EN). That is, in the logic circuit, clock gating is performed with respect to the flip-flop group 805.

Further, of the flip-flop in the second or subsequent stage in the flip-flop group 805, the first input terminal is electrically connected to the output terminal of the flip-flop in the previous stage. That is, the logic circuit of this embodiment is a shift register which shifts the data signal (Data) through the flip-flops sequentially during a period where a clock signal is input.

The logic circuit of this embodiment includes a transistor in which a channel formation region is formed using an oxide semiconductor. The hydrogen concentration of the oxide semiconductor is controlled to be $5\times10^{19}$ (atoms/cm$^3$) or lower, preferably $5\times10^{18}$ (atoms/cm$^3$) or lower, further preferably $5\times10^{17}$ (atoms/cm$^3$) or lower. Therefore, the off current of the transistor can be reduced to $1\times10^{-13}$ [A] or lower. That is, leakage of electric charges through the transistor during the period where clock gating is performed can be suppressed. As a result, standby power during this period can be reduced and malfunction of the logic circuit during this period can be suppressed.

Further, all transistors included in the AND gate 801 and the flip-flop group 805 in the logic circuit of this embodiment can be n-channel transistors. By applying n-channel transistors to the above transistors (in which a channel formation region is formed using an oxide semiconductor whose hydrogen concentration is $5\times10^{19}$ (atoms/cm$^3$) or lower), consumed power can be reduced in the logic circuit in which all of the included transistors are n-channel transistors. In addition, by formation of the logic circuit including not p-channel transistors but n-channel transistors, reduction in the manufacturing process, improvement of yield of the logic circuit, and reduction in the manufacturing cost can be achieved.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that this embodiment shows the logic circuit which includes three flip-flops; however, the number of flip-flops in the logic circuit of this embodiment is not limited to three. As the logic circuit of this embodiment, a logic circuit which includes first to n-th flip-flops (n is a natural number) can be used. Note that of the k-th flip-flop (k is a natural number equal to or less than n) included in the logic circuit, a first input terminal is electrically connected to an output terminal of the (k−1)-th flip-flop, and a second input terminal is electrically connected to the output terminal of the AND gate 801.

Furthermore, in this embodiment, an output signal of the flip-flop in the previous stage is input to the first input terminal of the flip-flop in the second or subsequent stage; however, a structure of the logic circuit of this embodiment is not limited to the above structure. For example, a structure in which a signal is input from the external circuit of the logic circuit 800 to the flip-flop may be employed. Alternatively, a structure may be employed, in which a first input terminal of a flip-flop is electrically connected to an output terminal of a flip-flop which is not a flip-flop in the previous stage; e.g., the first input terminal of the flip-flop may be electrically connected to an output terminal of a flip-flop in a stage before the preceding stage. Further alternatively, a first input terminal of a flip-flop may be connected to an output terminal of another flip-flop via another circuit, instead of being connected directly thereto.

The plurality of flip-flops included in the logic circuit of this embodiment do not necessarily have the same structure to each other. Each of the flip-flops may have a different structure in accordance with applications or the like.

Note that the contents of this embodiment or part thereof can be combined freely with the contents of other embodiments or part thereof or the content of Example or part thereof.

Embodiment 6

In this embodiment, an example of the logic circuit described in Embodiment 1 will be described. Specifically, a logic circuit including an AND gate and a plurality of flip-fops will be described with reference to FIG. 10.

Figure 10:
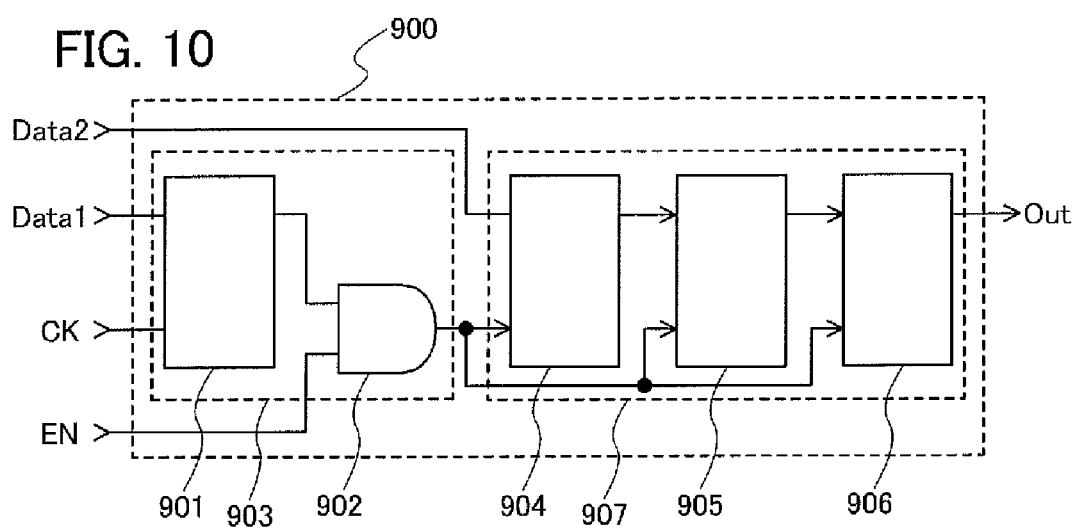
FIG. 10 shows a configuration example of a logic circuit described in Embodiment 6.

A logic circuit 900 of this embodiment shown in FIG. 10 includes a control portion 903 including a flip-flop 901 and an AND gate 902, and a flip-flop group 907 including flip-flops 904 to 906.

Of the flip-flop 901, a first input terminal is electrically connected to a wiring through which a first data signal (Data 1) is supplied (hereinafter, referred to as a first data signal line), and a second input terminal is electrically connected to a clock signal line.

Of the AND gate 902, a first input terminal is electrically connected to an output terminal of the flip-flop 901, and a second input terminal is electrically connected to an enable signal line.

Of the flip-flop 904, a first input terminal is electrically connected to a wiring through which a second data signal (Data 2) is supplied (hereinafter, also referred to as a second data signal line), and a second input terminal is electrically connected to an output terminal of the AND gate 902.

Of the flip-flop 905, a first input terminal is electrically connected to an output terminal of the flip-flop 904, and a second input terminal is electrically connected to the output terminal of the AND gate 902.

Of the flip-flop 906, a first input terminal is electrically connected to an output terminal of the flip-flop 905, and a second input terminal is electrically connected to the output terminal of the AND gate 902.

Note that an output signal of the flip-flop 906 is an output signal (Out) of the logic circuit 900.

The flip-flop 901 and the flip-flops 904 to 906 included in the logic circuit of this embodiment are circuits which can retain data for one bit utilizing feedback operation. For example, a delay-type flip-flop shown in FIG. 4A can be applied.

In the logic circuit of this embodiment, the clock signal input to the flip-flop group 907 is controlled by the enable signal (EN) and the output signal of the flip-flop 901 controlled by the first data signal (Data 1) and the clock signal. That is, in the logic circuit, clock gating is performed with respect to the flip-flop group 907.

Further, of the flip-flop in the second or subsequent stage in the flip-flop group 907, the first input terminal is electrically connected to the output terminal of the flip-flop in the previous stage. That is, the logic circuit of this embodiment is a shift register which shifts the second data signal (Data 2) through the flip-flops sequentially during a period where a clock signal is input.

The logic circuit of this embodiment includes a transistor in which a channel formation region is formed using an oxide semiconductor. The hydrogen concentration of the oxide semiconductor is controlled to be $5 \times 10^{19}$ (atoms/cm$^3$) or lower, preferably $5 \times 10^{18}$ (atoms/cm$^3$) or lower, further preferably $5 \times 10^{17}$ (atoms/cm$^3$) or lower. Therefore, the off current of the transistor can be reduced to $1 \times 10^{-13}$ [A] or lower. That is, leakage of electric charges through the transistor during the period where clock gating is performed can be suppressed. As a result, standby power during this period can be reduced and malfunction of the logic circuit during this period can be suppressed.

Further, all transistors included in the control portion 903 and the flip-flop group 907 in the logic circuit of this embodiment can be n-channel transistors. By applying n-channel transistors to the above transistors (in which a channel formation region is formed using an oxide semiconductor whose hydrogen concentration is $5 \times 10^{19}$ (atoms/cm$^3$) or lower), consumed power can be reduced in the logic circuit in which all of the included transistors are n-channel transistors. In addition, by formation of the logic circuit including not p-channel transistors but n-channel transistors, reduction in the manufacturing process, improvement of yield of the logic circuit, and reduction in the manufacturing cost can be achieved.

Further, reduction in power consumed in the logic circuit allows reduction in loads of an external circuit which makes the logic circuit of this embodiment operate. Thus, the functionality of a semiconductor device including the logic circuit and the external circuit can be expanded.

Note that this embodiment shows the flip-flop group 907 which includes three flip-flops; however, the number of flip-flops in the flip-flop group 907 of this embodiment is not limited to three. As the logic circuit of this embodiment, a logic circuit which includes a flip-flop group including first to n-th flip-flops (n is a natural number) can be used. Note that of the k-th flip-flop (k is a natural number equal to or less than n) included in the flip-flop group, the first input terminal is electrically connected to the output terminal of the (k−1)-th flip-flop, and the second input terminal is electrically connected to the output terminal of the AND gate 902.

Furthermore, in the flip-flop group 907 of this embodiment, the output signal of the flip-flop in the previous stage is input to the first input terminal of the flip-flop in the second or subsequent stage; however, a structure of the flip-flop group of this embodiment is not limited to the above structure. For example, a structure in which a signal is input from the external circuit of the logic circuit 900 to the flip-flop may be employed. Alternatively, a structure may be employed, in which a first input terminal of a flip-flop is electrically connected to an output terminal of a flip-flop which is not a flip-flop in the previous stage; e.g., the first input terminal of the flip-flop may be electrically connected to an output terminal of a flip-flop in a stage before the preceding stage. Further alternatively, a first input terminal of a flip-flop may be connected to an output terminal of another flip-flop via another circuit instead of being connected directly thereto.

The plurality of flip-flops included in the logic circuit of this embodiment do not necessarily have the same structure to each other. Each of the flip-flops may have a different structure in accordance with applications or the like.

Note that the contents of this embodiment or part thereof can be combined freely with the contents of other embodiments or part thereof or the content of Example or part thereof.

Embodiment 7

In this embodiment, examples of transistors included in any of the logic circuits described in Embodiments 1 to 6 will be described. Specifically, described are examples in which a transistor formed using a substrate including a semiconductor material is applied to a p-channel transistor included in the logic circuit, and a transistor formed using an oxide semiconductor is applied to an n-channel transistor included in the logic circuit.

Structural Example

Figure 11:
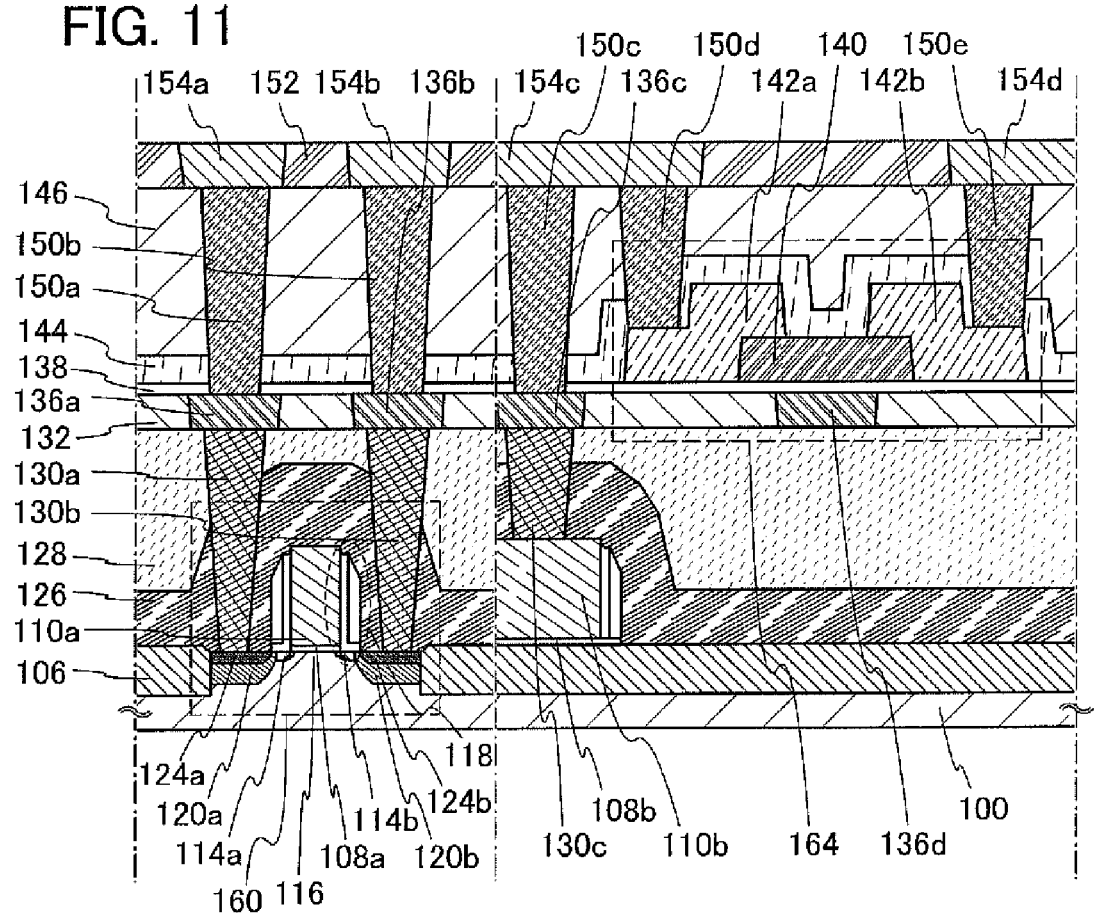
FIG. 11 is a cross-sectional view illustrating a structural example of a p-channel transistor and an n-channel transistor described in Embodiment 7.

A p-channel transistor and an n-channel transistor included in the logic circuit of this embodiment are shown in FIG. 11.

A p-channel transistor 160 illustrated in FIG. 11 includes a channel formation region 116 provided over a substrate 100 including a semiconductor material, a pair of impurity regions (specifically, a pair of impurity regions 114a and 114b and a pair of high concentration impurity regions 120a and 120b) between which the channel formation region 116 is interposed, a gate insulating layer 108a provided over the channel formation region 116, a gate electrode layer 110a provided over the gate insulating layer 108a, a source electrode layer 130a which is electrically connected to the impurity region 114a, and a drain electrode layer 130b which is electrically connected to the impurity region 114b.

Note that sidewall insulating layers 118 are provided on side surfaces of the gate electrode layer 110a. The substrate 100 including a semiconductor material is provided with the pair of high concentration impurity regions 120a and 120b in regions which do not overlap with the sidewall insulating layers 118. The substrate 100 is also provided with a pair of metal compound regions 124a and 124b over the pair of high concentration impurity regions 120a and 120b. Further, element isolation insulating layers 106 are provided over the substrate 100 so that the transistor 160 can be interposed therebetween, and an interlayer insulating layer 126 and an interlayer insulating layer 128 are provided so as to cover the transistor 160. The source electrode layer 130a and the drain electrode layer 130b are electrically connected to the metal compound region 124a and the metal compound region 124b, respectively, through openings formed in the interlayer insulating layer 126 and the interlayer insulating layer 128. That is, the source electrode layer 130a is electrically connected to the high concentration impurity region 120a and the impurity region 114a through the metal compound region 124a, and the drain electrode layer 130b is electrically connected to the high concentration impurity region 120b and the impurity region 114b through the metal compound region 124b.

In addition, as layers below an n-channel transistor 164 described later, an insulating layer 108b formed using the same material from which the gate insulating layer 108a is formed, an electrode layer 110b formed using the same material as the gate electrode layer 110a, and an electrode layer 130c formed using the same material as the source electrode layer 130a and the drain electrode layer 130b are provided.

The n-channel transistor 164 illustrated in FIG. 11 includes a gate electrode layer 136d provided over the interlayer insulating layer 128, a gate insulating layer 138 provided over the gate electrode layer 136d, an oxide semiconductor layer 140 provided over the gate insulating layer 138, and a source electrode layer 142a and a drain electrode layer 142b which are provided over the oxide semiconductor layer 140 and electrically connected to the oxide semiconductor layer 140.

Here, the gate electrode layer 136d is provided so as to be embedded in an insulating layer 132 formed over the interlayer insulating layer 128. In a manner similar to the gate electrode layer 136d, an electrode layer 136a and an electrode layer 136b which are respectively in contact with the source electrode layer 130a and the drain electrode layer 130b included in the p-channel transistor 160 are formed. In addition, an electrode layer 136c in contact with the electrode layer 130c is formed.

Over the transistor 164, a protective insulating layer 144 is provided to be partly in contact with the oxide semiconductor layer 140, and an interlayer insulating layer 146 is provided over the protective insulating layer 144. Here, openings reaching the source electrode layer 142a and the drain electrode layer 142b are provided in the protective insulating layer 144 and the interlayer insulating layer 146. An electrode layer 150d and an electrode layer 150e are formed, which are respectively in contact with the source electrode layer 142a and the drain electrode layer 142b through the openings. In a manner similar to the electrode layer 150d and the electrode layer 150e, an electrode layer 150a, an electrode layer 150b, and an electrode layer 150c are formed, which are respectively in contact with the electrode layer 136a, the electrode layer 136b, and the electrode layer 136c through openings provided in the gate insulating layer 138, the protective insulating layer 144, and the interlayer insulating layer 146.

The oxide semiconductor layer 140 is highly purified by sufficiently removing an impurity such as hydrogen therein. Specifically, the hydrogen concentration of the oxide semiconductor layer 140 is $5 \times 10^{19}$ (atoms/cm$^3$) or lower. Note that the preferable hydrogen concentration of the oxide semiconductor layer 140 is $5 \times 10^{18}$ (atoms/cm$^3$) or lower, and the much preferable concentration is $5 \times 10^{17}$ (atoms/cm$^3$) or lower. When the highly purified oxide semiconductor layer 140 in which the hydrogen concentration is sufficiently reduced is used, the transistor 164 having an excellent off-current characteristic can be obtained. For example, in the case where the drain voltage Vd is +1 V or +10 V and the gate voltage Vg is in the range of −5 V to −20 V, the off current is $1 \times 10^{-13}$ [A] or lower. Applying the highly-purified oxide semiconductor layer 140 in which the hydrogen concentration is sufficiently reduced allows reduction in off current in the transistor 164. The hydrogen concentration in the oxide semiconductor layer 140 is measured by secondary ion mass spectrometry (SIMS).

Further, an insulating layer 152 is provided over the interlayer insulating layer 146, and an electrode layer 154a, an electrode layer 154b, an electrode layer 154c, and an electrode layer 154d are provided so as to be embedded in the insulating layer 152. Note that the electrode layer 154a is in contact with the electrode layer 150a, the electrode layer 154b is in contact with the electrode layer 150b, the electrode layer 154c is in contact with the electrode layer 150c and the electrode layer 150d, and the electrode layer 154d is in contact with the electrode layer 150e.

The source electrode layer 130a in the p-channel transistor 160 of this embodiment is electrically connected to the electrode layers 136a, 150a, and 154a provided in the upper region. Thus, conductive layers for the above-described electrode layers are formed as appropriate, whereby the source electrode layer 130a in the p-channel transistor 160 can be electrically connected to any of electrode layers included in the n-channel transistor 164 provided in the upper region. The drain electrode layer 130b in the p-channel transistor 160 can also be electrically connected to any of electrode layers included in the n-channel transistor 164 provided in the upper region. Although not illustrated in FIG. 11, the gate electrode layer 110a in the p-channel transistor 160 can be electrically connected to any of electrode layers included in the n-channel transistor 164 through an electrode layer provided in the upper region.

Similarly, the source electrode layer 142a in the n-channel transistor 164 of this embodiment is electrically connected to the electrode layers 130c and 110b provided in the lower region. Thus, conductive layers for the above-described electrode layers are formed as appropriate, whereby the source electrode layer 142a in the n-channel transistor 164 can be electrically connected to the gate electrode layer 110a, the source electrode layer 130a, or the drain electrode layer 130b of the p-channel transistor 160. Although not illustrated in FIG. 11, the gate electrode layer 136d or the drain electrode layer 142b in the n-channel transistor 164 can be electrically connected to any of electrode layers included in the p-channel transistor 160 through an electrode layer provided in the lower region.

When a plurality of p-channel transistors 160 and n-channel transistors 164 described above are provided, the logic circuit described in any of Embodiments 1 to 6 can be provided. Not that all n-channel transistors 164 included in the logic circuit are not necessarily to be transistors including an oxide semiconductor, but the n-channel transistors 164 can have different structures depending on characteristics required for each transistor. For example, as an n-channel transistor which needs to operate at high speed, a transistor formed using a substrate including a semiconductor material can be employed, and as an n-channel transistor in which reduction in leakage current is needed, a transistor formed using an oxide semiconductor can be employed.

<Example of Manufacturing Steps>

Next, examples of manufacturing methods of the p-channel transistor 160 and the n-channel transistor 164 are described. Hereinafter, a manufacturing method of the p-channel transistor 160 is described first with reference to FIGS. 12A to 12H, and then, a manufacturing method of the n-channel transistor 164 is described with reference to FIGS. 13A to 13G and FIGS. 14A to 14D.

Figure 12A:
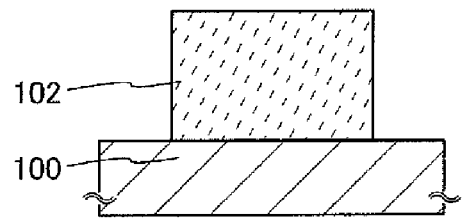
FIGS. 12A to 12H are cross-sectional views illustrating an example of a manufacturing process of a p-channel transistor described in Embodiment 7.

First, the substrate 100 including a semiconductor material is prepared (see FIG. 12A). The substrate 100 including a semiconductor material can be a single crystal semiconductor substrate formed using silicon, silicon carbide, or the like; a polycrystalline semiconductor substrate; a compound semiconductor substrate formed using silicon germanium or the like; an SOI substrate; or the like. Here, an example of the case where a single crystal silicon substrate is used as the substrate 100 including a semiconductor material is described. In general, the term "S01 substrate" means a semiconductor substrate in which a silicon semiconductor layer is provided over an insulating surface. In this specification and the like, the term "SOT substrate" also includes a semiconductor substrate in which a semiconductor layer formed using a material other than silicon is provided over an insulating surface in its category. That is, a semiconductor layer included in the "SOI substrate" is not limited to a silicon semiconductor layer. Further, the "SOI substrate" includes a structure in which a semiconductor layer is formed over an insulating substrate such as a glass substrate with an insulating layer interposed therebetween.

Over the substrate 100, a protective layer 102 serving as a mask for formation of an element isolation insulating layer is formed (see FIG. 12A). As the protective layer 102, for example, an insulating layer formed using silicon oxide, silicon nitride, silicon nitride oxide, or the like can be used. Note that before or after this step, an impurity element imparting n-type conductivity or an impurity element imparting p-type conductivity may be added to the substrate 100 in order to control the threshold voltage of a semiconductor device. In the case where the semiconductor is silicon, the impurity imparting n-type conductivity can be phosphorus, arsenic, or the like. The impurity imparting p-type conductivity can be boron, aluminum, gallium, or the like.

Next, part of the substrate 100 in a region which is not covered with the protective layer 102 (exposed region) is etched with use of the protective layer 102 as a mask. By this etching, an isolated semiconductor region 104 is formed (see FIG. 12B). As the etching, dry etching is preferably performed, but wet etching can be performed. An etching gas and an etchant can be selected as appropriate depending on a material of layers to be etched.

Figure 12B:
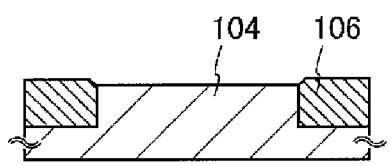

Next, an insulating layer is formed to cover the semiconductor region 104, and the insulating layer in a region overlapping with the semiconductor region 104 is selectively removed, so that the element isolation insulating layers 106 are formed (see FIG. 12B). The insulating layer is formed using silicon oxide, silicon nitride, silicon nitride oxide, or the like. As a removal method of the insulating layer, polishing treatment such as chemical mechanical polishing (CMP), etching treatment, or the like can be given, and any of the above treatment may be used. Note that the protective layer 102 is removed after formation of the semiconductor region 104 or formation of the element isolation insulating layers 106.

Next, an insulating layer is formed over the semiconductor region 104, and a layer including a conductive material is formed over the insulating layer.

The insulating layer serves later as a gate insulating layer, and is formed by CVD method, a sputtering method, or the like to be a single layer of a silicon oxide film, a silicon nitride oxide film, a silicon nitride film, a hafnium oxide film, an aluminum oxide film, a tantalum oxide film, or the like or a stacked layer including any of the above films. Alternatively, the surface of the semiconductor region 104 is oxidized or nitrided by high-density plasma treatment or thermal oxidation treatment, whereby the insulating layer may be formed. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer, but the insulating layer can be formed to have a thickness in the range of larger than or equal to 1 nm and smaller than or equal to 100 nm, for example.

The layer including a conductive material can be formed using a metal material such as aluminum, copper, titanium, tantalum, or tungsten. Alternatively, the layer including a conductive material may be formed using a semiconductor material such as polycrystalline silicon including a conductive material. There is also no particular limitation on the method for forming the layer including a conductive material, and a variety of film formation methods, such as an evaporation method, a CVD method, a sputtering method, or a spin coating method can be employed. Note that the case of forming the layer including a conductive material using a metal material is described in this embodiment.

Figure 12C:
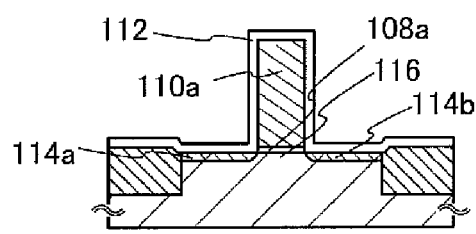

Then, the insulating layer and the layer including a conductive material are selectively etched, so that the gate insulating layer 108a and the gate electrode layer 110a are formed (see FIG. 12C).

Next, an insulating layer 112 covering the gate electrode layer 110a is formed (see FIG. 12C). Then, boron (B), aluminum (Al), or the like is added to the semiconductor region 104, so that the pair of impurity regions 114a and 114b with a shallow junction are formed (see FIG. 12C). Note that although boron or aluminum is added here for formation of a p-channel transistor, in the case of forming an n-channel transistor, an impurity element such as phosphorus (P) or arsenic (As) may be added. Note that by formation of the pair of impurity regions 114a and 114b, the channel formation region 116 is formed in the semiconductor region 104 below the gate insulating layer 108a (see FIG. 12C). Here, the concentrations of the added impurity can be set as appropriate, and the concentrations are preferably set to be high in accordance with high miniaturization of semiconductor elements. Although the pair of impurity regions 114a and 114b are formed after formation of the insulating layer 112 here, the insulating layer 112 may be formed after formation of the pair of impurity regions 114a and 114b.

Figure 12D:
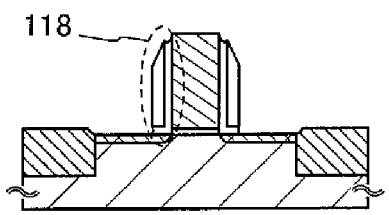
Figure 12E:
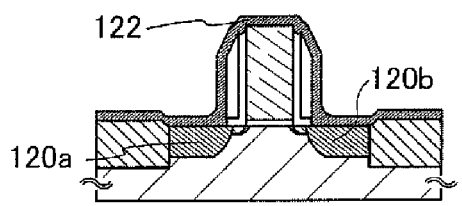
Figure 12F:
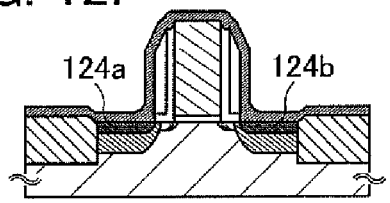

Next, the sidewall insulating layers 118 are formed (see FIG. 12D). An insulating layer is formed so as to cover the insulating layer 112, and highly anisotropic etching treatment is performed on the insulating layer, so that the sidewall insulating layers 118 can be formed in a self-alignment manner. At this time, the insulating layer 112 is partly etched, so that a top surface of the gate electrode layer 110a and top surfaces of the impurity regions 114a and 114b may be exposed.

Next, an insulating layer is formed to cover the gate electrode layer 110a, the pair of impurity regions 114a and 114b, the sidewall insulating layers 118, and the like. Then, boron (B), aluminum (Al), or the like is added to part of the impurity regions 114a and 114b, so that the pair of high concentration impurity regions 120a and 120b are formed (see FIG. 12E). Here, in the case of forming an n-channel transistor, an impurity element such as phosphorus (P) or arsenic (As) may be added. After that, the insulating layer is removed, and a metal layer 122 is formed to cover the gate electrode layer 110a, the sidewall insulating layers 118, the pair of high concentration impurity regions 120a and 120b, and the like (see FIG. 12E). The metal layer 122 can be formed by a variety of film formation methods, such as a vacuum evaporation method, a sputtering method, or a spin coating method. It is preferable that the metal layer 122 be formed using a metal material that reacts with a semiconductor material included in the semiconductor region 104 to be a metal compound having low resistance. Examples of such metal materials include titanium, tantalum, tungsten, nickel, cobalt, and platinum.

Next, heat treatment is performed, so that the metal layer 122 reacts with the semiconductor material. By this heat treatment, the pair of metal compound regions 124a and 124b in contact with the pair of high concentration impurity regions 120a and 120b are formed (see FIG. 12F). In the case where polycrystalline silicon or the like is used for the gate electrode layer 110a, a portion of the gate electrode layer 110a which is in contact with the metal layer 122 also becomes a metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the metal compound region is formed by reaction of the metal material and the semiconductor material, which is a region having sufficiently increased conductivity. The formation of the metal compound regions can properly reduce electric resistance and improve element characteristics. Note that the metal layer 122 is removed after the pair of metal compound regions 124a and 124b are formed.

Figure 12G:
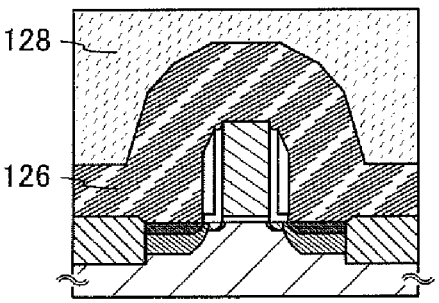

Next, the interlayer insulating layer 126 and the interlayer insulating layer 128 are formed so as to cover the components formed in the above steps (see FIG. 12G). The interlayer insulating layers 126 and 128 can be formed using a material including an inorganic insulating material, such as silicon oxide, silicon nitride oxide, silicon nitride, hafnium oxide, aluminum oxide, or tantalum oxide. Alternatively, an organic insulating material such as polyimide or acrylic can be used. Although the interlayer insulating layer here has a structure including two layers of the interlayer insulating layer 126 and the interlayer insulating layer 128, the structure of the interlayer insulating layer is not limited thereto. After formation of the interlayer insulating layer 128, a surface is preferably planarized by CMP treatment, etching treatment, or the like.

Figure 12H:
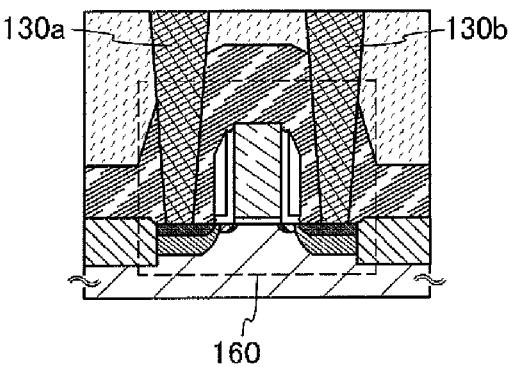

After that, openings reaching the pair of metal compound regions 124a and 124b are formed in the interlayer insulating layers, and the source electrode layer 130a and the drain electrode layer 130b are formed in the openings (see FIG. 12H). A conductive layer is formed by a PVD method, a CVD method, or the like in a region including the openings, and part of the conductive layer is removed by etching treatment or CMP treatment, so that the source electrode layer 130a and the drain electrode layer 130b can be formed.

It is preferable that the source electrode layer 130a and the drain electrode layer 130b be formed to have a planar surface. For example, after a thin film of a titanium film or a titanium nitride film is formed in a region including the openings, a tungsten film is formed to fill the openings. In that case, unnecessary tungsten and unnecessary titanium or titanium nitride is removed by CMP treatment, and planarity of the surface can be improved. In such a manner, the surface including the source electrode layer 130a and the drain electrode layer 130b is planarized, whereby an electrode, a wiring, an insulating layer, a semiconductor layer, or the like can be preferably formed in the later step.

Note that here, only the source electrode layer 130a and the drain electrode layer 130b which are in contact with the metal compound regions 124a and 124b are illustrated; however, an electrode layer serving as a wiring (e.g., the electrode layer 130c in FIG. 11) or the like can be formed together in this step. There is no particular limitation on a material for forming the source electrode layer 130a and the drain electrode layer 130b, and a variety of conductive materials can be used. For example, a conductive material such as molybdenum, titanium, chromium, tantalum, tungsten, aluminum, copper, neodymium, or scandium can be used.

Through the above steps, the p-channel transistor 160 with the substrate 100 including a semiconductor material is completed. After the above steps, an electrode, a wiring, an insulating layer, or the like may be further formed. When the wiring has a multilayer wiring structure which is a stacked structure including an interlayer insulating layer and a conductive layer, a highly-integrated logic circuit can be provided. Further, by a step similar to the above steps, an n-channel transistor with the substrate 100 including a semiconductor material can be formed. That is, by using an impurity element such as phosphorus (P) or arsenic (As) as the impurity element added to the semiconductor region in the above step, an n-channel transistor can be formed.

Next, a manufacturing process of the n-channel transistor 164 over the interlayer insulating layer 128 is described with reference to FIGS. 13A to 13G and FIGS. 14A to 14D. Note that FIGS. 13A to 13G and FIGS. 14A to 14D illustrate a manufacturing process of various electrode layers, the n-channel transistor 164, and the like over the interlayer insulating layer 128; accordingly, the p-channel transistor 160 and the like provided below the n-channel transistor 164 are omitted.

First, the insulating layer 132 is formed over the interlayer insulating layer 128, the source electrode layer 130a, the drain electrode layer 130b, and the electrode layer 130c (see FIG. 13A). The insulating layer 132 can be formed by a PVD method, a CVD method, or the like. The insulating layer 132 can be formed using a material including an inorganic insulating material such as silicon oxide, silicon nitride oxide, silicon nitride, hafnium oxide, aluminum oxide, or tantalum oxide.

Next, openings reaching the source electrode layer 130a, the drain electrode layer 130b, and the electrode layer 130c are formed in the insulating layer 132. At this time, an opening is formed also in a region where the gate electrode layer 136d is formed later. A conductive layer 134 is formed so as to fill the openings (FIG. 13B). The openings can be formed by a method such as etching with use of a mask or the like. The mask can be formed by a method such as exposure with use of a photomask or the like. Either wet etching or dry etching can be used as the etching; in view of microfabrication, dry etching is preferable. The conductive layer 134 can be formed by a film formation method of a PVD method, a CVD method, or the like. A material used for formation of the conductive layer 134 can be a conductive material such as molybdenum, titanium, chromium, tantalum, tungsten, aluminum, copper, neodymium, or scandium, an alloy thereof, a compound such as nitride including the above material, or the like.

More specifically, a method can be employed as an example, in which: a thin film of titanium is formed by a PVD method in a region including the openings; a thin film of nitride titanium is formed by a CVD method; and a tungsten film is formed to fill the openings. Here, the titanium film formed by a PVD method has a function to deoxidize an oxide film at an interface so as to reduce contact resistance with the lower electrode layers (here, the source electrode layer 130a, the drain electrode layer 130b, the electrode layer 130c, and the like). The titanium nitride film formed after that has a barrier function to suppress diffusion of a conductive material. Further, after the barrier film of titanium, titanium nitride, or the like is formed, a copper film may be formed by a plating method.

After the conductive layer 134 is formed, part of the conductive layer 134 is removed by etching treatment, CMP treatment, or the like, so that the insulating layer 132 is exposed; accordingly, the electrode layer 136a, the electrode layer 136b, the electrode layer 136c, and the gate electrode layer 136d are formed (see FIG. 13C). Note that when the electrode layer 136a, the electrode layer 136b, the electrode layer 136c, and the gate electrode layer 136d are formed by removing part of the conductive layer 134, it is preferable that a planar surface be formed. By planarizing the surfaces of the insulating layer 132, the electrode layer 136a, the electrode layer 136b, the electrode layer 136c, and the gate electrode layer 136d, an electrode, a wiring, an insulating layer, a semiconductor layer, or the like can be preferably formed in the later step.

Next, the gate insulating layer 138 is formed to cover the insulating layer 132, the electrode layer 136a, the electrode layer 136b, the electrode layer 136c, and the gate electrode layer 136d (see FIG. 13D). The gate insulating layer 138 can be formed by a CVD method, a sputtering method, or the like. Further, the gate insulating layer 138 is preferably formed to include silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 can be formed using silicon oxynitirde by a plasma CVD method in which silane ($SiH_4$), oxygen, and nitride are used as a source gas. There is no particular limitation on the thickness of the gate insulating layer 138, but it can be formed to a thickness larger than or equal to 10 nm and smaller than or equal to 500 nm, for example. In the case of a stacked-layer structure, a preferable structure includes a first gate insulating layer with a thickness larger than or equal to 50 nm and smaller than or equal to 200 nm and a second gate insulating layer with a thickness larger than or equal to 5 nm and smaller than or equal to 300 nm thereover.

An i-type or substantially i-type oxide semiconductor achieved by removal of impurities (a highly-purified oxide semiconductor) is extremely sensitive to interface state density or interface charge. Therefore, an interface between an oxide semiconductor layer and a gate insulating layer is an important factor in the case where such an oxide semiconductor is used for the oxide semiconductor layer. In other words, the gate insulating layer 138 which is in contact with the highly-purified oxide semiconductor layer needs to be of high quality.

For example, high-density plasma CVD using μ waves (2.45 GHz) is preferable in that it produces a dense and high-quality gate insulating layer 138 with high withstand voltage. This is because a close contact between a highly-purified oxide semiconductor layer and a high-quality gate insulating layer reduces interface state density and produces desirable interface characteristics.

Needless to say, even when a highly-purified oxide semiconductor layer is used, another method such as a sputtering method or a plasma CVD method is applicable if a high-quality insulating layer can be used as a gate insulating layer. An insulating layer whose film quality or interface characteristic is modified by heat treatment after film formation may be employed. In any case, the gate insulating layer 138 may employ a layer whose film quality is preferable and interface state density of an interface with the oxide semiconductor layer is reduced to form an excellent interface.

Further, when the bias temperature test (BT test) at 85° C. for 12 hours with $2\times10^6$ V/cm is performed in the case where an oxide semiconductor includes an impurity, a bond between the impurity and the main component of the oxide semiconductor is cut by a strong electric field (B: bias) and a high temperature (T: temperature), and a generated dangling bond induces a shift in the threshold voltage (Vth).

On the other hand, when an impurity in an oxide semiconductor, especially hydrogen, water, or the like is removed as much as possible so that an interface with the gate insulating layer can have preferable characteristics, a transistor which is stable to the BT test can be obtained.

Next, an oxide semiconductor layer is formed over the gate insulating layer 138 and processed by a method such as etching using a mask, whereby the island-shaped oxide semiconductor layer 140 is formed (see FIG. 13E).

As the oxide semiconductor layer, an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer is used. In particular, an amorphous oxide semiconductor layer is preferable. In this embodiment, an amorphous oxide semiconductor layer is formed as the oxide semiconductor layer by a sputtering method with use of an In—Ga—Zn—O-based metal oxide target. The addition of silicon to an amorphous oxide semiconductor layer suppress the crystallization of the layer; therefore, the oxide semiconductor layer may be formed using a target containing $SiO_2$ at 2 wt % to 10 wt % inclusive.

As a target for forming the oxide semiconductor layer by a sputtering method, a metal oxide target containing zinc oxide as a main component can be used, for example. Alternatively, a metal oxide target containing In, Ga, and Zn (a composition ratio is $In_2O_3$:$Ga_2O_3$:ZnO=1:1:1 [molar ratio], In:Ga:Zn=1:1:0.5 [atomic ratio]) can be used. As the metal oxide target containing In, Ga, and Zn, a target having a composition ratio of In:Ga:Zn=1:1:1 [atomic ratio] or a target having a composition ratio of In:Ga:Zn=1:1:2 [atomic ratio] can also be used. The filling factor of the metal oxide target is from 90% to 100% inclusive, and preferably 95% or higher (e.g., 99.9%). With use of a metal oxide target with high filling factor, an oxide semiconductor layer which is a dense film can be formed.

A preferable atmosphere for formation of the oxide semiconductor layer is a rare gas (typically argon) atmosphere, an oxygen atmosphere, or a mixed atmosphere of a rare gas (typically argon) and oxygen. Specifically, a high-purity gas is preferably used, in which an impurity such as hydrogen, water, hydroxyl, or hydride is reduced to approximately several parts per million (ppm) (preferably approximately several parts per billion (ppb)).

In formation of the oxide semiconductor layer, the substrate is set in a chamber at reduced pressure and the substrate temperature is set at 100° C. to 600° C. inclusive, preferably 200° C. to 400° C. inclusive. Depositing while heating the substrate can reduce the concentration of impurity in the oxide semiconductor layer. In addition, damage by sputtering can be reduced. Then, a sputtering gas from which hydrogen and moisture are removed is introduced into the treatment chamber from which remaining moisture is being removed, and an oxide semiconductor layer is deposited over the substrate with use of a metal oxide as a target. In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a hydrogen atom, a compound containing a hydrogen atom such as water ($H_2O$) (further preferably, a compound containing a carbon atom), and the like are removed, whereby the impurity concentration in the oxide semiconductor layer formed in the treatment chamber can be reduced.

As an example of a deposition condition, the distance between the substrate and the target is 100 mm, the pressure is 0.6 Pa, the direct current (DC) power supply is 0.5 kW, and an atmosphere of deposition is an oxygen (the proportion of oxygen flow is 100%) atmosphere. Note that a pulsed direct current (DC) power supply is preferably used because powder substances (also referred to as particles or dust) generated in film deposition can be reduced and the film thickness can be uniform. The thickness of the oxide semiconductor layer is 2 nm to 200 nm inclusive, preferably 5 nm to 30 nm inclusive. Note that an appropriate thickness differs depending on an oxide semiconductor material, and the thickness may be set as appropriate depending on the material.

Note that before the oxide semiconductor layer is formed by a sputtering method, dust on a surface of the gate insulating layer 138 is preferably removed by reverse sputtering in which an argon gas is introduced and plasma is generated. The reverse sputtering refers to a method in which instead of making ions collide to a sputtering target in general spurting, ions are made to collide to a surface to be treated so that the surface is modified. A method for making ions collide to a surface to be treated includes a method in which high frequency voltage is applied on the surface in an argon atmosphere and plasma is generated in the vicinity of the substrate. Note that a nitrogen atmosphere, a helium atmosphere, an oxygen atmosphere, or the like may be used instead of an argon atmosphere.

The etching of the oxide semiconductor layer can be either dry etching or wet etching. Needless to say, both dry etching and wet etching can be combined and used. Etching conditions (such as etching gas, etchant, etching time, and temperature) are appropriately adjusted in accordance with the material, so that the oxide semiconductor layer can be processed into the desired shape.

For example, a gas containing chlorine (a chlorine-based gas such as chlorine ($Cl_2$), boron chloride ($BCl_3$), tetrasilicon chloride (SiCL), or carbon tetrachloride ($CCl_4$)) can be employed as an etching gas used for the dry etching. Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layer into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, an etchant such as ITO-07N (produced by KANTO CHEMICAL CO., INC.) may be used.

Next, first heat treatment is preferably performed on the oxide semiconductor layer. By the first heat treatment, the oxide semiconductor layer can be dehydrated or dehydrogenated. The temperature of the first heat treatment is higher than or equal to 300° C. and lower than or equal to 750° C., preferably higher than or equal to 400° C. and lower than a strain point of the substrate. For example, the substrate is introduced into an electric furnace using a resistance heating element or the like, and the oxide semiconductor layer 140 is subjected to heat treatment at 450° C. for one hour in a nitrogen atmosphere. During the heat treatment, the oxide semiconductor layer 140 is not exposed to air to prevent entry of water or hydrogen.

Note that a heat treatment apparatus is not limited to an electrical furnace, and may be an apparatus which heats an object to be processed with heat conduction or heat radiation given by a medium such as a heated gas or the like. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and transferred and taken out from the heated inert gas. With GRTA, high-temperature heat treatment for a short period of time can be achieved. Further, GRTA is heat treatment for a short period of time; therefore, it can be employed even under a temperature condition which is higher than a strain point of the substrate.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurity is less than or equal to 1 ppm, preferably less than or equal to 0.1 ppm).

Depending on conditions of the first heat treatment or a material of the oxide semiconductor layer, the oxide semiconductor layer is crystallized and to be a microcrystalline film or a polycrystalline film in some cases. For example, the oxide semiconductor layers may crystallize to become microcrystalline semiconductor layers having a degree of crystallization of 90% or more, or 80% or more. Further, depending on the conditions of the first heat treatment and the material of the oxide semiconductor layer, the oxide semiconductor layer becomes an amorphous oxide semiconductor layer containing no crystalline component in other cases.

The oxide semiconductor layer might become an oxide semiconductor layer in which a microcrystalline portion (with a grain diameter greater than or equal to 1 nm and less than or equal to 20 nm, typically greater than or equal to 2 nm and less than or equal to 4 nm) exits in an amorphous oxide semiconductor (for example, a surface of the oxide semiconductor layer).

Further, when microcrystal is aligned in amorphous, electric characteristics of the oxide semiconductor layer can be changed. For example, in the case where the oxide semiconductor layer is formed using an In—Ga—Zn—O-based metal oxide target, a microcrystalline portion where crystal grains of $In_2Ga_2ZnO_7$ having electrical anisotropy are aligned is formed, whereby the electric characteristics of the oxide semiconductor layer can be changed.

More specifically, by aligning crystal grains of $In_2Ga_2ZnO_7$ whose c-axis is in the direction perpendicular to a surface of the oxide semiconductor layer, conductivity in the direction parallel to the surface of the oxide semiconductor layer can be increased, and an insulating property in the direction perpendicular to the surface of the oxide semiconductor layer can be increased. Further, such a microcrystalline portion has a function of preventing an impurity such as water or hydrogen from entering the oxide semiconductor layer.

Note that the oxide semiconductor layer including the above-described microcrystalline portion can be obtained by heating a surface of the oxide semiconductor layer by GRTA. The use of a sputtering target that contains more In or Ga than Zn enables a much preferable oxide semiconductor layer to be formed.

The first heat treatment may be performed on the oxide semiconductor layer which has not been processed into the island-shaped oxide semiconductor layer 140. In that case, after the first heat treatment, the substrate is taken out from the heating apparatus and a photolithography step is performed.

Note that the first heat treatment can also be called dehydration treatment or dehydrogenation treatment because it is effective in dehydrating or dehydrogenating the oxide semiconductor layer 140. It is possible to perform such dehydration treatment or dehydrogenation treatment after forming the oxide semiconductor layer, after stacking source and drain electrode layers over the oxide semiconductor layer 140, or after forming a protective insulating layer over the source and drain electrode layers. Such dehydration treatment or dehydrogenation treatment may be conducted more than once.

Next, the source electrode layer 142a and the drain electrode layer 142b are formed so as to be in contact with the oxide semiconductor layer 140 (see FIG. 13F). A conductive layer is formed to cover the oxide semiconductor layer 140 and then partly etched, so that the source electrode layer 142a and the drain electrode layer 142b can be formed.

The conductive layer can be formed by a CVD method such as a plasma CVD method or a PVD method including sputtering. Examples of the material for the conductive layer include an element selected from aluminum, chromium, copper, tantalum, titanium, molybdenum, and tungsten; and an alloy including any of these elements as a component. Alternatively, one or more of materials selected from manganese, magnesium, zirconium, beryllium, and thorium may be alternatively used. Further alternatively, aluminum combined with one or more of elements selected from titanium, tantalum, tungsten, molybdenum, chromium, neodymium, and scandium may be used as the material. The conductive layer may have either a single-layer structure or a staked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

Here, ultraviolet rays, a KrF laser beam, or an ArF laser beam is preferably used for exposures for making an etching mask.

The channel length (L) of the transistor is determined by the distance between the bottom portion of the source electrode layer 142a and the bottom portion of the drain electrode layer 142b. In the case where the channel length (L) is shorter than 25 nm, exposure for making a mask is performed with use of extreme ultraviolet with extremely short wavelengths of several nanometers to several tens of nanometers. Exposure with extreme ultraviolet yields high resolution and a great depth of focus. Therefore, the channel length (L) of a transistor, which is formed later, can be from 10 nm to 1000 nm inclusive, and thus the operation rate of the circuit can be increased.

The materials for the conductive layer and the oxide semiconductor layer 140 and etching conditions are adjusted as appropriate so that the oxide semiconductor layer is not removed in etching of the conductive layer. In this step, the oxide semiconductor layer 140 is partly etched to be an oxide semiconductor layer having a groove (a depressed portion) depending on the materials and the etching conditions.

An oxide conductive layer may be formed between the oxide semiconductor layer 140 and the source electrode layer 142a or between the oxide semiconductor layer 140 and the drain electrode layer 142b. It is possible to successively form the oxide conductive layer and a metal layer which is to be the source electrode layer 142a or the drain electrode layer 142b (successive deposition). The oxide conductive layer can function as a source region or a drain region. Such an oxide conductive layer leads to the reduction in the resistance of the source region or a drain region, and thus high-speed operation of the transistor is achieved.

In order to reduce the number of the masks used or the number of steps, a resist mask is formed with use of a multi-tone mask which is a light-exposure mask through which light is transmitted to have a plurality of intensities, and etching may be performed with use of the resist mask. Since a resist mask formed using a multi-tone mask has a plurality of thicknesses (step-like shape) and can be further changed in shape by performing ashing, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can also be reduced, whereby simplification of steps can be realized.

Note that plasma treatment using a gas such as $N_2O$, $N_2$, or Ar is preferably conducted after the above process. The plasma treatment removes water or the like that adheres to an exposed surface of the oxide semiconductor layer. In the plasma treatment, a mixed gas of oxygen and argon may be used.

Next, the protective insulating layer 144 which is in contact with part of the oxide semiconductor layer 140 is formed without being exposed to air (see FIG. 13G).

The protective insulating layer 144 can be formed using as appropriate a method, such as a sputtering method, by which an impurity such as water or hydrogen is prevented from entering the protective insulating layer 144. The thickness of the protective insulating layer 144 is at least 1 nm or larger. Examples of the material for the protective insulating layer 144 include silicon oxide, silicon nitride, silicon oxynitride, and silicon nitride oxide. A structure can be either a single-layer structure or a stacked-layer structure. The substrate temperature for the deposition of the protective insulating layer 144 is preferably higher than or equal to room temperature and lower than or equal to 300° C. The atmosphere for the deposition is preferably a rare gas (typically argon) atmosphere, an oxygen atmosphere, or a mixed atmosphere of a rare gas (typically argon) and oxygen.

When hydrogen is contained in the protective insulating layer 144, entry of the hydrogen to the oxide semiconductor layer 140 or extraction of oxygen in the oxide semiconductor layer 140 by the hydrogen is caused, thereby making the resistance on the backchannel side of the oxide semiconductor layer 140 low, so that a parasitic channel may be formed. Therefore, it is important that a film formation method in which hydrogen is not used be employed in order to form the protective insulating layer 144 containing as little hydrogen as possible.

It is preferable to form the protective insulating layer 144 while removing moisture remaining in the treatment chamber, in order to prevent hydrogen, hydroxyl, or moisture from being entered into the oxide semiconductor layer 140 and the protective insulating layer 144.

In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a hydrogen atom, a compound containing a hydrogen atom such as water ($H_2O$), and the like are removed, whereby the impurity concentration in the protective insulating layer 144 formed in the treatment chamber can be reduced.

A sputtering gas used for the deposition of the protective insulating layer 144 is preferably a high-purity gas in which the concentration of an impurity such as hydrogen, water, hydroxyl, or hydride is reduced to approximately several parts per million (ppm) (preferably approximately several parts per billion (ppb)).

Next, second heat treatment is preferably performed in an inert gas atmosphere or oxygen gas atmosphere (preferably at from 200° C. to 400° C. inclusive, e.g. 250° C. to 350° C. inclusive). For example, the second heat treatment is performed in a nitrogen atmosphere at 250° C. for one hour. The second heat treatment can reduce variations in electric characteristics of transistors.

Further, heat treatment may be performed at 100° C. to 200° C. inclusive for from one hour to 30 hours in air. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed before formation of the protective insulating layer under reduced pressure. Under reduced pressure, the heating time can be shortened. Note that this heat treatment may be performed instead of the second heat treatment or performed before and after the second heat treatment.

Next, the interlayer insulating layer 146 is formed over the protective insulating layer 144 (see FIG. 14A). The interlayer insulating layer 146 can be formed by a PVD method, a CVD method, or the like. The interlayer insulating layer 146 can be formed using a material including an inorganic insulating material, such as silicon oxide, silicon nitride oxide, silicon nitride, hafnium oxide, aluminum oxide, or tantalum oxide. After formation of the interlayer insulating layer 146, it is preferable that a surface be planarized by CMP, etching, or the like.

Next, openings reaching the electrode layer 136a, the electrode layer 136b, the electrode layer 136c, the source electrode layer 142a, and the drain electrode layer 142b are formed in the interlayer insulating layer 146, the protective insulating layer 144, and the gate insulating layer 138. Then, a conductive layer 148 is formed so as to fill the openings (see FIG. 14B). The openings can be formed by etching using a mask. The mask can be made by exposures with use of a photomask, for example. Either wet etching or dry etching can be used as the etching; in view of microfabrication, dry etching is preferably used. The conductive layer 148 can be formed by a deposition method such as a PVD method or a CVD method. Examples of the material for the conductive layer 148 include a conductive material such as molybdenum, titanium, chromium, tantalum, tungsten, aluminum, copper, neodymium, and scandium; and an alloy and compound (e.g., nitride) of any of these materials.

Specifically, as an example, a method can be employed in which: a thin film of titanium is formed by a PVD method in a region including the openings; a thin film of nitride titanium is formed by a CVD method; and a tungsten film is formed to fill the openings. Here, the titanium film formed by a PVD method deoxidizes an oxide film at an interface so as to reduce contact resistance with the lower electrode layers (here, the electrode layer 136a, the electrode layer 136b, the electrode layer 136c, the source electrode layer 142a, and the drain electrode layer 142b). The titanium nitride film formed after that has a barrier function to suppress diffusion of a conductive material. Further, after the barrier film of titanium, titanium nitride, or the like is formed, a copper film may be formed by a plating method.

After the conductive layer 148 is formed, part of the conductive layer 148 is removed by etching, CMP, or the like, and the interlayer insulating layer 146 is thus exposed, thereby forming the electrode layer 150a, the electrode layer 150b, the electrode layer 150c, the electrode layer 150d, and the electrode layer 150e (see FIG. 14C). Note that when the electrode layer 150a, the electrode layer 150b, the electrode layer 150c, the electrode layer 150d, and the electrode layer 150e are formed by removing part of the conductive layer 148, it is preferable that a planar surface be formed. By planarizing the surface of the interlayer insulating layer 146, the electrode layer 150a, the electrode layer 150b, the electrode layer 150c, the electrode layer 150d, and the electrode layer 150e, an electrode, a wiring, an insulating layer, a semiconductor layer, or the like can be preferably formed in the later step.

Further, the insulating layer 152 is formed, and openings reaching the electrode layer 150a, the electrode layer 150b, the electrode layer 150c, the electrode layer 150d, and the electrode layer 150e are formed in the insulating layer 152. Then, a conductive layer is formed so as to fill the openings. After that, part of the conductive layer is removed by etching, CMP, or the like, and the insulating layer 152 is thus exposed, thereby forming an electrode layer 154a, an electrode layer 154b, an electrode layer 154c, and an electrode layer 154d (see FIG. 14D). This process is similar to the process for formation of the electrode layer 150a and the like; thus, detailed description is omitted.

When the n-channel transistor 164 is formed in the above manner, the hydrogen concentration of the oxide semiconductor layer 140 is $5 \times 10^{19}$ (atoms/cm$^3$) or lower, and the off-state current of the n-channel transistor 164 is $1 \times 10^{-13}$ [A] or lower. Such an n-channel transistor 164 having excellent characteristics is used in the logic circuits described in Embodiments 1 to 6, whereby reduction in standby power and suppress of malfunction of the logic circuit can be achieved.

Modification Example

FIG. 15, FIGS. 16A and 16B, FIGS. 17A and 17B, and FIGS. 18A and 18B illustrate modification examples of structures of the n-channel transistor 164. Each structure of the transistor 160 illustrated in FIG. 15, FIGS. 16A and 16B, FIGS. 17A and 17B, and FIGS. 18A and 18B is the same as that in FIG. 11.

Figure 15:
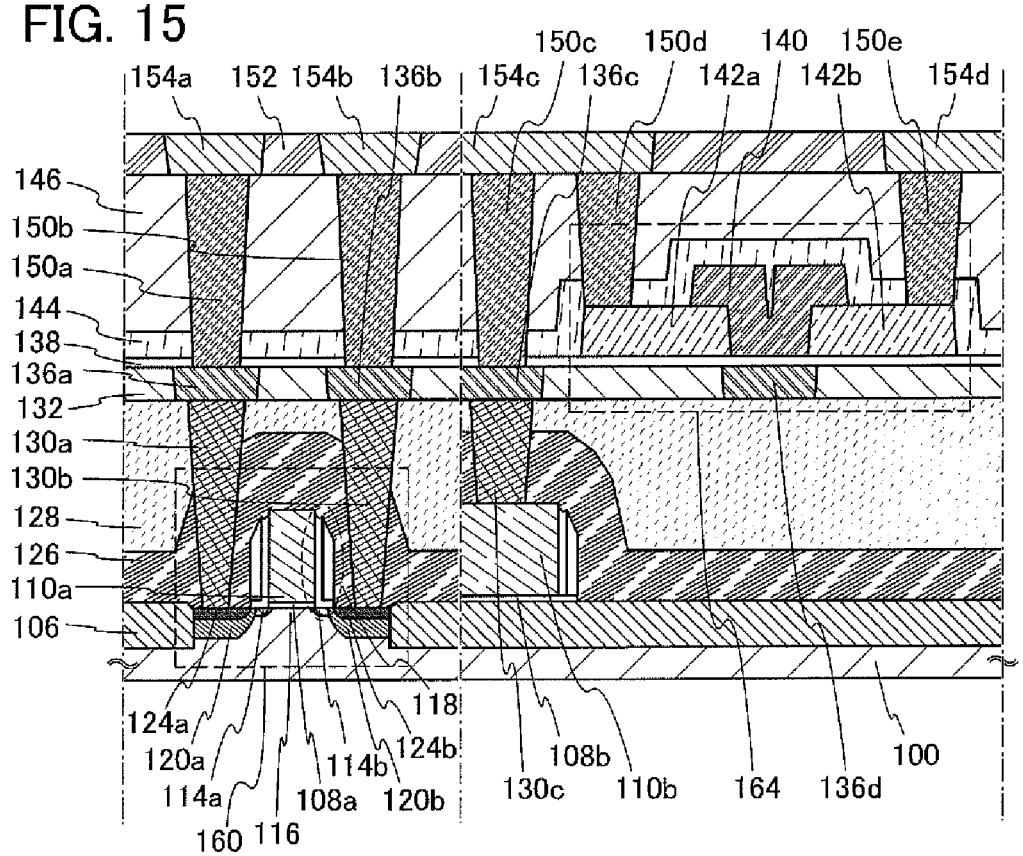
FIG. 15 is a cross-sectional view illustrating a structural example of a p-channel transistor and an n-channel transistor described in Embodiment 7.

FIG. 15 illustrates an example of the n-channel transistor 164 having a structure in which the gate electrode layer 136d is placed below the oxide semiconductor layer 140 and end portions of the source electrode layer 142a and the drain electrode layer 142b are in contact with the oxide semiconductor layer 140.

A big difference between the structure in FIG. 11 and the structure in FIG. 15 is the position at which the oxide semiconductor layer 140 is connected to the source and drain electrode layers 142a and 142b. That is, a top surface of the oxide semiconductor layer 140 is in contact with the source and drain electrode layers 142a and 142b in the structure in FIG. 11, whereas the bottom surface of the oxide semiconductor layer 140 is in contact with the source and drain electrode layers 142a and 142b in the structure in FIG. 15. Moreover, the difference in the contact position results in a different arrangement of other electrodes, an insulating layer, and the like. The details of each component are the same as those of FIG. 11.

Specifically, the n-channel transistor 164 illustrated in FIG. 15 includes the gate electrode layer 136d provided over the interlayer insulating layer 128, the gate insulating layer 138 provided over the gate electrode layer 136d, the source and drain electrode layers 142a and 142b provided over the gate insulating layer 138, and the oxide semiconductor layer 140 in contact with top surfaces of the source and drain electrode layers 142a and 142b. In addition, over the n-channel transistor 164, the protective insulating layer 144 is provided so as to cover the oxide semiconductor layer 140.

Figure 16A:
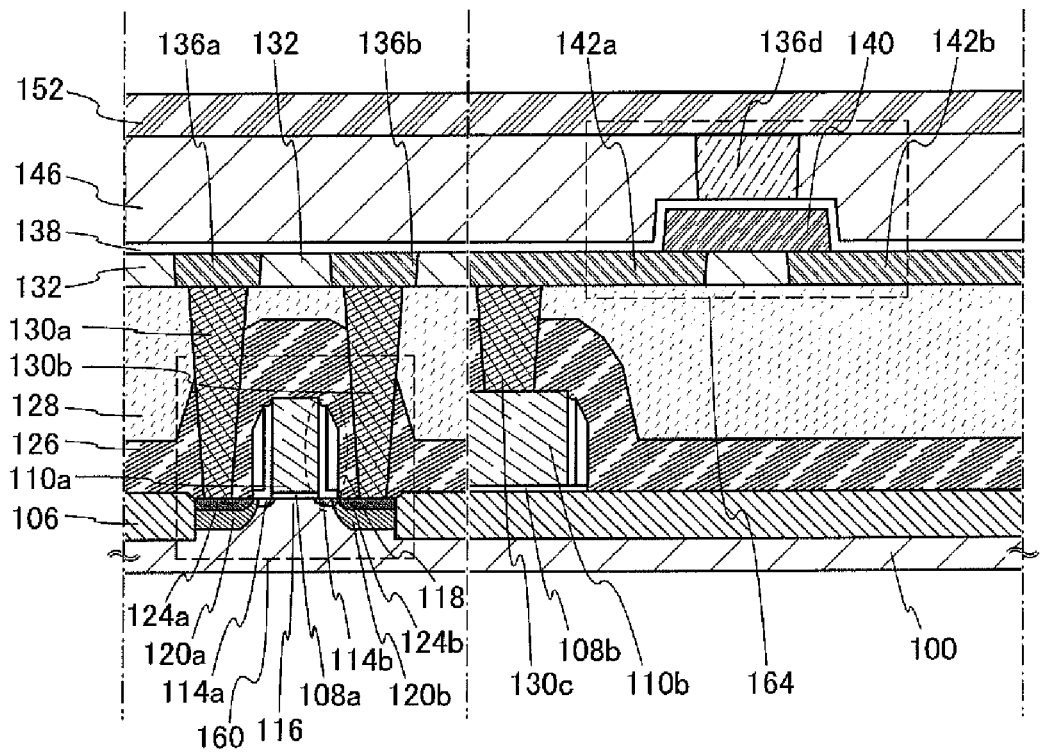
FIGS. 16A and 16B are cross-sectional views each illustrating a structural example of a p-channel transistor and an n-channel transistor described in Embodiment 7.
Figure 16B:
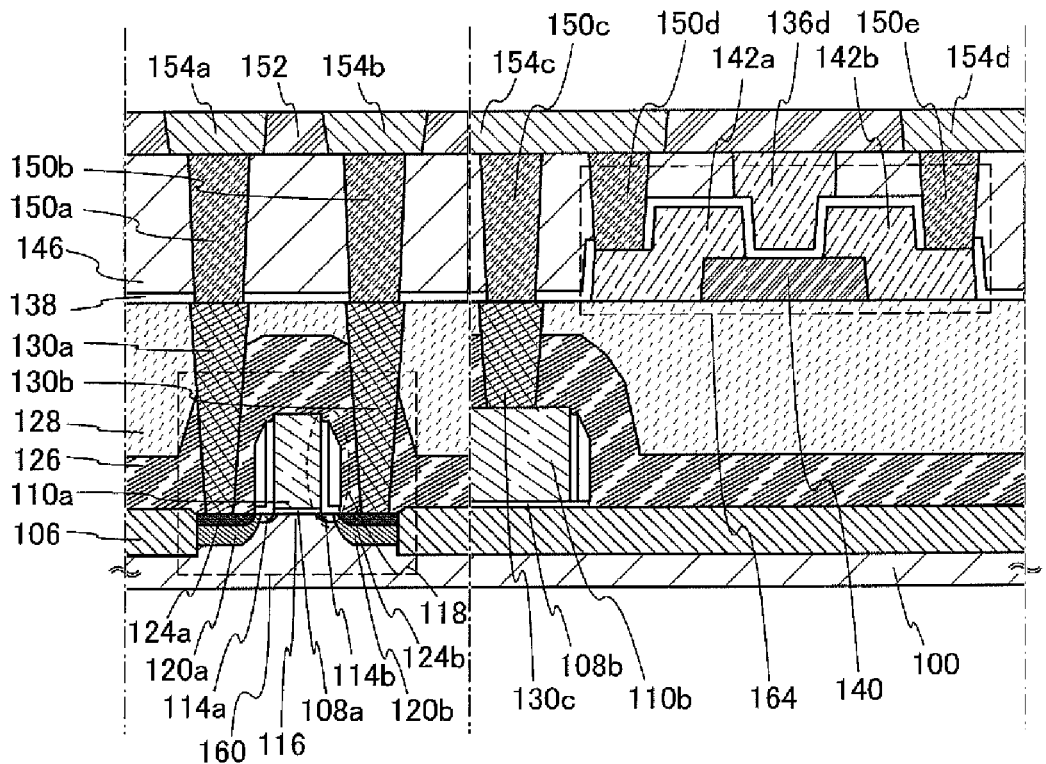

FIGS. 16A and 16B each illustrate an n-channel transistor 164 in which the gate electrode layer 136d is provided over the oxide semiconductor layer 140. FIG. 16A illustrates an example of a structure in which the source and drain electrode layers 142a and 142b are in contact with a bottom surface of the oxide semiconductor layer 140. FIG. 16B illustrates an example of a structure in which the source and drain electrode layers 142a and 142b are in contact with a top surface of the oxide semiconductor layer 140.

A big difference of the structures in FIGS. 16A and 16B from those in FIG. 11 and FIG. 15 is that the gate electrode layer 136d is placed over the oxide semiconductor layer 140. Furthermore, a big difference between the structure in FIG. 16A and the structure in FIG. 16B is that the source and drain electrode layers 142a and 142b are in contact with either the bottom surface or the top surface of the oxide semiconductor layer 140. Moreover, these differences result in a different arrangement of other electrodes, an insulating layer, and the like. The details of each component are the same as those of FIG. 11, and the like.

Specifically, the n-channel transistor 164 illustrated in FIG. 16A includes the source and drain electrode layers 142a and 142b provided over the interlayer insulating layer 128, the oxide semiconductor layer 140 in contact with top surfaces of the source and drain electrode layers 142a and 142b, the gate insulating layer 138 provided over the oxide semiconductor layer 140, and the gate electrode layer 136d over the gate insulating layer 138 in a region overlapping with the oxide semiconductor layer 140.

The n-channel transistor 164 illustrated in FIG. 16B includes the oxide semiconductor layer 140 provided over the interlayer insulating layer 128, the source and drain electrode layers 142a and 142b provided to be in contact with a top surface of the oxide semiconductor layer 140, the gate insulating layer 138 provided over the oxide semiconductor layer 140 and the source and drain electrode layers 142a and 142b, and the gate electrode layer 136d provided over the gate insulating layer 138 and in a region overlapping with the oxide semiconductor layer 140.

Note that in the structures in FIGS. 16A and 16B, a component (e.g., the electrode layer 150a or the electrode layer 154a) is sometimes omitted from the structure in FIG. 11 or the like. In this case, a secondary effect such as simplification of a manufacturing process can be obtained. It is needless to say that a nonessential component can be omitted in the structures also in FIG. 11 and the like.

Figure 17A:
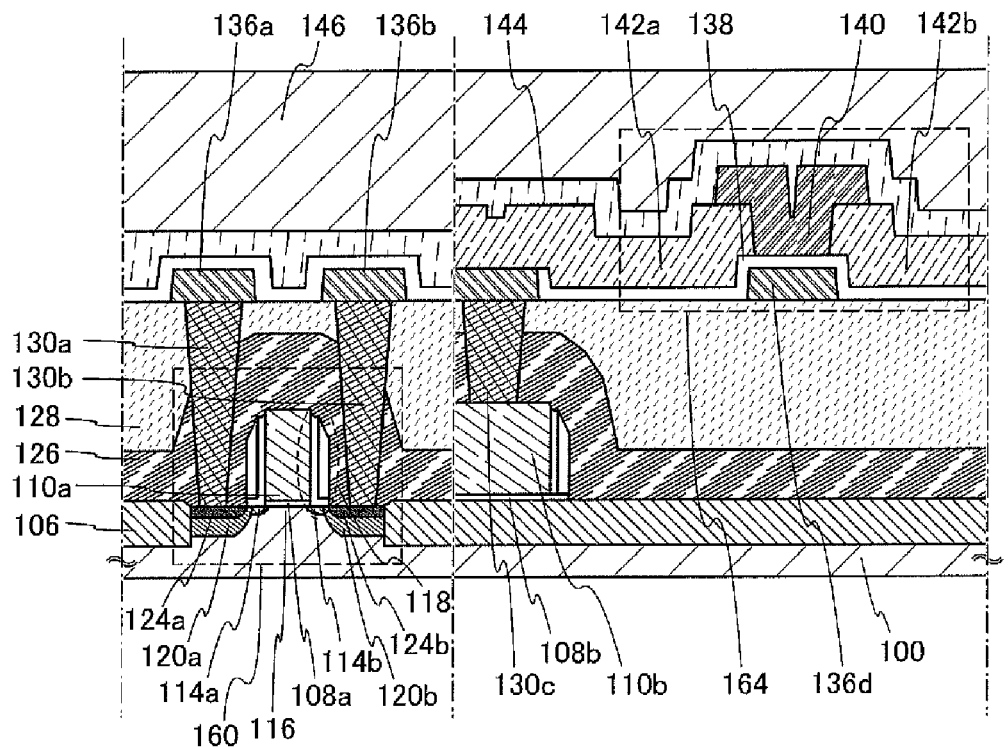
FIGS. 17A and 17B are cross-sectional views each illustrating a structural example of a p-channel transistor and an n-channel transistor described in Embodiment 7.
Figure 17B:
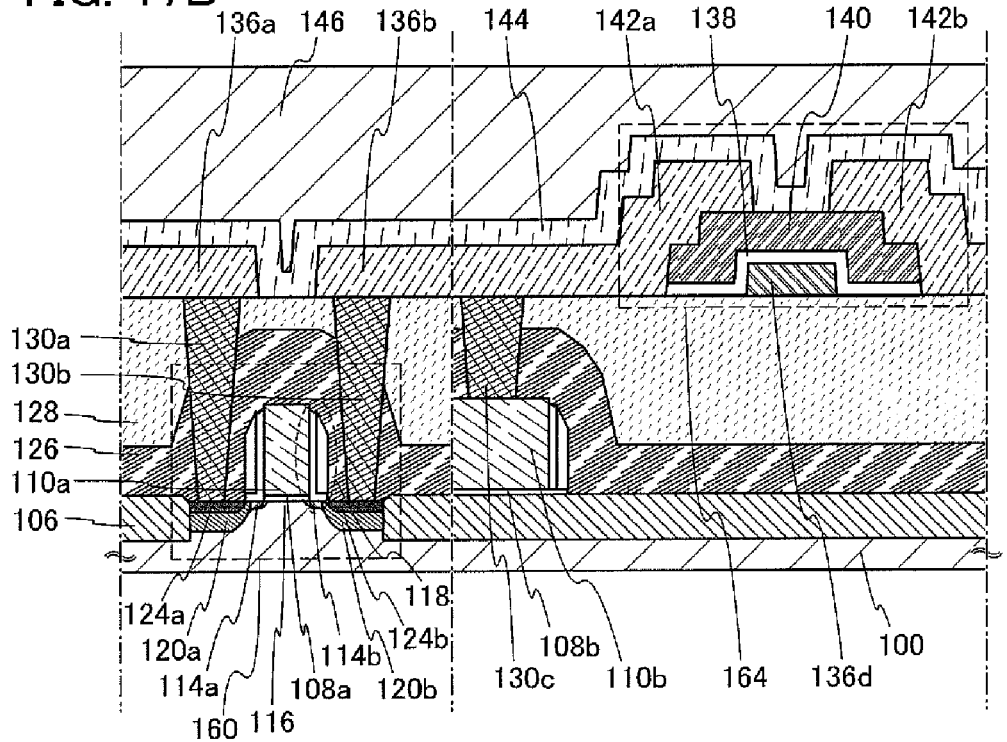

FIGS. 17A and 17B each illustrate the n-channel transistor 164 in the case where the size of the element is relatively large and the gate electrode layer 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode layer 136d and the like can be formed by patterning after formation of a conductive layer.

A big difference between the structure in FIG. 17A and the structure in FIG. 17B is that the source and drain electrode layers 142a and 142b are in contact with either the bottom surface or the top surface of the oxide semiconductor layer 140. Moreover, these differences result in other electrodes, an insulating layer, and the like being arranged in a different manner. The details of each component are the same as those of FIG. 11, and the like.

Specifically, the n-channel transistor 164 illustrated in FIG. 17A includes the gate electrode layer 136d provided over the interlayer insulating layer 128, the gate insulating layer 138 provided over the gate electrode layer 136d, the source and drain electrode layers 142a and 142b provided over the gate insulating layer 138, and the oxide semiconductor layer 140 in contact with top surfaces of the source and drain electrode layers 142a and 142b.

Further, the n-channel transistor 164 illustrated in FIG. 17B includes the gate electrode layer 136d provided over the interlayer insulating layer 128, the gate insulating layer 138 provided over the gate electrode layer 136d, the oxide semiconductor layer 140 provided over the gate insulating layer 138 so as to overlap with the gate electrode layer 136d, and the source and drain electrode layers 142a and 142b provided to be in contact with a top surface of the oxide semiconductor layer 140.

Note that also in the structures in FIGS. 17A and 17B, a component is sometimes omitted from the structure in FIG. 11 or the like. Also in this case, a secondary effect such as simplification of a manufacturing process can be obtained.

Figure 18A:
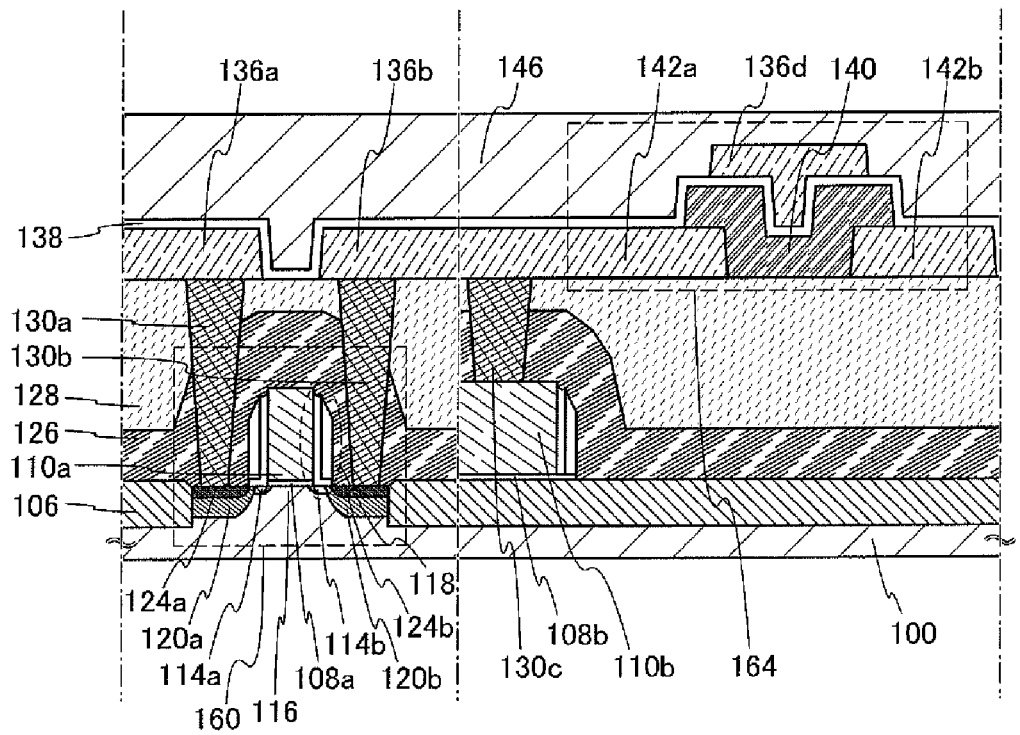
FIGS. 18A and 18B are cross-sectional views each illustrating a structural example of a p-channel transistor and an n-channel transistor described in Embodiment 7.
Figure 18B:
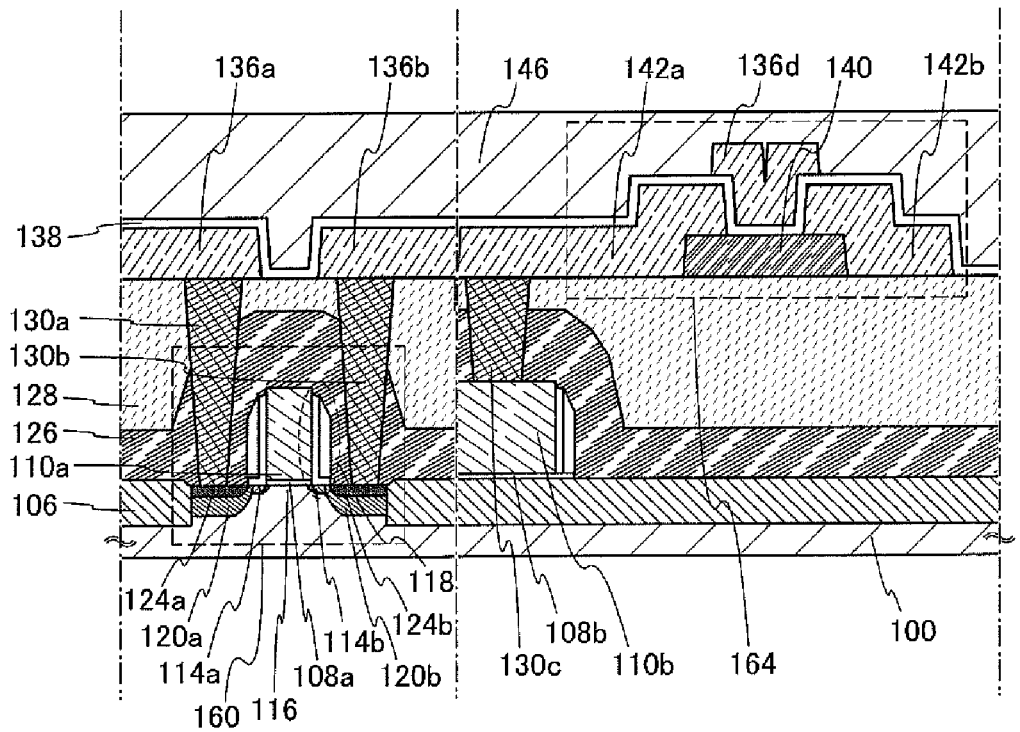

FIGS. 18A and 18B each illustrate the n-channel transistor 164 in the case where the size of the element is relatively large and the gate electrode layer 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode layer 136d and the like can be formed by patterning after formation of a conductive layer.

A big difference between the structure in FIG. 18A and the structure in FIG. 18B is that the source and drain electrode layers 142a and 142b are in contact with either the bottom surface or the top surface of the oxide semiconductor layer 140. Moreover, these differences result in other electrodes, an insulating layer, and the like being arranged in a different manner. The details of each component are the same as those of FIG. 11, and the like.

Specifically, the n-channel transistor 164 illustrated in FIG. 18A includes the source and drain electrode layers 142a and 142b provided over the interlayer insulating layer 128, the oxide semiconductor layer 140 in contact with top surfaces of the source and drain electrode layers 142a and 142b, the gate insulating layer 138 provided over the source and drain electrode layers 142a and 142b and the oxide semiconductor layer 140, and the gate electrode layer 136d provided over the gate insulating layer 138 so as to overlap with the oxide semiconductor layer 140.

The n-channel transistor 164 illustrated in FIG. 18B includes the oxide semiconductor layer 140 provided over the interlayer insulating layer 128, the source and drain electrode layers 142a and 142b provided to be in contact with a top surface of the oxide semiconductor layer 140, the gate insulating layer 138 provided over the source and drain electrode layers 142a and 142b and the oxide semiconductor layer 140, and the gate electrode layer 136d provided over the gate insulating layer 138 in a region overlapping with the oxide semiconductor layer 140.

Note that also in the structures in FIGS. 18A and 18B, a component is sometimes omitted from the structure in FIG. 11 or the like. Also in this case, a secondary effect such as simplification of a manufacturing process can be obtained.

In this embodiment, the example in which the n-channel transistor 164 is formed over the p-channel transistor 160 to have a stacked structure is described; however, the structures of the p-channel transistor 160 and the n-channel transistor 164 are not limited to the above. For example, the p-channel transistor and the n-channel transistor can be formed over the same planar surface. Further, a structure in which the p-channel transistor 160 and the n-channel transistor 164 overlap with each other may be employed.

The above-described n-channel transistor 164 is applied to the n-channel transistor included in the logic circuits described in Embodiments 1 to 6, whereby leakage of electric charges through the transistor can be suppressed. As a result, reduction in standby power and suppression of malfunction of the logic circuit can be achieved.

Note that the contents of this embodiment or part thereof can be combined freely with the contents of other embodiments or part thereof or the content of Example or part thereof.

Embodiment 8

In this embodiment, an example of a transistor included in any of the logic circuits described in Embodiments 1 to 6 will be described. Specifically, an example of a thin film transistor in which a channel formation region is formed using an oxide semiconductor will be described.

One embodiment of a thin film transistor and a manufacturing step thereof in this embodiment are described with reference to FIGS. 19A and 19B and FIGS. 20A to 1020E.

Figure 19A:
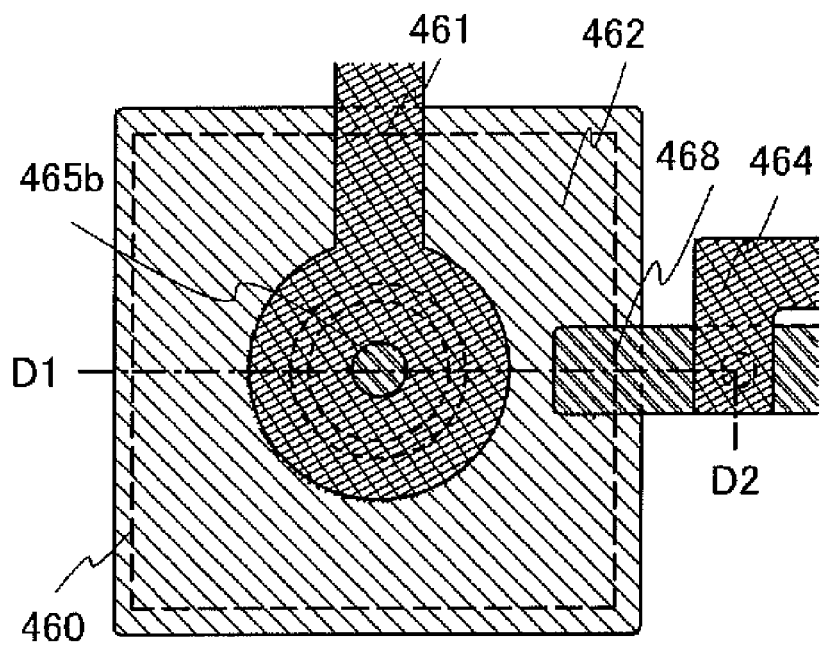
FIGS. 19A and 19B are a plan view and a cross-sectional view, respectively, illustrating a structural example of a transistor described in Embodiment 8.
Figure 19B:
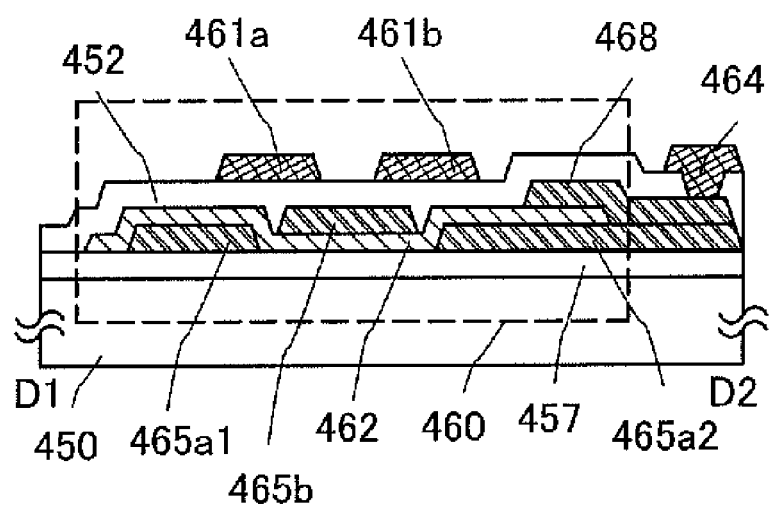

FIGS. 19A and 19B respectively illustrate a planar structure and a cross-sectional structure of an example of a thin film transistor. A thin film transistor 460 illustrated in FIGS. 19A and 19B has a top-gate structure.

FIG. 19A is a plan view of the top-gate thin film transistor 460, and FIG. 19B is a cross-sectional view along line D1-D2 of FIG. 19A.

Thin film transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is also electrically connected to a wiring layer in an opening provided in the gate insulating layer 452.

A process of manufacturing the thin film transistor 460 over the substrate 450 is described below with reference to FIGS. 20A to 20E.

First, the insulating layer 457 serving as a base film is formed over the substrate 450 having an insulating surface.

In this embodiment, a silicon oxide layer is formed by a sputtering method as the insulating layer 457. The substrate 450 is transferred into a treatment chamber, a sputtering gas containing high-purity oxygen in which hydrogen and moisture are removed is introduced thereinto, and a silicon target or quartz (preferably synthetic quartz) is used, so that the silicon oxide layer is deposited as the insulating layer 457 on the substrate 450. As the sputtering gas, oxygen or a mixed gas of oxygen and argon can be used.

For example, a silicon oxide layer is formed by an RF sputtering method under the following condition: the purity of a sputtering gas is 6N; quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm)). The thickness of the silicon oxide is 100 nm. Note that instead of quartz (preferably, synthetic quartz), a silicon target can be used as a target used when the silicon oxide layer is formed.

In that case, the insulating layer 457 is preferably formed while removing moisture remaining in the treatment chamber. This is for preventing hydrogen, hydroxyl, or moisture from being contained in the insulating layer 457. In the treatment chamber which is evacuated with a cryopump, a hydrogen atom, a compound containing a hydrogen atom such as water ($H_2O$), and the like are removed, whereby the concentration of an impurity in the insulating layer 457 formed in the treatment chamber can be reduced.

A sputtering gas used for the deposition of the insulating layer 457 is preferably a high-purity gas in which the concentration of an impurity such as hydrogen, water, hydroxyl, or hydride is reduced to approximately several parts per million (ppm) or several parts per billion (ppb).

Further, the insulating layer 457 may have a stacked structure in which for example, a nitride insulating layer such as a silicon nitride layer, a silicon nitride oxide layer, an aluminum nitride layer, or an aluminum nitride oxide layer and an oxide insulating layer are stacked in this order from the substrate 450 side.

For example, a sputtering gas containing high-purity nitrogen, from which hydrogen and moisture are removed is introduced between the silicon oxide layer and the substrate, and a silicon target is used, whereby a silicon nitride layer is formed. Also in this case, in a manner similar to formation of the silicon oxide layer, it is preferable that the silicon nitride layer be formed while removing residual moisture in the treatment chamber.

Next, a conductive film is formed over the insulating layer 457. By performance of a first photolithography step, a resist mask is formed over the conductive film and selective etching is performed, so that the source or drain electrode layer 465a1 and 465a2 is formed. Then, the resist mask is removed (see FIG. 20A). It seems in cross section as if the source or drain electrode layer 465a1 and 465a2 is divided; however, the source or drain electrode layer 465a1 and 465a2 is a continuous film. Note that the source electrode layer and the drain electrode layer preferably have tapered shapes in end portions because coverage with the gate insulating layer stacked thereover can be improved.

As the material of the source or drain electrode layer 465a1 and 465a2, there are an element selected from Al, Cr, Cu, Ta, Ti, Mo, and W; an alloy including any of the above elements; an alloy film containing a combination of any of these elements; and the like. Further, one or more of materials selected from manganese, magnesium, zirconium, beryllium, and thorium may be used. The conductive layer may have a single-layer structure or a stacked-layer structure of two or more layers. For example, a single-layer structure of an aluminum layer containing silicon; a two-layer structure of an aluminum layer and a titanium layer stacked thereover; a three-layer structure in which a Ti layer, an aluminum layer, and a Ti layer are stacked in this order; and the like can be given. Alternatively, a layer, an alloy layer, or a nitride layer which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In this embodiment, a titanium layer is formed to a thickness of 150 nm by a sputtering method for the source or drain electrode layer 465a1 and 465a2.

Next, an oxide semiconductor layer with a thickness of 2 nm to 200 nm inclusive over the insulating layer 457 and the source or drain electrode layer 465a1 and 465a2.

Figure 20A:
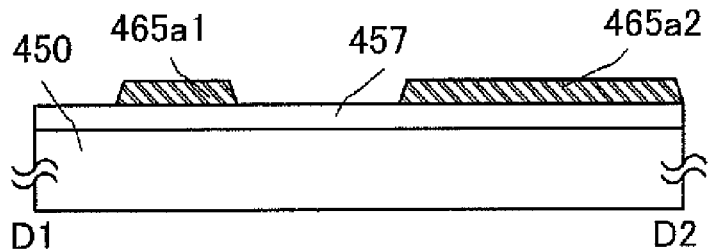
FIGS. 20A to 20E are cross-sectional views illustrating an example of a manufacturing process of a transistor described in Embodiment 8.
Figure 20B:
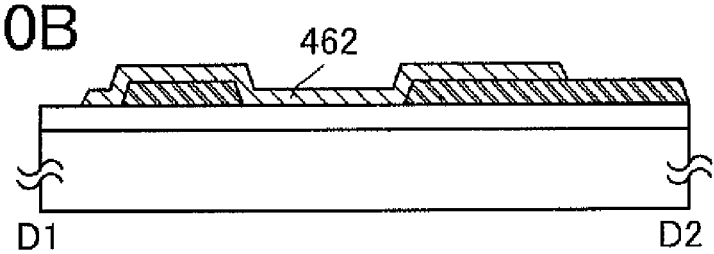
Figure 20C:
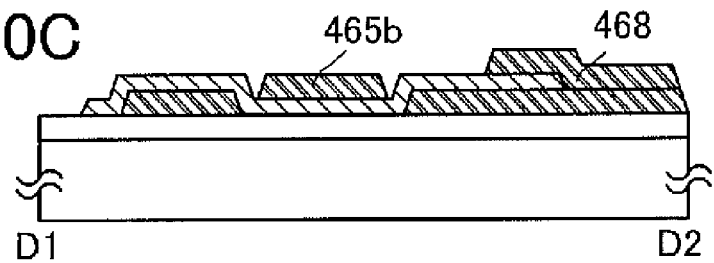

Next, the oxide semiconductor layer is processed into an island-shaped oxide semiconductor layer 462 in a second photolithography step (see FIG. 20B). In this embodiment, the oxide semiconductor layer is formed by a sputtering method with use of an In—Ga—Zn—O-based metal oxide target.

The substrate is held in a treatment chamber kept under reduced pressure, a sputtering gas from which hydrogen and moisture are removed is introduced into the treatment chamber while removing residual moisture in the treatment chamber, whereby the oxide semiconductor layer is deposited over the substrate 450 with the use of metal oxide as a target. In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, for example, a compound containing a hydrogen atom such as water ($H_2O$) (further preferably, a compound containing a carbon atom), and the like are removed, whereby the concentration of an impurity in the oxide semiconductor layer formed in the treatment chamber can be reduced. The substrate may be heated when the oxide semiconductor layer is formed.

A sputtering gas used for the deposition of the oxide semiconductor layer is preferably a high-purity gas in which the concentration of an impurity such as hydrogen, water, hydroxyl, or hydride is reduced to approximately several parts per million (ppm) or several parts per billion (ppb).

An example of the deposition condition is as follows: the substrate temperature is room temperature, the distance between the substrate and the target is 60 mm, the pressure is 0.4 Pa, the direct current (DC) power supply is 0.5 kW, and the atmosphere is an atmosphere containing oxygen and argon (the flow ratio of oxygen to argon is 15 sccm:30 sccm). Note that when a pulse direct current (DC) power supply is used, powder substances (also referred to as particles or dust) generated in film deposition can be reduced and the film thickness is likely to be uniform. The thickness of the oxide semiconductor layer is preferably 5 nm to 30 nm inclusive. Note that an appropriate thickness differs depending on an oxide semiconductor material, and the thickness may be set as appropriate depending on the material.

In this embodiment, the oxide semiconductor layer is processed into the island-shaped oxide semiconductor layer 462 by a wet etching method with a mixed solution of phosphoric acid, acetic acid, and nitric acid as an etchant.

Next, the oxide semiconductor layer 462 is subjected to first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and the oxide semiconductor layer is not exposed to air so that water or hydrogen is prevented from entering the oxide semiconductor layer. By the first heat treatment, the oxide semiconductor layer 462 can be dehydrated or dehydrogenated.

Note that the heat treatment apparatus is not limited to an electronic furnace, and may be the one provided with a device for heating an object to be processed, using heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. For example, as the first heat treatment, GRTA by which the substrate is transferred into an inert gas heated to a high temperature as high as 650° C. to 700° C., heated for several minutes, and taken out from the inert gas heated to the high temperature may be performed. With GRTA, high-temperature heat treatment for a short period of time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Depending on conditions of the first heat treatment and the material of the oxide semiconductor layer, the oxide semiconductor layer may crystallize to be microcrystalline or polycrystalline.

The first heat treatment of the oxide semiconductor layer may be performed before processing the oxide semiconductor layer into island-shaped oxide semiconductor layers. In that case, the substrate is taken out from the heating apparatus after the first heat treatment, and then a photolithography step is performed.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive layer is formed over the insulating layer 457 and the oxide semiconductor layer 462. By performance of a third photolithography step, a resist mask is formed over the conductive layer and selective etching is performed, so that the source or drain electrode layer 465b and the wiring layer 468 are formed. Then, the resist mask is removed (see FIG. 20C). The source or drain electrode layer 465b and the wiring layer 468 may be formed using a material and steps similar to those of the source or drain electrode layer 465a1 and 465a2.

In this embodiment, a titanium film is formed to a thickness of 150 nm by a sputtering method for the source or drain electrode layer 465b and the wiring layer 468. In this embodiment, the source or drain electrode layer 465a1 and 465a2 is formed from the titanium film from which the source or drain electrode layer 465b is formed; accordingly, the etching selectivity of the source or drain electrode layer 465a1 and 465a2 is the same as or substantially the same as that of the source or drain electrode layer 465b. In order to prevent the source or drain electrode layer 465a1 and 465a2 from being etched when the source or drain electrode layer 465b is etched, the wiring layer 468 is provided over a portion of the source or drain electrode layer 465a2, which is not covered with the oxide semiconductor layer 462. In the case of using different materials which provide high selectivity ratio of the source or drain electrode layer 465b to the source or drain electrode layer 465a1 and 465a2 in the etching step, the wiring layer 468 which protects the source or drain electrode layer 465a2 in etching is not necessarily provided.

Note that materials and etching conditions are adjusted as appropriate so that the oxide semiconductor layer 462 is not removed when the conductive film is etched.

In this embodiment, a Ti layer is used as the conductive layer, an In—Ga—Zn—O-based oxide semiconductor is used as the oxide semiconductor layer 462, and an ammonia hydrogen peroxide solution (a mixture of ammonia, water, and a hydrogen peroxide solution) is used as an etchant.

Note that in the third photolithography step, only part of the oxide semiconductor layer 462 is etched, whereby an oxide semiconductor layer having a groove (a depressed portion) might be formed. The resist mask used for forming the source or drain electrode layer 465b and the wiring layer 468 may be formed with an ink-jet method. Formation of the resist mask by an inkjet method needs no photomask; thus, manufacturing cost can be reduced.

Next, a gate insulating layer 452 is formed over the insulating layer 457, the oxide semiconductor layer 462, the source or drain electrode layer 465a1 and 465a2, the source or drain electrode layer 465b, and the wiring layer 468.

The gate insulating layer 452 can be a single layer or a stacked layer formed using any of a silicon oxide layer, a silicon nitride layer, a silicon oxynitride layer, a silicon nitride oxide layer, and an aluminum oxide layer, which is formed by a plasma CVD method, a sputtering method, or the like. In order to prevent the gate insulating layer 452 from containing a large amount of hydrogen, the gate insulating layer 452 is preferably formed by a sputtering method. In the case where a silicon oxide layer is formed by a sputtering method, a silicon target or a quartz target is used as a target, and oxygen or a mixed gas of oxygen and argon is used as a sputtering gas.

The gate insulating layer 452 may have a structure where a silicon oxide layer and a silicon nitride layer are stacked from the side of the source or drain electrode layer 465a1 and 465a2 and the source or drain electrode layer 465b. In this embodiment, a silicon oxide layer is formed to a thickness of 100 nm by an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Figure 20D:
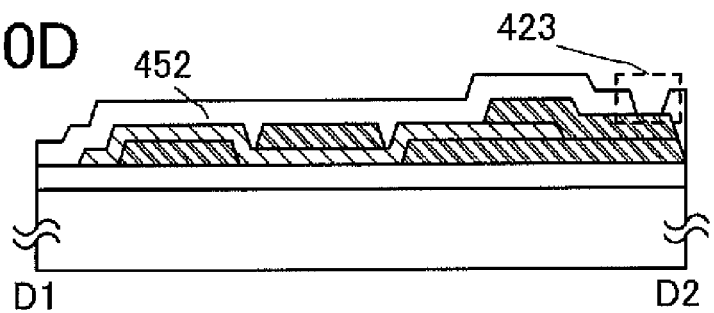

Next, by performance of a fourth photolithography step, a resist mask is formed and selective etching is performed to remove part of the gate insulating layer 452, so that an opening 423 reaching the wiring layer 468 is formed (see FIG. 20D). Although not illustrated, in forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Then, after a conductive layer is formed over the gate insulating layer 452 and in the opening 423, the gate electrode layer 461 (461a and 461b) and the wiring layer 464 are formed in a fifth photolithography step. Note that a resist mask may be formed by an inkjet method. Formation of the resist mask by an inkjet method needs no photomask; thus, manufacturing cost can be reduced.

Further, the gate electrode layer 461 (461a and 461b) and the wiring layer 464 can be formed with a single-layer structure or a stacked-layer structure using any of metal materials such as molybdenum, titanium, chromium, tantalum, tungsten, aluminum, copper, neodymium, and scandium, and an alloy material including any of these materials as a main component.

In this embodiment, a titanium layer is formed to a thickness of 150 nm by a sputtering method for the gate electrode layer 461 (461a and 461b) and the wiring layer 464.

Next, second heat treatment (preferably at 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 460.

Further, heat treatment may be performed at 100° C. to 200° C. inclusive for from one hour to 30 hours in air. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating layer. Under the reduced pressure, the heat treatment time can be shortened.

Figure 20E:
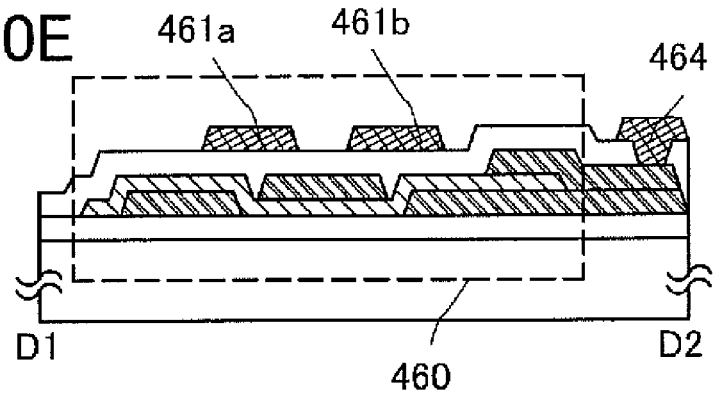

Through the above-described process, the thin film transistor 460 including the oxide semiconductor layer 462 in which the concentration of hydrogen, moisture, hydride, or hydroxide is reduced can be formed (see FIG. 20E).

A protective insulating layer or a planarization insulating layer for planarization may be provided over the thin film transistor 460. Although not illustrated, an opening reaching the source or drain electrode layer 465b may be formed in the gate insulating layer 452 and the protective insulating layer or the planarization insulating layer, and a wiring layer for electrical connection to the source or drain electrode layer 465b is formed in the opening.

Moisture remaining in a reaction atmosphere is removed as described above in forming the oxide semiconductor layer, whereby the concentration of hydrogen and hydride in the oxide semiconductor layer can be reduced. Therefore, the oxide semiconductor layer can be stabilized.

The above-described thin film transistor is applied to the transistor included in the logic circuits described in Embodiments 1 to 6, whereby leakage of electric charges through the transistor can be suppressed. As a result, reduction in consumed power (standby power) and suppression of malfunction of the logic circuit can be achieved.

Note that the contents of this embodiment or part thereof can be combined freely with the contents of other embodiments or part thereof or the content of Example or part thereof.

Embodiment 9

In this embodiment, an example of a transistor included in any of the logic circuits described in Embodiments 1 to 6 will be described. Specifically, an example of a thin film transistor in which a channel formation region is formed using an oxide semiconductor will be described.

One embodiment of a thin film transistor of this embodiment and a manufacturing method thereof are described with reference to FIGS. 21A to 21E.

FIGS. 21A to 21E illustrate cross-sectional structures of a thin film transistor. A thin film transistor 390 illustrated in FIG. 21E has a bottom-gate structure and is referred to as an inverted staggered thin film transistor.

The thin film transistor 390 is described using a single-gate thin film transistor; however, a multi-gate thin film transistor including a plurality of channel formation regions can be formed when needed.

Hereinafter, a process of manufacturing the thin film transistor 390 over a substrate 394 is described with reference to FIGS. 21A to 21E.

First, a conductive layer is formed over the substrate 394 having an insulating surface, and then, a gate electrode layer 391 is formed by performance of a first photolithography step. It is preferable that an end portion of the formed gate electrode layer 391 have a tapered shape because coverage with a gate insulating layer stacked thereover is improved. Note that a resist mask may be formed by an inkjet method. Formation of the resist mask by an inkjet method needs no photomask; thus, manufacturing cost can be reduced.

Although there is no particular limitation on a substrate which can be used as the substrate 394 having an insulating surface, the substrate needs to have heat resistance high enough to withstand at least heat treatment to be performed later. A glass substrate formed using barium borosilicate glass, aluminoborosilicate glass, or the like can be used.

In the case where the temperature at which the heat treatment is to be performed later is high, a glass substrate whose strain point is higher than or equal to 730° C. is preferably used. As a glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boron oxide ($B_2O_3$). Therefore, a glass substrate containing more BaO than $B_2O_3$ is preferably used.

Note that as the above glass substrate, a substrate formed of an insulator such as a ceramic substrate, a quartz substrate, or a sapphire substrate may be used. Alternatively, crystallized glass or the like may be used. Further alternatively, a plastic substrate or the like can be used as appropriate.

An insulating layer serving as a base film may be provided between the substrate 394 and the gate electrode layer 391. The base film has a function of preventing diffusion of an impurity element from the substrate 394, and can be formed to have a single-layer structure or a stacked structure including one or more films selected from a silicon nitride layer, a silicon oxide layer, a silicon nitride oxide layer, and a silicon oxynitride layer.

The gate electrode layer 391 can be formed with a single layer or a stacked layer using a metal material such as molybdenum, titanium, chromium, tantalum, tungsten, aluminum, copper, neodymium, or scandium, or an alloy material which contains any of these materials as a main component.

For example, as a two-layer structure of the gate electrode layer 391, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. Note that the gate electrode layer can be formed using a light-transmitting conductive layer. As an example of the light-transmitting conductive layer, a light-transmitting conductive oxide or the like can be given.

Then, the gate insulating layer 397 is formed over the gate electrode layer 391.

The gate insulating layer 397 can be formed with a single-layer structure or a stacked structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 397 from containing a large amount of hydrogen, the gate insulating layer 397 is preferably formed by a sputtering method. For example, in the case where a silicon oxide layer is formed by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked from the gate electrode layer 391 side. For example, a gate insulating layer having a thickness of 100 nm is formed in such a manner that a silicon nitride layer ($SiN_y$, (y>0)) having a thickness of 50 nm to 200 nm inclusive is formed by a sputtering method as a first gate insulating layer and then a silicon oxide layer ($SiO_x$ (x>0)) having a thickness of 5 nm to 300 nm inclusive is stacked as a second gate insulating layer over the first gate insulating layer.

Further, in order for the gate insulating layer 397 and an oxide semiconductor layer 393 to contain hydrogen, hydroxyl, or moisture as little as possible, it is preferable that the substrate 394 over which the gate insulating layer 391 is formed or the substrate 394 in a state after the gate insulating layer 397 is formed thereover be preheated in a preheating chamber of a sputtering apparatus as pretreatment for film formation so that impurities such as hydrogen or moisture adsorbed to the substrate 394 are eliminated, and then evacuation is performed. Note that the temperature of the preheating is higher than or equal to 100° C. and lower than or equal to 400° C., preferably higher than or equal to 150° C. and lower than or equal to 300° C. As an evacuation unit provided for the preheating chamber, a cryopump is preferably used. Note that this preheating treatment can be omitted. Further, such preheating treatment may be performed with respect to the substrate 394 in a state where a source electrode layer 395a and a drain electrode layer 395b are formed before formation of an oxide insulating layer 396 in a manner similar to the above.

Figure 21A:
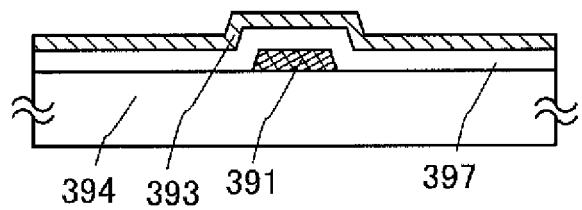
FIGS. 21A to 21E are cross-sectional views illustrating an example of a manufacturing process of a transistor described in Embodiment 9.

Then, the oxide semiconductor layer 393 is formed to a thickness of from 2 nm to 200 nm over the gate insulating layer 397 (see FIG. 21A).

Note that before the oxide semiconductor layer 393 is formed by a sputtering method, dust on a surface of the gate insulating layer 397 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

The oxide semiconductor layer 393 is formed by a sputtering method. The oxide semiconductor layer 393 is formed using an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor. In this embodiment, the oxide semiconductor layer 393 is formed by a sputtering method using an In—Ga—Zn—O-based metal oxide target. Further, the oxide semiconductor layer 393 can be formed by a sputtering method in a rare gas (typically argon) atmosphere, an oxygen atmosphere, or an atmosphere of a rare gas (typically argon) and oxygen. In the case of employing a sputtering method, deposition may be performed with use of a target including $SiO_2$ at 2 wt % to 10 wt %, inclusive.

As a target for forming the oxide semiconductor layer 393 by a sputtering method, a metal oxide target including zinc oxide as a main component can be used. As another example of the metal oxide target, a metal oxide target including In, Ga, and Zn (composition ratio: $In_2O_3:Ga_2O_3:ZnO=1:1:1$ [molar ratio], In:Ga:Zn=1:1:0.5 [atomic ratio]) can be used. As the metal oxide target including In, Ga, and Zn, a target having a composition ratio of In:Ga:Zn=1:1:1 [atomic ratio] or a target having a composition ratio of In:Ga:Zn=1:1:2 [atomic ratio] can also be used. The filling factor of the metal oxide target is 90% to 100% inclusive, and preferably 95% to 99.9% inclusive. By using the metal oxide target with high filling factor, a dense oxide semiconductor layer is formed.

The substrate is held inside a treatment chamber which is kept in a reduced pressure state, and the substrate is heated to a temperature higher than or equal to room temperature and lower than 400° C. Then, a sputtering gas from which hydrogen and moisture are removed is introduced into the treatment chamber from which remaining moisture in the treatment chamber is being removed, and the oxide semiconductor layer 393 is formed over the substrate 394 with use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a compound containing a hydrogen atom such as water ($H_2O$) (preferably a compound containing a carbon atom), and the like are removed, whereby the impurity concentration in the oxide semiconductor layer formed in the treatment chamber can be reduced. By film formation using a sputtering method while removing moisture left in the treatment chamber with a cryopump, the substrate temperature at the time of forming the oxide semiconductor layer 393 can be higher than or equal to room temperature and lower than 400° C.

As one example of the deposition condition, the distance between the substrate and the target is 100 mm, the pressure is 0.6 Pa, the direct-current (DC) power supply is 0.5 kW, and the atmosphere is an oxygen atmosphere (the proportion of the oxygen flow is 100%). Note that when a pulse direct current (DC) power supply is used, powder substances (also referred to as particles or dust) generated in film deposition can be reduced and the film thickness is likely to be uniform. The thickness of the oxide semiconductor layer is preferably 5 nm to 30 nm inclusive. Note that an appropriate thickness differs depending on an oxide semiconductor material, and the thickness may be set as appropriate depending on the material.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating layer is formed, and a DC sputtering method is mainly used in the case where a metal layer is formed.

In addition, there is also a multi-source sputtering apparatus in which a plurality of targets of different materials can be set. With the multi-source sputtering apparatus, layers of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Figure 21B:
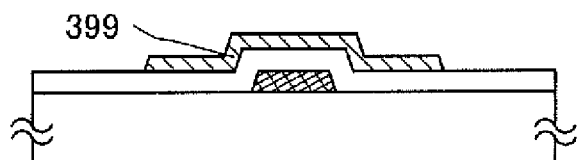
Figure 21C:
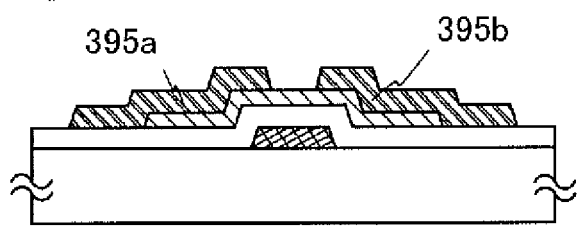

Then, by performance of a second photolithography step, the oxide semiconductor layer is processed into an island-shaped oxide semiconductor layer 399 (see FIG. 21B). Note that a resist mask used for formation of the island-shaped oxide semiconductor layer 399 may be formed by an inkjet method. Formation of the resist mask by an inkjet method needs no photomask; thus, manufacturing cost can be reduced.

In the case of forming a contact hole in the gate insulating layer 397, its step can be performed at the time of formation of the oxide semiconductor layer 399.

For the etching of the oxide semiconductor layer 393, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layers into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Note that reverse sputtering is preferably performed before formation of a conductive film in a subsequent step, so that a resist residue attached to surfaces of the oxide semiconductor layer 399 and the gate insulating layer 397 is removed.

Next, a conductive layer is formed over the gate insulating layer 397 and the oxide semiconductor layer 399. The conductive layer may be formed by a sputtering method or a vacuum evaporation method. As a material of the conductive layer, an element selected from Al, Cr, Cu, Ta, Ti, Mo, and W; an alloy containing any of these elements as a component an alloy layer containing any of these elements in combination; and the like can be given. Further, one or more of materials selected from manganese, magnesium, zirconium, beryllium, and thorium may be used. The metal conductive layer may have a single-layer structure or a stacked-layer structure of two or more layers. For example, a single-layer structure of an aluminum layer including silicon, a two-layer structure of an aluminum layer and a titanium layer stacked thereover, a three-layer structure in which a Ti layer, an aluminum layer, and a Ti layer are stacked in this order, and the like can be given. Alternatively, a layer, an alloy layer, or a nitride layer which contains aluminum (Al) and one or a plurality of elements selected from titanium (Ti), tantalum (Ta), tungsten (W), molybdenum (Mo), chromium (Cr), neodymium (Nd), and scandium (Sc) may be used.

By performance of a third photolithography step, a resist mask is formed over the conductive layer, and the resist mask is selectively etched, so that a source electrode layer 395a and a drain electrode layer 395b are formed. Then, the resist mask is removed (see FIG. 21C).

For exposures for making the resist mask, ultraviolet rays, a KrF laser beam, or an ArF laser beam is preferably used. The channel length (L) of a thin film transistor to be formed later is determined by the distance between the bottom portion of the source electrode layer 395a and the bottom portion of the drain electrode layer 395b which are adjacent to each other over the oxide semiconductor layer 399. In the case where the channel length (L) is shorter than 25 nm, exposure for making a mask in the third photolithography step is performed with use of extreme ultraviolet with extremely short wavelengths of several nanometers to several tens of nanometers. Exposure with extreme ultraviolet yields high resolution and a great depth of focus. Therefore, the channel length (L) of the transistor, which is formed later, can be from 10 nm to 1000 nm inclusive, and thus the operation rate of the circuit can be increased. In addition, the off current value is extremely small; thus, lower power consumption can be achieved.

Materials of the layers and etching conditions are adjusted as appropriate so that the oxide semiconductor layer 399 is not removed in etching of the conductive layer.

In this embodiment, a Ti layer is used as the conductive film, an In—Ga—Zn—O-based oxide semiconductor is used as the oxide semiconductor layer 399, and an ammonia hydrogen peroxide solution (a mixture of ammonia, water, and a hydrogen peroxide solution) is used as an etchant.

In the third photolithography step, only part of the oxide semiconductor layer 399 may be etched off, whereby an oxide semiconductor layer having a groove (a depressed portion) may be formed. Note that a resist mask used for forming the source electrode layer 395a and the drain electrode layer 395b may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with use of a multi-tone mask which is a light-exposure mask through which light is transmitted to have a plurality of intensities. A resist mask formed with use of a multi-tone mask has a plurality of thicknesses and further can be changed in shape by etching; therefore, such a resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Plasma treatment using a gas such as $N_2O$, $N_2$, or Ar may be performed to remove water or the like adsorbed on a surface of the oxide semiconductor layer which is exposed. Plasma treatment may be performed using a mixture gas of oxygen and argon.

Figure 21D:
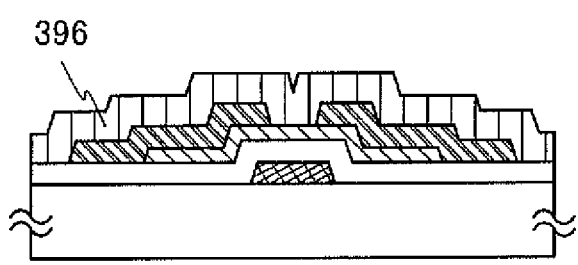

In the case of performing plasma treatment, an oxide insulating layer 396 in contact with part of the oxide semiconductor layer is formed without being exposed to air (see FIG. 21D). In this embodiment, the oxide insulating layer 396 is formed in contact with the oxide semiconductor layer 399 in a region where the oxide semiconductor layer 399 is overlapped with neither the source electrode layer 395a nor the drain electrode layer 395b.

In this embodiment, the substrate 394 over which layers such as the island-shaped oxide semiconductor layer 399, the source electrode layer 395a, and the drain electrode layer 395b are formed is heated to a temperature higher than or equal to room temperature and lower than 100° C., and a sputtering gas containing high-purity oxygen in which hydrogen and moisture are removed is introduced, so that a silicon oxide layer including a defect is formed as the oxide insulating layer 396 with use of a silicon target.

For example, a silicon oxide layer is formed by a pulsed DC sputtering method, in which a silicon target doped with boron and having a purity of 6N (99.9999%) (resistivity: 0.01 Ωcm) is used, the distance between the target and the substrate (T-S distance) is 89 mm, the pressure is 0.4 Pa, the direct current (DC) power supply is 6 kW, and an atmosphere is an oxygen atmosphere (the proportion of the oxygen flow is 100%). The thickness thereof is 300 nm. Instead of the silicon target, quartz (preferably, synthetic quartz) can be used as the target for forming the silicon oxide layer. As the sputtering gas, oxygen or a mixed gas of oxygen and argon is used.

In this case, it is preferable that the oxide insulating layer 396 be formed while removing residual moisture in the treatment chamber. This is because hydrogen, hydroxyl, or moisture is prevented from being included in the oxide semiconductor layer 399 and the oxide insulating layer 396.

In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a compound containing a hydrogen atom such as water ($H_2O$) (preferably, a compound containing a carbon atom), and the like are removed, whereby the concentration of an impurity in the oxide insulating layer 396 formed in the treatment chamber can be reduced.

Instead of the silicon oxide layer, a silicon oxynitride layer, an aluminum oxide layer, an aluminum oxynitride layer, or the like can be used as the oxide insulating layer 396.

Furthermore, heat treatment may be performed at a temperature of 100° C. to 400° C. under such a condition that the oxide insulating layer 396 and the oxide semiconductor layer 399 are in contact with each other. Since the oxide insulating layer 396 includes many defects in this embodiment, an impurity such as hydrogen, moisture, hydroxyl, or hydride included in the oxide semiconductor layer 399 is diffused into the oxide insulating layer 396 by heat treatment, so that the impurity in the oxide semiconductor layer 399 can be further reduced.

Figure 21E:
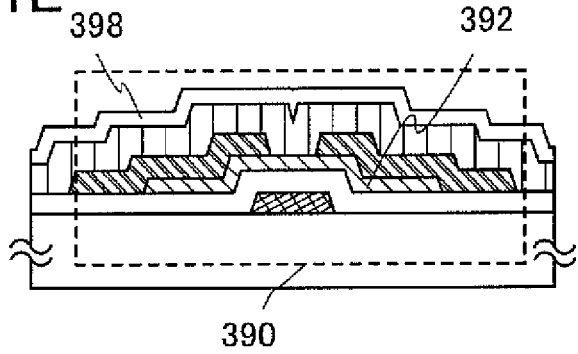

Through the above-described steps, the thin film transistor 390 including an oxide semiconductor layer 392 in which the concentration of hydrogen, moisture, hydroxyl, or hydride is reduced can be formed (see FIG. 21E).

When residual moisture in the reaction atmosphere is removed at the time of the above-described formation of the oxide semiconductor layer, the concentration of hydrogen and hydride in the oxide semiconductor layer can be reduced. Accordingly, the oxide semiconductor layer can be stabilized.

A protective insulating layer may be provided over the oxide insulating layer. In this embodiment, a protective insulating layer 398 is formed over the oxide insulating layer 396. As the protective insulating layer 398, a silicon nitride layer, a silicon nitride oxide layer, an aluminum nitride layer, an aluminum nitride oxide layer, or the like is used.

As the protective insulating layer 398, a silicon nitride layer is formed by heating the substrate 394 after the oxide insulating layer 396 is formed, to a temperature of 100° C. to 400° C., introducing a sputtering gas containing high-purity nitrogen from which hydrogen and moisture are removed, and using a silicon target. In this case also, it is preferable that residual moisture be removed from the treatment chamber in the formation of the protective insulating layer 398 in a manner similar to that of the oxide insulating layer 396.

In the case of forming the protective insulating layer 398, the substrate 394 is heated to a temperature of 100° C. to 400° C. at the time of formation of the protective insulating layer 398, whereby hydrogen or moisture included in the oxide semiconductor layer can be diffused into the oxide insulating layer. In this case, heat treatment is not necessarily performed after formation of the oxide insulating layer 396.

In the case where the silicon oxide layer as the oxide insulating layer 396 and a silicon nitride layer as the protective insulating layer 398 are stacked, the silicon oxide layer and the silicon nitride layer can be formed in the same treatment chamber using a common silicon target. First, a sputtering gas containing oxygen is introduced and a silicon oxide layer is formed using a silicon target placed inside the treatment chamber, and then the sputtering gas is switched to a sputtering gas containing nitrogen and a silicon nitride layer is formed using the same silicon target. Since the silicon oxide layer and the silicon nitride layer can be formed in succession without exposure to air, an impurity such as hydrogen or moisture can be prevented from being adsorbed on a surface of the silicon oxide layer. In this case, after the silicon oxide layer as the oxide insulating layer 396 and the silicon nitride layer as the protective insulating layer 398 are stacked, heat treatment (at a temperature of 100° C. to 400° C.) for diffusing hydrogen or moisture included in the oxide semiconductor layer into the oxide insulating layer may be performed.

After the formation of the protective insulating layer, heat treatment may be further performed at 100° C. to 200° C. inclusive in air for 1 hour to 30 hours inclusive. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating layer. Under the reduced pressure, the heat treatment time can be shortened. With this heat treatment, a normally-off thin film transistor can be obtained. Therefore, reliability of the semiconductor device can be improved.

When residual moisture in the reaction atmosphere is removed at the time of the formation of the oxide semiconductor layer, in which a channel formation region is to be formed, over the gate insulating layer, the concentration of hydrogen or hydride in the oxide semiconductor layer can be reduced.

The above steps can be used for manufacture of a liquid crystal display panel, an electroluminescence display panel, and a backplane (a substrate over which a thin film transistor is formed) of a display device using electronic ink. The above steps are performed at 400° C. or lower; therefore, the above steps can be applied to a manufacturing process in which a glass substrate having a thickness of 1 mm or smaller and having a side that is longer than 1 m is used. All the above steps can be performed at 400° C. or lower; thus, a large amount of energy is not needed for manufacturing a display panel.

The above-described thin film transistor is applied to the transistor included in the logic circuits described in Embodiments 1 to 6, whereby leakage of electric charges through the transistor can be suppressed. As a result, reduction in consumed power (standby power) and suppression of malfunction of the logic circuit can be achieved.

Note that the contents of this embodiment or part thereof can be combined freely with the contents of other embodiments or part thereof or the content of Example or part thereof.

Embodiment 10

In this embodiment, an example of a transistor included in any of the logic circuits described in Embodiments 1 to 6 will be described. Specifically, an example of a thin film transistor in which a channel formation region is formed using an oxide semiconductor will be described.

An embodiment of a thin film transistor of this embodiment and a manufacturing method thereof will be described with reference to FIGS. 22A to 22D.

Figure 22A:
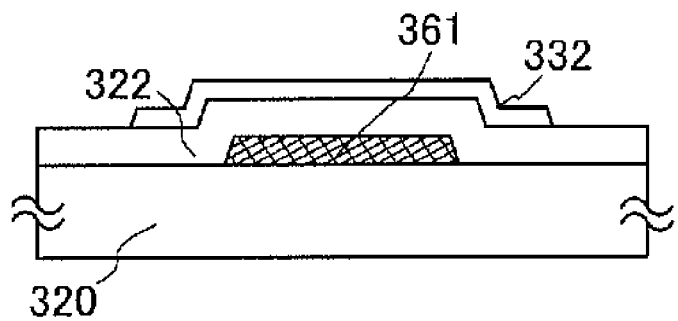
FIGS. 22A to 22D are cross-sectional views illustrating an example of a manufacturing process of a transistor described in Embodiment 10.
Figure 22B:
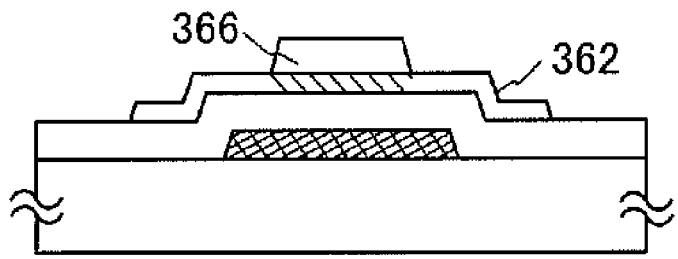
Figure 22C:
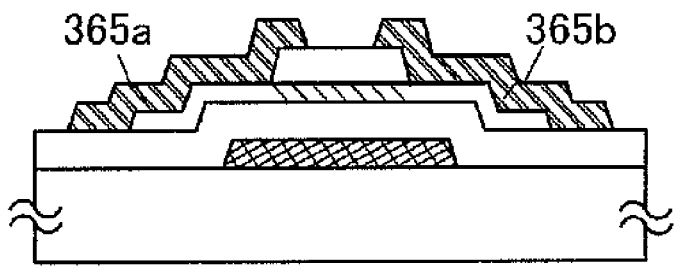
Figure 22D:
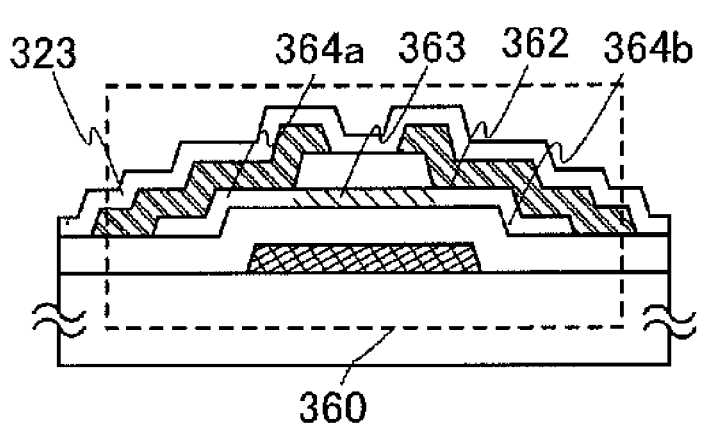

FIGS. 22A to 22D illustrate an example of a cross-sectional structure of a thin film transistor. A thin film transistor 360 illustrated in FIG. 22D is a kind of bottom-gate structure called a channel-protective type (channel-stop type) and is also called an inverted staggered thin film transistor.

The thin film transistor 360 is described using a single-gate thin film transistor; however, a multi-gate thin film transistor including a plurality of channel formation regions can be formed when needed.

Hereinafter, a process of manufacturing the thin film transistor 360 over a substrate 320 with reference to FIGS. 22A to 22D.

First, a conductive layer is formed over the substrate 320 having an insulating surface, and then, by performance of a first photolithography step, a gate electrode layer 361 is formed. Note that a resist mask may be formed by an inkjet method. Formation of the resist mask by an inkjet method needs no photomask; thus, manufacturing cost can be reduced.

The gate electrode layer 361 can be formed to have a single-layer or stacked-layer structure using a metal material such as molybdenum, titanium, chromium, tantalum, tungsten, aluminum, copper, neodymium, and scandium, or an alloy material which contains any of these materials as its main component.

Next, a gate insulating layer 322 is formed over the gate electrode layer 361.

In this embodiment, a silicon oxynitride layer is formed to a thickness of 100 nm or smaller by a plasma CVD method as the gate insulating layer 322.

Next, an oxide semiconductor layer is formed over the gate insulating layer 322 to have a thickness of from 2 nm to 200 nm and is processed into an island-shaped oxide semiconductor layer by a second photolithography step. In this embodiment, the oxide semiconductor layer is formed using an In—Ga—Zn—O based metal oxide target by a sputtering method.

In this case, it is preferable that the oxide semiconductor layer be formed while removing residual moisture in a treatment chamber. This is because hydrogen, hydroxyl, or moisture is prevented from being included in the oxide semiconductor layer.

In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a compound containing a hydrogen atom such as water ($H_2O$), and the like are removed, whereby the impurity concentration in the oxide semiconductor layer formed in the treatment chamber can be reduced.

A sputtering gas used for the deposition of the oxide semiconductor layer is preferably a high-purity gas in which the concentration of an impurity such as hydrogen, water, hydroxyl, or hydride is reduced to approximately several parts per million (ppm) or approximately several parts per billion (ppb).

Next, dehydration or dehydrogenation of the oxide semiconductor layers is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed with respect to the oxide semiconductor layer in a nitrogen atmosphere at 450° C. for one hour, and then, the oxide semiconductor layer is not exposed to air so that entry of water and hydrogen into the oxide semiconductor layer is prevented; thus, an oxide semiconductor layer 332 is obtained (see FIG. 22A).

Next, plasma treatment is performed using a gas such as $N_2O$, $N_2$, or Ar. By this plasma treatment, adsorbed water and the like attached to an exposed surface of the oxide semiconductor layer are removed. Plasma treatment may be performed using a mixed gas of oxygen and argon as well.

Next, an oxide insulating layer is formed over the gate insulating layer 322 and the oxide semiconductor layer 332. After that, by performance of a third photolithography step, a resist mask is formed, and the oxide insulating layer is selectively etched to form an oxide insulating layer 366. Then, the resist mask is removed.

In this embodiment, as the oxide insulating layer 366, a 200-nm-thick silicon oxide layer is deposited by a sputtering method. The substrate temperature in deposition may be higher than or equal to room temperature and lower than or equal to 300° C. and in this embodiment, is 100° C. The silicon oxide layer can be formed by a sputtering method in an atmosphere of a rare gas (typically, argon), an oxygen atmosphere, or a mixed atmosphere containing a rare gas (typically, argon) and oxygen. As a target, a silicon oxide target or a silicon target may be used. For example, the silicon oxide layer can be formed by a sputtering method using a silicon target in an atmosphere of oxygen and nitrogen.

In this case, it is preferable that the oxide insulating layer 366 be formed while removing residual moisture in the treatment chamber. This is because hydrogen, hydroxyl, or moisture is prevented from being included in the oxide semiconductor layer 332 and the oxide insulating layer 366.

In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a compound containing a hydrogen atom such as water ($H_2O$), and the like are removed, whereby the impurity concentration in the oxide insulating layer 366 formed in the treatment chamber can be reduced.

A sputtering gas used for the deposition of the oxide insulating layer 366 is preferably a high-purity gas in which the concentration of an impurity such as hydrogen, water, hydroxyl, or hydride is reduced to approximately several parts per million (ppm) or approximately several parts per billion (ppb).

Next, second heat treatment may be performed in an inert gas atmosphere or an oxygen gas atmosphere (preferably at a temperature higher than or equal to 200° C. and lower than or equal to 400° C., for example a temperature higher than or equal to 250° C. and lower than or equal to 350° C.). For example, the second heat treatment is performed in a nitrogen atmosphere at 250° C. for one hour. When the second heat treatment is performed, heat is applied under such a condition that part of the oxide semiconductor layer (a channel formation region) is in contact with the oxide insulating layer 366.

In this embodiment, the oxide semiconductor layer 332 which is provided with the oxide insulating layer 336 and is partly exposed is further subjected to heat treatment in a nitrogen atmosphere or an inert gas atmosphere or under reduced pressure. By the heat treatment in a nitrogen atmosphere or an inert gas atmosphere or under reduced pressure, the exposed region of the oxide semiconductor layer 332, which is not covered with the oxide insulating layer 336 is in an oxygen-deficient state and has reduced resistance. That is, an n-type oxide semiconductor layer is provided. For example, heat treatment is performed at 250° C. in a nitrogen atmosphere for one hour.

With the heat treatment for the oxide semiconductor layer 332 provided with the oxide insulating layer 366 in a nitrogen atmosphere, the resistance of the exposed region of the oxide semiconductor layer 332 is reduced. Thus, an oxide semiconductor layer 362 including regions with different resistances (indicated as a shaded region and white regions in FIG. 22B) is formed.

Next, a conductive layer is formed over the gate insulating layer 332, the oxide semiconductor layer 362, and the oxide insulating layer 366. After that, by performance of a fourth photolithography step, a resist mask is formed, and the conductive layer is selectively etched to form a source electrode layer 365a and a drain electrode layer 365b. Then, the resist mask is removed (see FIG. 22C).

As a material of the source electrode layer 365a and the drain electrode layer 365b, an element selected from Al, Cr, Cu, Ta, Ti, Mo, and W; an alloy containing any of these elements as a component; an alloy layer containing any of these elements in combination; and the like can be given. The metal conductive layer may have a single-layer structure or a stacked-layer structure of two or more layers.

Through the above steps, when the oxide semiconductor layer is subjected to heat treatment for dehydration or dehydrogenation after film formation, resistance of the oxide semiconductor layer is reduced, that is, the oxide semiconductor layer becomes of an n-type. After that, an oxide insulating layer is formed in contact with the oxide semiconductor layer, whereby part of the oxide semiconductor layer is to be in an oxygen-excess state selectively. As a result, a channel formation region 363 which overlaps with the gate electrode layer 361 becomes an i-type region. At that time, a high-resistance region 364a which has higher carrier density than at least the channel formation region 363 and overlaps with the source electrode layer 365a, and a high-resistance region 364b which has higher carrier density than at least the channel formation region 363 and overlaps with the drain electrode layer 365b are formed in a self-alignment manner. Through the above-described steps, the thin film transistor 360 is completed.

Further, heat treatment may be performed at from 100° C. to 200° C. inclusive for from one hour to 30 hours in air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before formation of the oxide insulating layer. Under the reduced pressure, the heat treatment time can be shortened. With such heat treatment, hydrogen is introduced from the oxide semiconductor layer to the oxide insulating layer; thus, a normally-off thin film transistor can be obtained. Therefore, reliability of the semiconductor device can be improved.

Note that by formation of the high-resistance drain region 364b (and the high-resistance source region 364a) in the part of the oxide semiconductor layer overlapping with the drain electrode layer 365b (and the source electrode layer 365a), reliability of the thin film transistor can be improved. Specifically, formation of the high-resistance drain region 364b enables such a structure that conductivity gradually varies from the drain electrode layer to the channel formation region 363 via the high resistance drain region 364b. Thus, in the case where operation is performed with the drain electrode layer 365b connected to a wiring for supplying a high power supply potential VDD, the high-resistance drain region serves as a buffer, and thus local concentration of an electric field hardly occurs even if the high electric field is applied between the gate electrode layer 361 and the drain electrode layer 365b, which leads to an increase in the dielectric withstand voltage of the transistor.

A protective insulating layer 323 is formed over the source electrode layer 365a, the drain electrode layer 365b, and the oxide insulating layer 366. In this embodiment, the protective insulating layer 323 is formed using a silicon nitride layer (see FIG. 22D).

Alternatively, an oxide insulating layer may be formed over the source electrode layer 365a, the drain electrode layer 365b, and the oxide insulating layer 366, and the protective insulating layer 323 may be further stacked over the oxide insulating layer.

The above-described thin film transistor is applied to the transistor included in the logic circuits described in Embodiments 1 to 6, whereby leakage of electric charges through the transistor can be suppressed. As a result, reduction in standby power and suppression of malfunction of the logic circuit can be achieved.

Note that the contents of this embodiment or part thereof can be combined freely with the contents of other embodiments or part thereof or the content of Example or part thereof.

Embodiment 11

In this embodiment, examples of semiconductor devices each including the logic circuit described in any of the above embodiments will be described with reference to FIGS. 23A to 23F. Note that the logic circuit relating to the above embodiments are integrated with an external circuit for operation of the logic circuit and the like and mounted on a circuit board; the logic circuit is included in semiconductor devices.

Figure 23A:
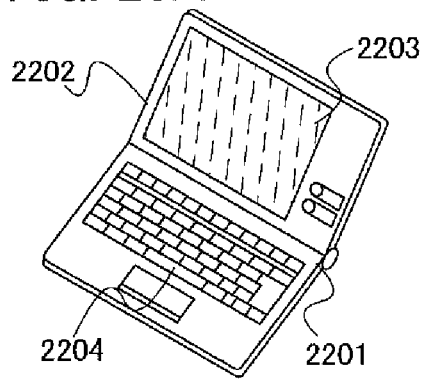
FIGS. 23A to 23F each illustrate an example of a semiconductor device described in Embodiment 11.

FIG. 23A illustrates a laptop computer including any of the above logic circuit, which includes a main body 2201, a housing 2202, a display portion 2203, a keyboard 2204, and the like.

Figure 23D:
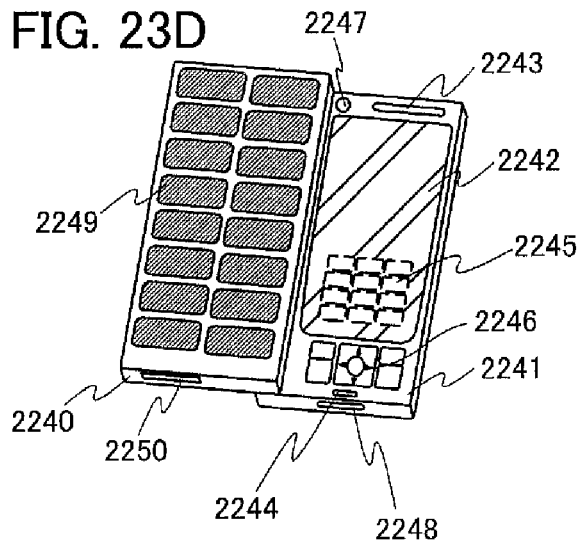
Figure 23B:
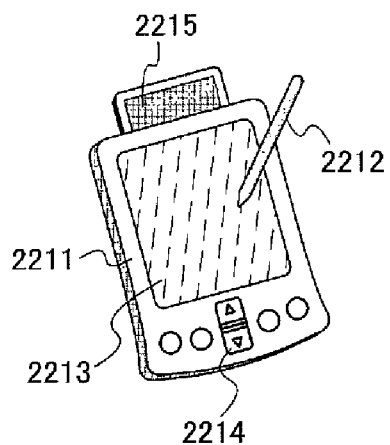

FIG. 23B illustrates a portable information terminal device (PDA) including any of the above logic circuit, which includes a main body 2211 provided with a display portion 2213, an external interface 2215, an operation button 2214, and the like. A stylus 2212 for operation is included as an accessory.

Figure 23E:
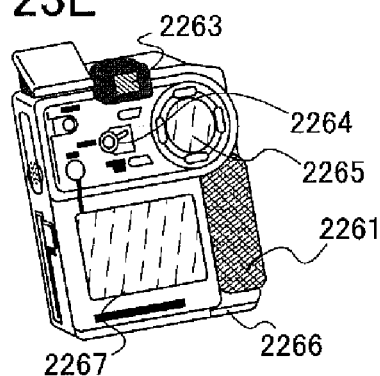
Figure 23C:
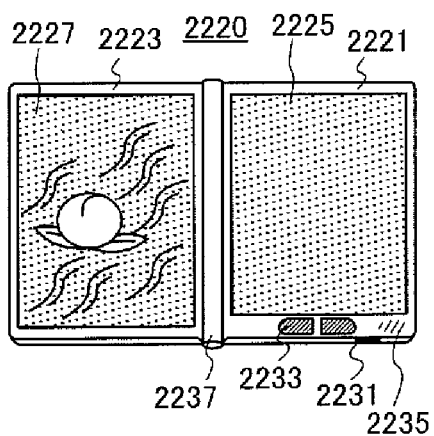

FIG. 23C illustrates an e-book reader 2220 as an example of an electronic paper including any of the above logic circuit. The e-book reader 2220 includes two housings, a housing 2221 and a housing 2223. The housings 2221 and 2223 are bound with each other by an axis portion 2237, along which the e-book reader 2220 can be opened and closed. With such a structure, the e-book reader 2220 can be used as paper books.

A display portion 2225 is incorporated in the housing 2221, and a display portion 2227 is incorporated in the housing 2223. The display portion 2225 and the display portion 2227 may display one image or different images. In the structure where the display portions display different images from each other, for example, the right display portion (the display portion 2225 in FIG. 23C) can display text and the left display portion (the display portion 2227 in FIG. 23C) can display images.

Further, in FIG. 23C, the housing 2221 is provided with an operation portion and the like. For example, the housing 2221 is provided with a power supply 2231, an operation key 2233, a speaker 2235, and the like. With the operation key 2223, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an electronic book server.

Note that electronic paper can be used for electronic appliances in all fields as long as they display data. For example, electronic paper can be used for, instead of electronic book (an e-book reader), posters, advertisement in vehicles such as trains, display in a variety of cards such as credit cards, and so on.

FIG. 23D illustrates a mobile phone including any of the above logic circuit, which includes two housings: a housing 2240 and a housing 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 charging of the mobile phone, an external memory slot 2250, and the like. An antenna is incorporated in the housing 2241.

The display panel 2242 has a touch panel function. A plurality of operation keys 2245 which is displayed as images is illustrated by dashed lines in FIG. 23D. Note that the mobile phone includes a booster circuit for increasing a voltage output from the solar cell 2249 to a voltage needed for each circuit. Further, in addition to the above structure, a contactless IC chip, a small memory device, or the like may be incorporated.

The display orientation of the display panel 2242 changes as appropriate in accordance with the application mode. Further, the camera lens 2247 is provided on the same surface as the display panel 2242, and thus it can be used as a video phone. The speaker 2243 and the microphone 2224 can be used for videophone calls, recording, and playing sound, etc. as well as voice calls. Moreover, the housings 2240 and 2241 in a state where they are developed as illustrated in FIG. 23D can be slid so that one is lapped over the other; therefore, the size of the portable information terminal can be reduced, which makes the portable information terminal suitable for being carried.

The external connection terminal 2248 can be connected to an AC adapter or a variety of cables such as a USB cable, which enables charging of the mobile phone and data communication between the mobile phone or the like. Moreover, a larger amount of data can be saved and moved by inserting a recording medium to the external memory slot 2250. Further, in addition to the above functions, an infrared communication function, a television reception function, or the like may be provided.

FIG. 23E illustrates a digital camera including any of the above logic circuit, which includes a main body 2261, a display portion (A) 2267, an eyepiece 2263, an operation switch 2264, a display portion (B) 2265, a battery 2266, and the like.

Figure 23F:
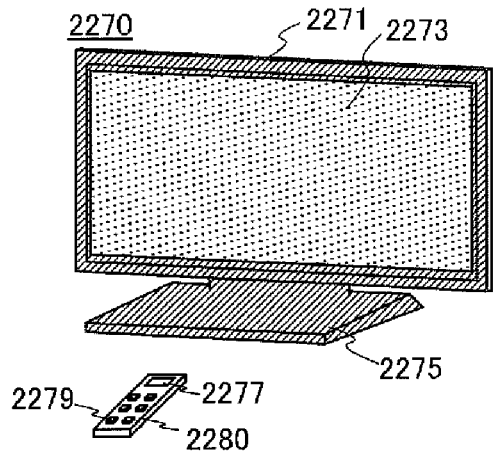

FIG. 23F illustrates a television set 2270 including any of the above logic circuit, which includes a display portion 2273 incorporated in a housing 2271. The display portion 2273 can display images. Here, the housing 2271 is supported by a stand 2275.

The television set 2270 can be operated by an operation switch of the housing 2271 or a separate remote controller 2280. Channels and volume can be controlled with an operation key 2279 of the remote controller 2280 so that an image displayed on the display portion 2273 can be controlled. Moreover, the remote controller 2280 may have a display portion 2227 in which the information outgoing from the remote controller 2280 is displayed.

Note that the television set 2270 is preferably provided with a receiver, a modem, and the like. With the receiver, a general television broadcast can be received. Furthermore, when the television set 2270 is connected to a communication network by wired or wireless connection via the modem, one-way (from a transmitter to a receiver) or two-way (between a transmitter and a receiver, between receivers, or the like) data communication can be performed.

Example 1

In this example, measured values of off current using a test element group (also referred to as a TEG) will be described below.

Figure 24:
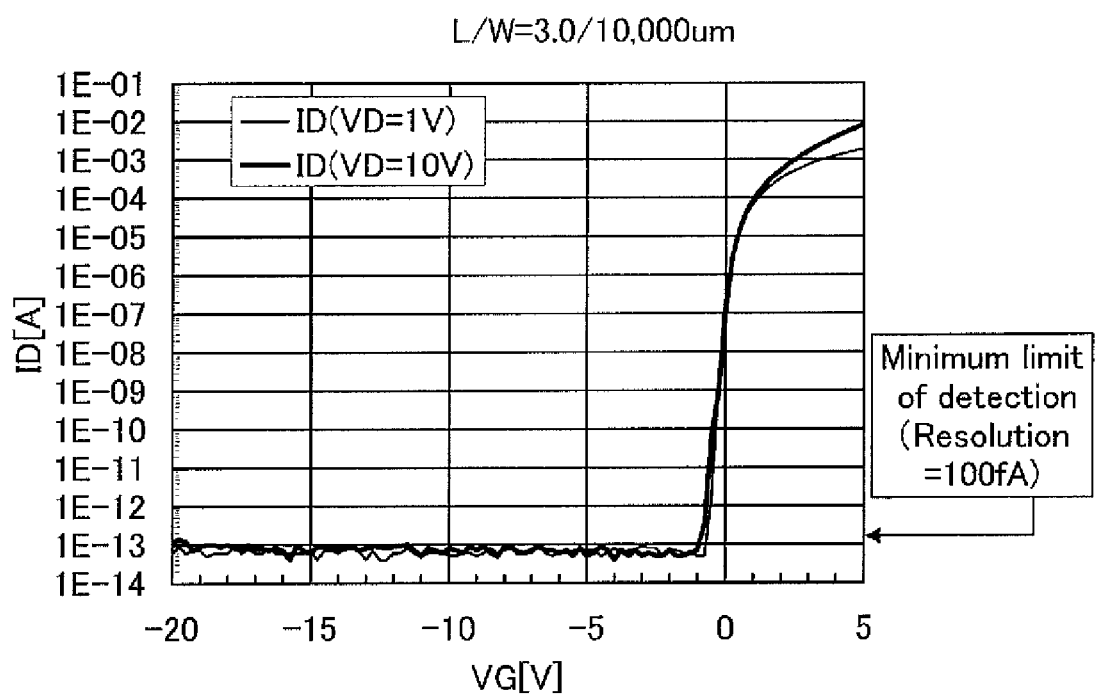
FIG. 24 is a graph showing an initial characteristic of a thin film transistor described in Example 1.
Figure 25A:
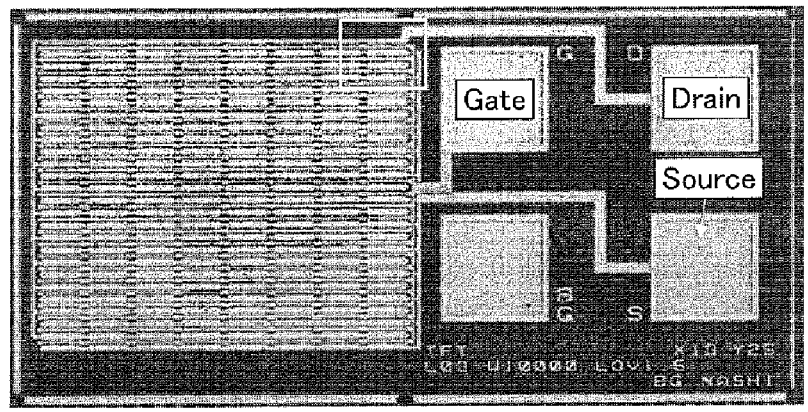
FIGS. 25A and 25B are top views of a test element for an example of a thin film transistor described in Example 1.
Figure 25B:
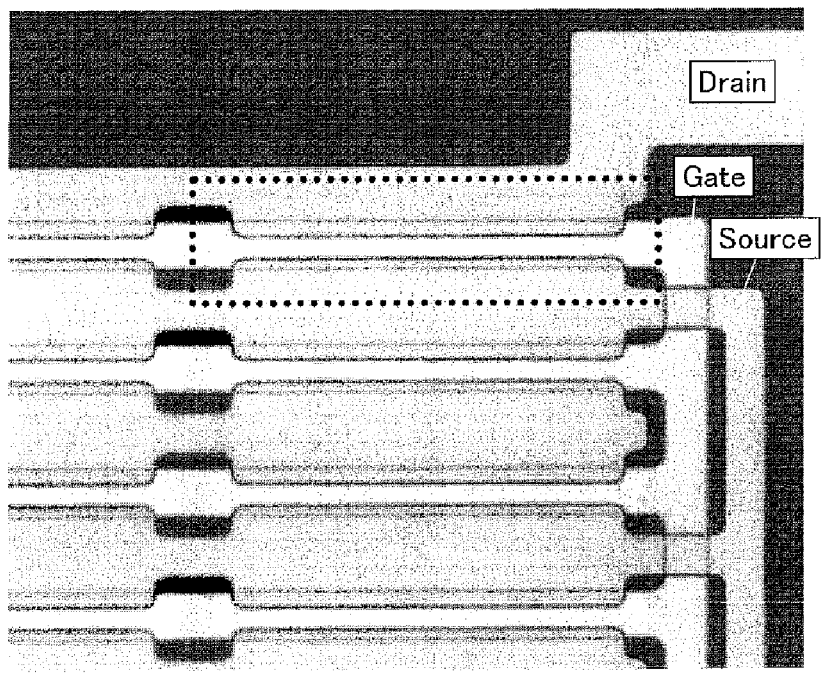

FIG. 24 shows initial characteristics of a thin film transistor virtually with L/W=3 µm/10000 µm in which 200 thin film transistors each with L/W=3 µm/50 µm are connected in parallel. A top view is shown in FIG. 25A and a partially enlarged top view thereof is show in FIG. 25B. The region enclosed by a dotted line in FIG. 25B is a thin film transistor of one stage with L/W=3 µm/50 µm and Lov=1.5 µm. In order to measure initial characteristics of the thin film transistors, the changing characteristics of the current between source and drain (hereinafter referred to as a drain current or Id) were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. In other words, Vg-Id characteristics were measured. Note that FIG. 24 shows Vg in the range of from −20 V to +5 V.

As shown in FIG. 24, the thin film transistor having a channel width W of 10000 µm and Vd of 1 V or 10 V has an off current of $1\times10^{-13}$ [A] or lower, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride layer was formed as a base film over a glass substrate by a CVD method, and a silicon oxynitride layer was formed over the silicon nitride layer. A tungsten layer was formed as a gate electrode layer over the silicon oxynitride layer by a sputtering method. Here, the gate electrode layer was formed by selectively etching the tungsten layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based oxide semiconductor target (at a molar ratio of $In_2O_3:Ga_2O_3:ZnO=1:1:2$). Here, an island-shaped oxide semiconductor layer was formed by selectively etching the oxide semiconductor layer.

Then, first heat treatment was performed on the oxide semiconductor layer in a nitrogen atmosphere in a clean oven at 450° C. for one hour.

Next, a titanium layer (having a thickness of 150 nm) was formed as a source electrode layer and a drain electrode layer over the oxide semiconductor layer by a sputtering method. Here, the source electrode layer and the drain electrode layer were formed by selective etching, so that L/W=3 µm/10000 µm of the thin film transistor was virtually achieved by connecting 200 thin film transistors, in parallel, each of which has a channel length L of 3 μm and a channel width W of 50 μm.

Next, a silicon oxide layer having a thickness of 300 nm was formed as a protective insulating layer by a sputtering method so as to be in contact with the oxide semiconductor layer. The silicon oxide layer serving as a protective layer was etched selectively, whereby openings were formed over the gate electrode layer and the source and drain electrode layers. After that, second heat treatment was performed at 250° C. for one hour in a nitrogen atmosphere.

Then, heat treatment was performed at 150° C. for 10 hours before the measurement of Vg-Id characteristics.

Through the above process, a bottom-gate thin film transistor was manufactured.

The reason why the thin film transistor has an off current of approximately $1\times10^{-13}$ [A] as shown in FIG. 24 is that the concentration of hydrogen in the oxide semiconductor layer could be sufficiently reduced in the above manufacturing process. The hydrogen concentration of the oxide semiconductor was $5\times10^{19}$ (atoms/cm$^3$) or lower, preferably $5\times10^{18}$ (atoms/cm$^3$) or lower, further preferably $5\times10^{17}$ (atoms/cm$^3$) or lower. Note that the hydrogen concentration in the oxide semiconductor layer was measured by secondary ion mass spectrometry (SIMS).

Although the example of using an In—Ga—Zn—O-based oxide semiconductor is described, the oxide semiconductor is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. Furthermore, as an oxide semiconductor material, an In—Al—Zn—O-based oxide semiconductor mixed with AlO$_x$ of 2.5 wt % to 10 wt % or an In—Zn—O-based oxide semiconductor mixed with SiO$_x$ of 2.5 wt % to 10 wt % can be used.

The carrier density of the oxide semiconductor layer which is measured by a carrier measurement device is $5\times10^{14}$/cm$^3$ or tower, preferably $5\times10^{12}$/cm$^3$ or lower, much preferably lower than or equivalent to $1.45\times10^{10}$/cm$^3$ which is the intrinsic carrier density of silicon. In other words, the carrier density of the oxide semiconductor layer can be made as close to zero as possible.

The thin film transistor can also have a channel length L of 10 nm to 1000 nm, which enables an increase in circuit operation speed, and the off current is extremely small, which enables a further reduction in power consumption.

In addition, in circuit design, the oxide semiconductor layer can be regarded as an insulator when the thin film transistor is in an off state.

After that, the temperature characteristics of off current of the thin film transistor manufactured in this example were evaluated. Temperature characteristics are important in considering the environmental resistance, maintenance of performance, or the like of an end product in which the thin film transistor is used. It is to be understood that a smaller amount of change is much preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 26A:
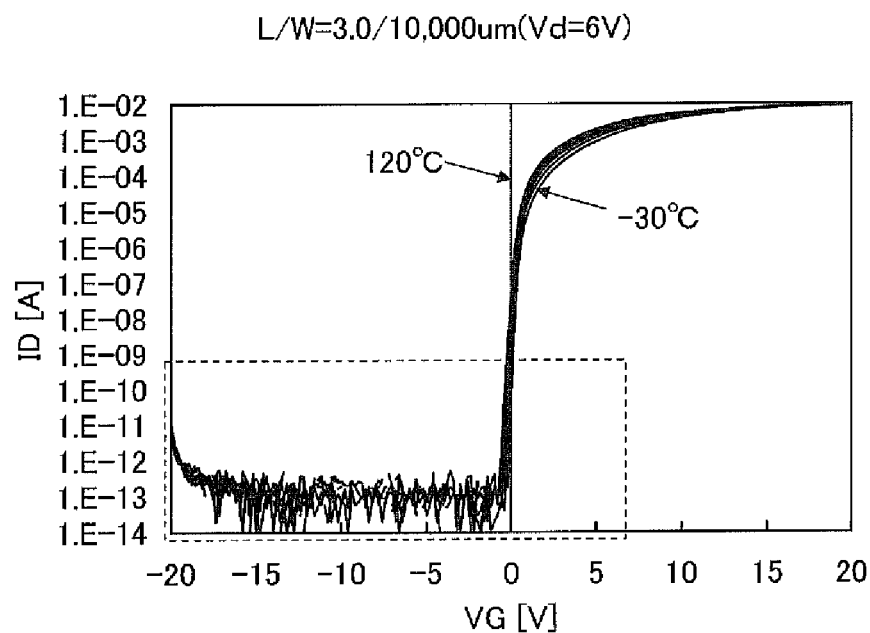
FIGS. 26A and 26B are graphs showing Vg-Id characteristics of a test element for an example of a thin film transistor described in Example 1.
Figure 26B:
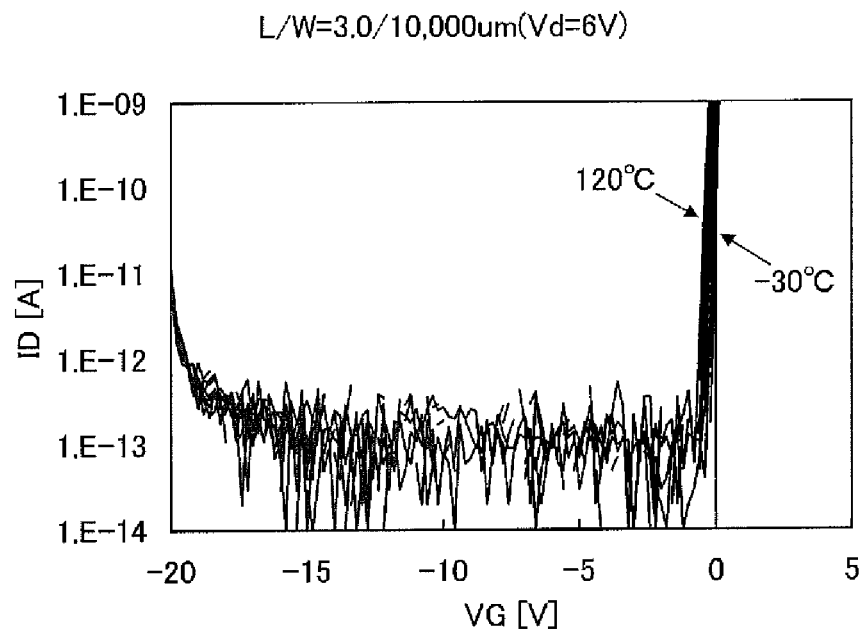

FIG. 26A shows Vg-Id characteristics measured at the above temperatures and superimposed on one another, and FIG. 26B shows an enlarged view of a range of off current enclosed by a dotted line in FIG. 26A. The rightmost curve indicated by an arrow in the graph is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 26B, the off currents except in the vicinity of a gate voltage of 20 V are lower than or equal to $1\times10^{-12}$ [A], which is near the resolution of the measurement device, at all temperatures, and the temperature dependence thereof is not observed. In other words, even at a high temperature of 120° C., the off current is kept lower than or equal to $1\times10^{-12}$ [A], and given that the channel width W is 10000 um, it can be seen that the off current is significantly small.

A thin film transistor including a highly-purified oxide semiconductor shows almost no dependence of off current on temperature. This also results from the fact that the oxide semiconductor has an energy gap of 3 eV or more and includes very few intrinsic carriers. In addition, the source region and the drain region are in a degenerated state, which is also a factor for showing no temperature dependence. Operation of the thin film transistor is mainly caused by carriers which are injected from the degenerated source region to the oxide semiconductor, and the above characteristics (independence of off current on temperature) can be explained by independence of carrier density on temperature.

When a logic circuit is formed with a thin film transistor having such an extremely small off current, reduction in standby power or suppression of malfunction of the logic circuit can be achieved.

This application is based on Japanese Patent Application serial no. 2009-250415 filed with Japan Patent Office on Oct. 30, 2009, the entire contents of which are hereby incorporated by reference.

The invention claimed is:

1. A logic circuit including a first period during which a clock signal is input and a second period during which the clock signal is not input, comprising:
    a transistor which is in an off state where a potential difference exists between a source terminal and a drain terminal over the second period,
    wherein a channel formation region of the transistor is formed using an oxide semiconductor in which a hydrogen concentration is $5\times10^{19}$ (atoms/cm$^3$) or lower, and
    wherein the oxide semiconductor comprises a crystal, a c-axis of which is in a direction perpendicular to a surface of the oxide semiconductor.

2. A semiconductor device comprising the logic circuit according to claim 1, and an external circuit which is configured to operate the logic circuit.

3. The logic circuit according to claim 1, wherein the crystal exists in an amorphous oxide semiconductor.

4. The logic circuit according to claim 1, wherein a grain diameter of the crystal is greater than or equal to 1 nm and less than or equal to 20 nm.

5. A logic circuit including a first period during which an enable signal is at a high level and a second period during which the enable signal is at a low level, comprising:
    an AND gate, wherein a first input terminal of the AND gate is electrically connected to an enable signal line, and a second input terminal of the AND gate is electrically connected to a clock signal line; and
a flip-flop, wherein a first input terminal of the flip-flop is electrically connected to a data signal line, and a second input terminal of the flip-flop is electrically connected to an output terminal of the AND gate,
wherein the flip-flop includes a transistor which is in an off state where a potential difference exists between a source terminal and a drain terminal over the second period,
wherein a channel formation region of the transistor is formed using an oxide semiconductor in which a hydrogen concentration is $5\times10^{19}$ (atoms/cm$^3$) or lower, and
wherein the oxide semiconductor comprises a crystal, a c-axis of which is in a direction perpendicular to a surface of the oxide semiconductor.

6. The logic circuit according to claim 5,
wherein the AND gate comprises:
a first p-channel transistor, wherein: a gate terminal of the first p-channel transistor is electrically connected to the enable signal line; and a first terminal of the first p-channel transistor is electrically connected to a high power supply potential line;
a first n-channel transistor, wherein: a gate terminal of the first n-channel transistor is electrically connected to the enable signal line and the gate terminal of the first p-channel transistor; and a first terminal of the first n-channel transistor is electrically connected to a second terminal of the first p-channel transistor;
a second n-channel transistor, wherein: a gate terminal of the second n-channel transistor is electrically connected to the clock signal line; a first terminal of the second n-channel transistor is electrically connected to a second terminal of the first n-channel transistor; and a second terminal of the second n-channel transistor is electrically connected to a low power supply potential line;
a second p-channel transistor, wherein: a gate terminal of the second p-channel transistor is electrically connected to the clock signal line and the gate terminal of the second n-channel transistor; a first terminal of the second p-channel transistor is electrically connected to the high power supply potential line; and a second terminal of the second p-channel transistor is electrically connected to the second terminal of the first p-channel transistor and the first terminal of the first n-channel transistor;
a third p-channel transistor, wherein: a gate terminal of the third p-channel transistor is electrically connected to the second terminal of the first p-channel transistor, the first terminal of the first n-channel transistor, and the second terminal of the second p-channel transistor; a first terminal of the third p-channel transistor is electrically connected to the high power supply potential line; and a second terminal of the third p-channel transistor is electrically connected to the second input terminal of the flip-flop; and
a third n-channel transistor, wherein: a gate terminal of the third n-channel transistor is electrically connected to the second terminal of the first p-channel transistor, the first terminal of the first n-channel transistor, the second terminal of the second p-channel transistor, and the gate terminal of the third p-channel transistor; a first terminal of the third n-channel transistor is electrically connected to the second input terminal of the flip-flop and the second terminal of the third p-channel transistor; and a second terminal of the third n-channel transistor is electrically connected to the low power supply potential line.

7. The logic circuit according to claim 5,
wherein the AND gate comprises:
a first n-channel transistor, wherein a gate terminal and a first terminal of the first n-channel transistor are electrically connected to a high power supply potential line;
a second n-channel transistor, wherein a gate terminal of the second n-channel transistor is electrically connected to the enable signal line, and a first terminal of the second n-channel transistor is electrically connected to a second terminal of the first re-channel transistor;
a third n-channel transistor, wherein: a gate terminal of the third n-channel transistor is electrically connected to the clock signal line; a first terminal of the third n-channel transistor is electrically connected to a second terminal of the second re-channel transistor; and a second terminal of the third n-channel transistor is electrically connected to a low power supply potential line;
a fourth n-channel transistor, wherein: a gate terminal and a first terminal of the fourth n-channel transistor are electrically connected to the high power supply potential line; and a second terminal of the fourth n-channel transistor is electrically connected to the second input terminal of the flip-flop; and
a fifth n-channel transistor, wherein: a gate terminal of the fifth n-channel transistor is electrically connected to the second terminal of the first n-channel transistor and the first terminal of the second n-channel transistor; a first terminal of the fifth n-channel transistor is electrically connected to the second input terminal of the flip-flop and the second terminal of the fourth n-channel transistor; and a second terminal of the fifth n-channel transistor is electrically connected to the low power supply potential line.

8. The logic circuit according to claim 5, wherein the flip-flop is a delay-type flip-flop.

9. A semiconductor device comprising the logic circuit according to claim 5, and an external circuit which is configured to operate the logic circuit.

10. The logic circuit according to claim 5, wherein the crystal exists in an amorphous oxide semiconductor.

11. The logic circuit according to claim 5, wherein a grain diameter of the crystal is greater than or equal to 1 nm and less than or equal to 20 nm.

12. A logic circuit including a first period during which an enable signal is at a low level and a second period during which the enable signal is at a high level, comprising:
a NOR gate, wherein a first input terminal of the NOR gate is electrically connected to an enable signal line, and a second input terminal of the NOR gate is electrically connected to an inverted clock signal line; and
a flip-flop, wherein a first input terminal of the flip-flop is electrically connected to a data signal line, and a second input terminal of the flip-flop is electrically connected to an output terminal of the NOR gate,
wherein the flip-flop includes a transistor which is in an off state where a potential difference exists between a source terminal and a drain terminal over the second period,
wherein a channel formation region of the transistor is formed using an oxide semiconductor in which a hydrogen concentration is $5\times10^{19}$ (atoms/cm$^3$) or lower, and wherein the oxide semiconductor comprises a crystal, a c-axis of which is in a direction perpendicular to a surface of the oxide semiconductor.

13. The logic circuit according to claim 12, wherein the NOR gate comprises:
a first p-channel transistor, wherein a gate terminal of the first p-channel transistor is electrically connected to the enable signal line, and a first terminal of the first p-channel transistor is electrically connected to a high power supply potential line;
a second p-channel transistor, wherein: a gate terminal of the second p-channel transistor is electrically connected to the inverted clock signal line; a first terminal of the second p-channel transistor is electrically connected to a second terminal of the first p-channel transistor; and a second terminal of the second p-channel transistor is electrically connected to the second input terminal of the flip-flop;
a first n-channel transistor, wherein: a gate terminal of the first n-channel transistor is electrically connected to the inverted clock signal line; a first terminal of the first n-channel transistor is electrically connected to the second input terminal of the flip-flop and the second terminal of the second p-channel transistor; and a second terminal of the first n-channel transistor is electrically connected to a low power supply potential line; and
a second n-channel transistor, wherein: a gate terminal of the second n-channel transistor is electrically connected to the enable signal line and the gate terminal of the first p-channel transistor; a first terminal of the second n-channel transistor is electrically connected to the second input terminal of the flip-flop, the second terminal of the second p-channel transistor, and the first terminal of the first n-channel transistor; and a second terminal of the second n-channel transistor is electrically connected to the low power supply potential line.

14. The logic circuit according to claim 12, wherein the NOR gate comprises:
a first n-channel transistor, wherein a gate terminal and a first terminal of the first n-channel transistor are electrically connected to a high power supply potential line, and a second terminal of the first n-channel transistor is electrically connected to the second input terminal of the flip-flop;
a second n-channel transistor, wherein: a gate terminal of the second n-channel transistor is electrically connected to the inverted clock signal line; a first terminal of the second n-channel transistor is electrically connected to the second input terminal of the flip-flop and the second terminal of the first n-channel transistor; and a second terminal of the second n-channel transistor is electrically connected to a low power supply potential line; and
a third n-channel transistor, wherein: a gate terminal of the third n-channel transistor is electrically connected to the enable signal line; a first terminal of the third n-channel transistor is electrically connected to the second input terminal of the flip-flop, the second terminal of the first n-channel transistor, and the first terminal of the second n-channel transistor; and a second terminal of the third n-channel transistor is electrically connected to the low power supply potential line.

15. The logic circuit according to claim 12, wherein the flip-flop is a delay-type flip-flop.

16. A semiconductor device comprising the logic circuit according to claim 12, and an external circuit which is configured to operate the logic circuit.

17. The logic circuit according to claim 12, wherein the crystal exists in an amorphous oxide semiconductor.

18. The logic circuit according to claim 12, wherein a grain diameter of the crystal is greater than or equal to 1 nm and less than or equal to 20 nm.

19. A logic circuit including a first period during which an enable signal is at a high level and a second period during which the enable signal is at a low level, comprising:
a latch, wherein a first input terminal of the latch is electrically connected to an enable signal line, and a second input terminal of the latch is electrically connected to an inverted clock signal line; and
a flip-flop, wherein a first input terminal of the flip-flop is electrically connected to a data signal line, and a second input terminal of the flip-flop is electrically connected to an output terminal of the latch,
wherein the flip-flop includes a transistor which is in an off state where a potential difference exists between a source terminal and a drain terminal,
wherein a channel formation region of the transistor is formed using an oxide semiconductor in which a hydrogen concentration is $5 \times 10^{19}$ (atoms/cm$^3$) or lower, and
wherein the oxide semiconductor comprises a crystal, a c-axis of which is in a direction perpendicular to a surface of the oxide semiconductor.

20. The logic circuit according to claim 19, wherein the latch comprises:
a transistor for latch, wherein a gate terminal of the transistor is electrically connected to the enable signal line, and a first terminal of the transistor is electrically connected to the inverted clock signal line;
a first inverter, wherein an input terminal of the first inverter is electrically connected to a second terminal of the transistor for latch, and an output terminal of the first inverter is electrically connected to the second input terminal of the flip-flop; and
a second inverter, wherein an input terminal of the second inverter is electrically connected to the second input terminal of the flip-flop and the output terminal of the first inverter, and an output terminal of the second inverter is electrically connected to the second terminal of the transistor for latch and the input terminal of the first inverter.

21. The logic circuit according to claim 20, wherein the first inverter comprises:
a first p-channel transistor, wherein: a gate terminal of the first p-channel transistor is electrically connected to the second terminal of the transistor for latch: a first terminal of the first p-channel transistor is electrically connected to a high power supply potential line; and a second terminal of the first p-channel transistor is electrically connected to the second input terminal of the flip-flop; and
a first n-channel transistor, wherein: a gate terminal of the first n-channel transistor is electrically connected to the second terminal of the transistor for latch and the gate terminal of the first p-channel transistor; a first terminal of the first n-channel transistor is electrically connected to the second input terminal of the flip-flop and the second terminal of the first p-channel transistor; and a second terminal of the first re-channel transistor is electrically connected to a low power supply potential line, and
wherein the second inverter comprising:

a second p-channel transistor, wherein: a gate terminal of the second p-channel transistor is electrically connected to the second input terminal of the flip-flop, the second terminal of the first p-channel transistor, and the first terminal of the first re-channel transistor; a first terminal of the second p-channel transistor is electrically connected to the high power supply potential line; and a second terminal of the second p-channel transistor is electrically connected to the second terminal of the transistor for latch, the gate terminal of the first p-channel transistor, and the gate terminal of the first n-channel transistor; and a second n-channel transistor, wherein: a gate terminal of the second n-channel transistor is electrically connected to the second input terminal of the flip-flop, the second terminal of the first p-channel transistor, the first terminal of the first n-channel transistor, and the gate terminal of the second p-channel transistor; a first terminal of the second n-channel transistor is electrically connected to the second terminal of the transistor for latch, the gate terminal of the first p-channel transistor, the gate terminal of the first n-channel transistor, and the second terminal of the second p-channel transistor; and a second terminal of the second n-channel transistor is electrically connected to the low power supply potential line.

22. The logic circuit according to claim 20, wherein the first inverter comprises:

a first n-channel transistor, wherein: a gate terminal and a first terminal of the first n-channel transistor are electrically connected to a high power supply potential line; and a second terminal of the first n-channel transistor is electrically connected to the second input terminal of the flip-flop; and a second n-channel transistor, wherein: a gate terminal of the second n-channel transistor is electrically connected to the second terminal of the transistor for latch; a first terminal of the second n-channel transistor is electrically connected to the second input terminal of the flip-flop and the second terminal of the first n-channel transistor; and a second terminal of the second n-channel transistor is electrically connected to a low power supply potential line, and wherein the second inverter comprising:

a third n-channel transistor, wherein: a gate terminal and a first terminal of the third n-channel transistor are electrically connected to the high power supply potential line; and a second terminal of the third n-channel transistor is electrically connected to the second terminal of the transistor for latch, and the gate terminal of the second re-channel transistor; and a fourth n-channel transistor, wherein: a gate terminal of the fourth n-channel transistor is electrically connected to the second input terminal of the flip-flop, the second terminal of the first n-channel transistor, and the first terminal of the second re-channel transistor; a first terminal of the fourth n-channel transistor is electrically connected to the second terminal of the transistor for latch, the gate terminal of the second n-channel transistor, and the second terminal of the third n-channel transistor; and a second terminal of the fourth n-channel transistor is electrically connected to the low power supply potential line.

23. The logic circuit according to claim 19, wherein the flip-flop is a delay-type flip-flop.

24. A semiconductor device comprising the logic circuit according to claim 19, and an external circuit which is configured to operate the logic circuit.

25. The logic circuit according to claim 19, wherein the crystal exists in an amorphous oxide semiconductor.

26. The logic circuit according to claim 19, wherein a grain diameter of the crystal is greater than or equal to 1 nm and less than or equal to 20 nm.

* * * * *

UNITED STATES PATENT AND TRADEMARK OFFICE
CERTIFICATE OF CORRECTION

PATENT NO. : 8,207,756 B2
APPLICATION NO. : 12/912397
DATED : June 26, 2012
INVENTOR(S) : Yutaka Shionoiri and Hidetomo Kobayashi It is certified that error appears in the above-identified patent and that said Letters Patent is hereby corrected as shown below:

Column 18, line 36, replace "1206" with --120b--;

Column 20, line 63, replace "S01" with --SOI--;

Column 20, line 66, replace "SOT" with --SOI--;

Column 21, line 4, replace "SOT" with --SOI--;

Column 22, line 20, replace "1146" with --114b--;

Column 32, line 23, replace "1506" with --150b--;

Column 35, line 49, replace "1020E" with --20E--;

Column 35, line 61, replace "4656" with --456b--;

Column 38, line 62, replace "4656" with --465b--;

Column 45, line 50, replace "3956" with --395b--;

Column 58, line 14, in claim 7 replace "re-channel" with --n-channel--;

Column 58, line 20, in claim 7 replace "re-channel" with --n-channel--;

Column 60, line 64, in claim 21 replace "re-channel" with --n-channel--;

Column 61, line 5, in claim 21 replace "re-channel" with --n-channel--;

Column 62, line 14, in claim 22 replace "re-channel" with --n-channel--;

Column 62, line 19, in claim 22 replace "re-channel" with --n-channel--.

Signed and Sealed this
Sixteenth Day of October, 2012

David J. Kappos
*Director of the United States Patent and Trademark Office*